US012777951B2

(12) United States Patent
Tsai et al.

(10) Patent No.: US 12,777,951 B2
(45) Date of Patent: Oct. 27, 2026

(54) PACKAGE STRUCTURE WITH CONNECTING STRUCTURE AND MANUFACTURING METHOD THEREOF

(71) Applicant: Taiwan Semiconductor Manufacturing Company, Ltd., Hsinchu (TW)

(72) Inventors: Chen-Hsuan Tsai, Taitung City (TW); Yu-Lin Chiang, Hsinchu (TW); Chin-Chuan Chang, Hsinchu County (TW); Ying-Ching Shih, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 784 days.

(21) Appl. No.: 18/173,027

(22) Filed: Feb. 22, 2023

(65) Prior Publication Data

US 2024/0282713 A1 Aug. 22, 2024

(51) Int. Cl.
*H10W 70/65* (2026.01)
*H10W 70/60* (2026.01)
(Continued)

(52) U.S. Cl.
CPC .......... *H10W 70/65* (2026.01); *H10W 70/611* (2026.01); *H10W 70/685* (2026.01);
(Continued)

(58) Field of Classification Search
CPC ............. H01L 23/5386; H01L 23/3128; H01L 23/3135; H01L 23/49816; H01L 23/49822; H01L 23/49833; H01L 23/49838; H01L 23/49894; H01L 23/5381; H01L 23/5385; H01L 23/3107; H01L 21/563; H01L 21/565; H01L 21/76898; H01L 25/105; H01L 24/08; H01L 24/16; H01L 24/32;
(Continued)

(56) References Cited

U.S. PATENT DOCUMENTS 8,503,186 B2 * 8/2013 Lin .................... H01L 25/0657 361/764
8,993,380 B2 3/2015 Hou et al.
(Continued)

*Primary Examiner* — Alonzo Chambliss
(74) *Attorney, Agent, or Firm* — JCIPRNET

(57) ABSTRACT

A package structure includes a first redistribution circuit structure, a first semiconductor die, and a second semiconductor die. The first redistribution circuit structure has a first side and a second side opposite to the first side. The first semiconductor die is disposed over the firs side of the first redistribution circuit structure. The second semiconductor die is disposed over the second side of the first redistribution circuit structure and is electrically connected thereto, where the second semiconductor die includes a substrate, an interconnect structure disposed on the substrate, a plurality of conductive terminals disposed on and electrically connected to the interconnect structure, and a dielectric layer disposed on the interconnect structure and laterally covering the plurality of conductive terminals. A material of the dielectric layer included in the second semiconductor die is different from a material of a dielectric layer included in the first redistribution circuit structure.

20 Claims, 33 Drawing Sheets

(51) Int. Cl.

| | |
|---|---|
| ***H10W 70/685*** | (2026.01) |
| ***H10W 70/69*** | (2026.01) |
| ***H10W 74/01*** | (2026.01) |
| ***H10W 74/10*** | (2026.01) |
| ***H10W 74/15*** | (2026.01) |
| ***H10W 90/00*** | (2026.01) |
| *H10W 72/00* | (2026.01) |
| *H10W 72/30* | (2026.01) |
| *H10W 72/90* | (2026.01) |
| *H10W 74/00* | (2026.01) |
| *H10W 74/40* | (2026.01) |
| *H10W 80/00* | (2026.01) |

(52) U.S. Cl.

CPC ......... *H10W 70/69* (2026.01); *H10W 74/012* (2026.01); *H10W 74/016* (2026.01); *H10W 74/117* (2026.01); *H10W 74/121* (2026.01); *H10W 74/15* (2026.01); *H10W 90/00* (2026.01); *H10W 90/401* (2026.01); *H10W 90/701* (2026.01); *H10W 70/60* (2026.01); *H10W 72/07232* (2026.01); *H10W 72/07332* (2026.01); *H10W 72/07352* (2026.01); *H10W 72/07353* (2026.01); *H10W 72/321* (2026.01); *H10W 72/334* (2026.01); *H10W 72/934* (2026.01); *H10W 72/953* (2026.01); *H10W 74/00* (2026.01); *H10W 74/10* (2026.01); *H10W 74/40* (2026.01); *H10W 80/312* (2026.01); *H10W 80/327* (2026.01); *H10W 80/334* (2026.01); *H10W 80/721* (2026.01); *H10W 80/732* (2026.01); *H10W 90/724* (2026.01); *H10W 90/734* (2026.01); *H10W 90/794* (2026.01)

(58) Field of Classification Search

CPC ......... H01L 24/73; H01L 24/81; H01L 24/83; H01L 24/20; H01L 23/5384; H01L 23/5389; H10W 70/65; H10W 70/685; H10W 70/69; H10W 70/611; H10W 90/701; H10W 90/00; H10W 90/401; H10W 74/15; H10W 74/121; H10W 74/012; H10W 74/016; H10W 74/117; H10W 74/00; H10W 74/019; H10W 72/321; H10W 72/241; H10W 72/851; H10W 72/90; H10P 72/743; H10P 72/20; H10P 90/297; H10P 90/794

See application file for complete search history.

(56) References Cited

U.S. PATENT DOCUMENTS

| | | | | |
|---|---|---|---|---|
| 9,000,584 | B2 | 4/2015 | Lin et al. | |
| 9,048,222 | B2 | 6/2015 | Hung et al. | |
| 9,048,233 | B2 | 6/2015 | Wu et al. | |
| 9,064,879 | B2 | 6/2015 | Hung et al. | |
| 9,111,949 | B2 | 8/2015 | Yu et al. | |
| 9,263,511 | B2 | 2/2016 | Yu et al. | |
| 9,281,254 | B2 | 3/2016 | Yu et al. | |
| 9,299,649 | B2 | 3/2016 | Chiu et al. | |
| 9,368,460 | B2 | 6/2016 | Yu et al. | |
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,461,018 | B1 | 10/2016 | Tsai et al. | |
| 9,496,189 | B2 | 11/2016 | Yu et al. | |
| 9,666,502 | B2 | 5/2017 | Chen et al. | |
| 9,735,131 | B2 | 8/2017 | Su et al. | |
| 10,541,226 | B2 * | 1/2020 | Yu | H01L 21/563 |
| 11,139,249 | B2 * | 10/2021 | Yu | H01L 23/5389 |
| 11,183,487 | B2 * | 11/2021 | Lai | H01L 23/3121 |
| 12,347,785 | B2 * | 7/2025 | Yu | H01L 21/4857 |
| 2014/0225222 | A1 * | 8/2014 | Yu | H01L 24/96<br>257/532 |
| 2018/0082964 | A1 * | 3/2018 | Wu | H01L 21/486 |

* cited by examiner

PACKAGE STRUCTURE WITH CONNECTING STRUCTURE AND MANUFACTURING METHOD THEREOF

BACKGROUND

Developments in shrinking sizes of semiconductor devices and electronic components make the integration of more devices and components into a given volume possible and lead to high integration density of various semiconductor devices and/or electronic components.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
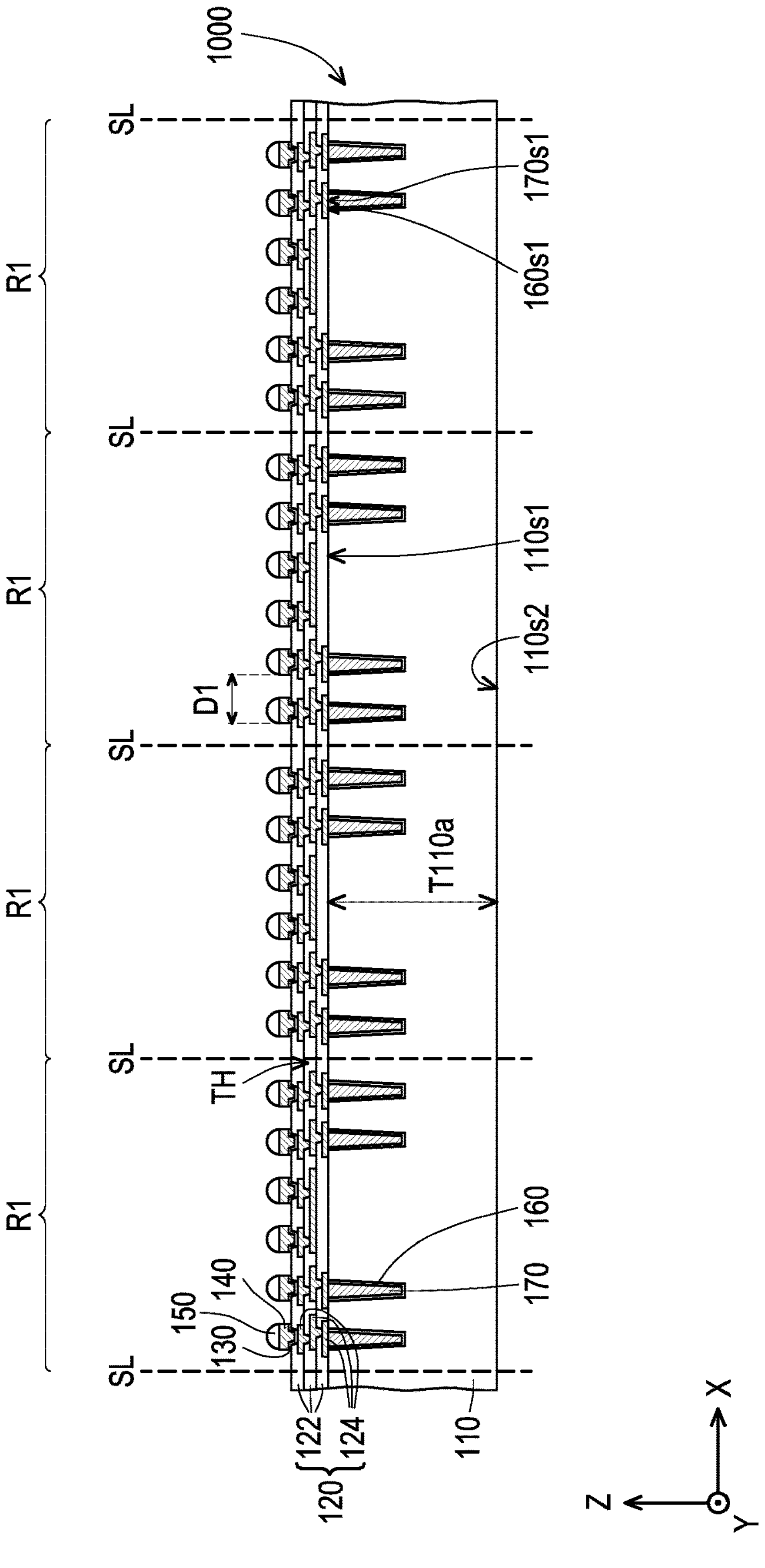
FIG. 1 to FIG. 10 are schematic views of various stages in a manufacturing method of a package structure in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third", "fourth", and the like, may be used herein for ease of description to describe similar or different element(s) or feature(s) as illustrated in the figures, and may be used interchangeably depending on the order of the presence or the contexts of the description.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

It should be appreciated that the following embodiment(s) of the disclosure provides applicable concepts that can be embodied in a wide variety of specific contexts. The embodiments are intended to provide further explanations but are not used to limit the scope of the disclosure. In the disclosure, the illustration of components throughout all figures is schematic and is not in scale. Throughout the various views and illustrative embodiments of the disclosure, the elements similar to or substantially the same as the elements described previously will use the same reference numbers, and certain details or descriptions (e.g., the materials, formation processes, positioning configurations, electrical connections, etc.) of the same elements would not be repeated. For clarity of illustrations, the drawings are illustrated with orthogonal axes (X, Y and Z) of a Cartesian coordinate system according to which the views are oriented; however, the disclosure is not specifically limited thereto. In embodiments, the manufacturing method is part of a wafer level packaging process. It is to be noted that the process steps described herein cover a portion of the manufacturing processes used to fabricate a package structure. Accordingly, it is understood that additional processes may be provided before, during, and after the illustrated method, and that some other processes may only be briefly described herein.

Embodiments include a (semiconductor) package structure including two or more than two semiconductor devices (or dies/chips) being electrically communicated with one another by one or more than one additional semiconductor device (or die/chip) with conductive terminals of fine pitches (e.g., less than or substantially equal to 25 μm). In some embodiments, the additional semiconductor device is placed on and connected to a redistribution circuit structure disposed over the semiconductor devices and serves as a bridge between the semiconductor devices for electrical communication, where an organic dielectric layer included in the additional semiconductor device disposed between the redistribution circuit structure and a silicon substrate of the additional semiconductor device greatly suppress a coefficient of thermal expansion (CTE) mismatch therebetween, and thus a reliability of the package structure can be ensured. In one scenario, the organic dielectric layer may further cover a sidewall of the silicon substrate of the additional semiconductor device, where the adhesion between the silicon substrate and an insulating encapsulation laterally covering the additional semiconductor device is enhanced, thereby further improving the reliability of the package structure.

Figure 8:
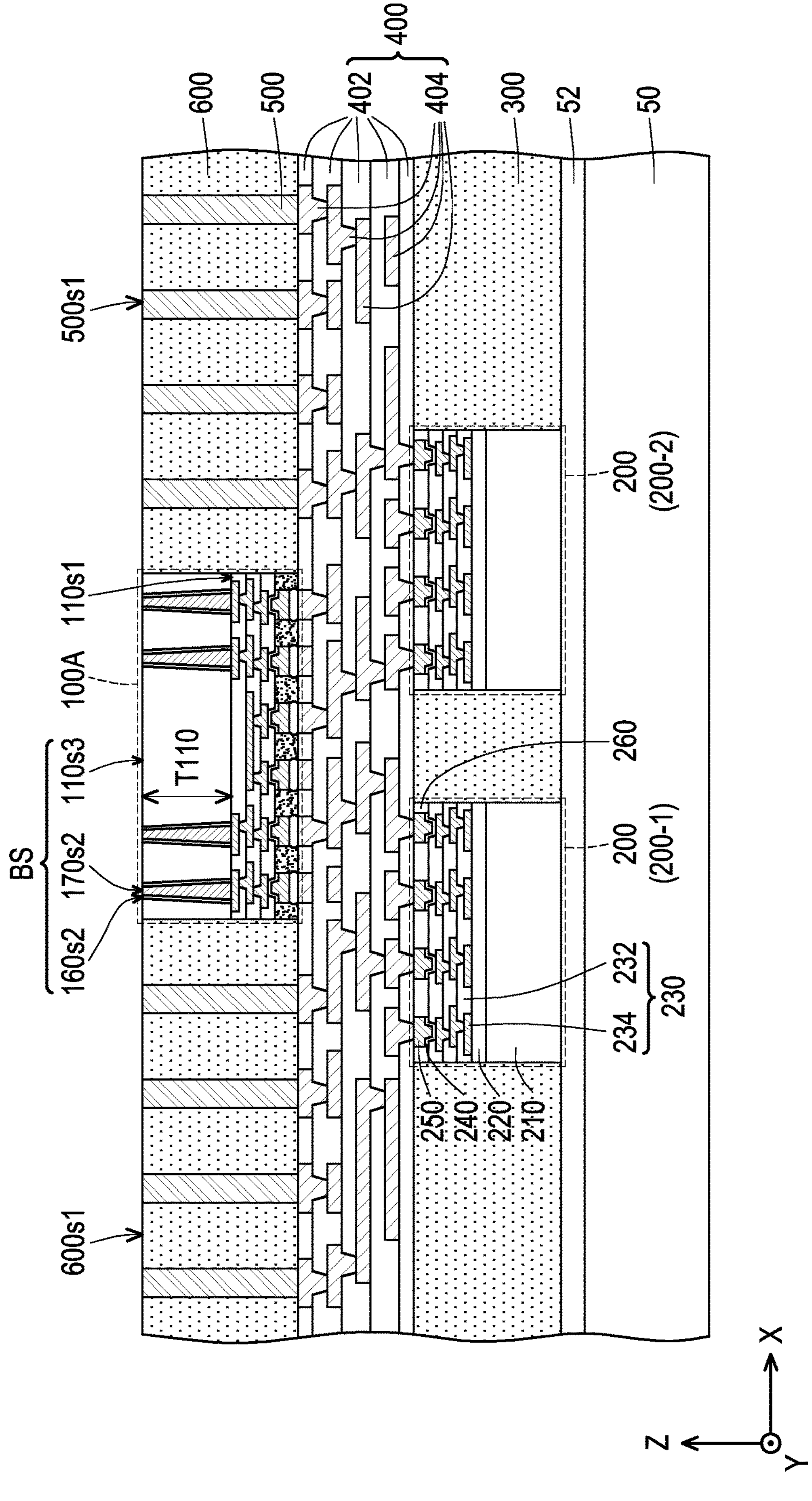
Figure 9:
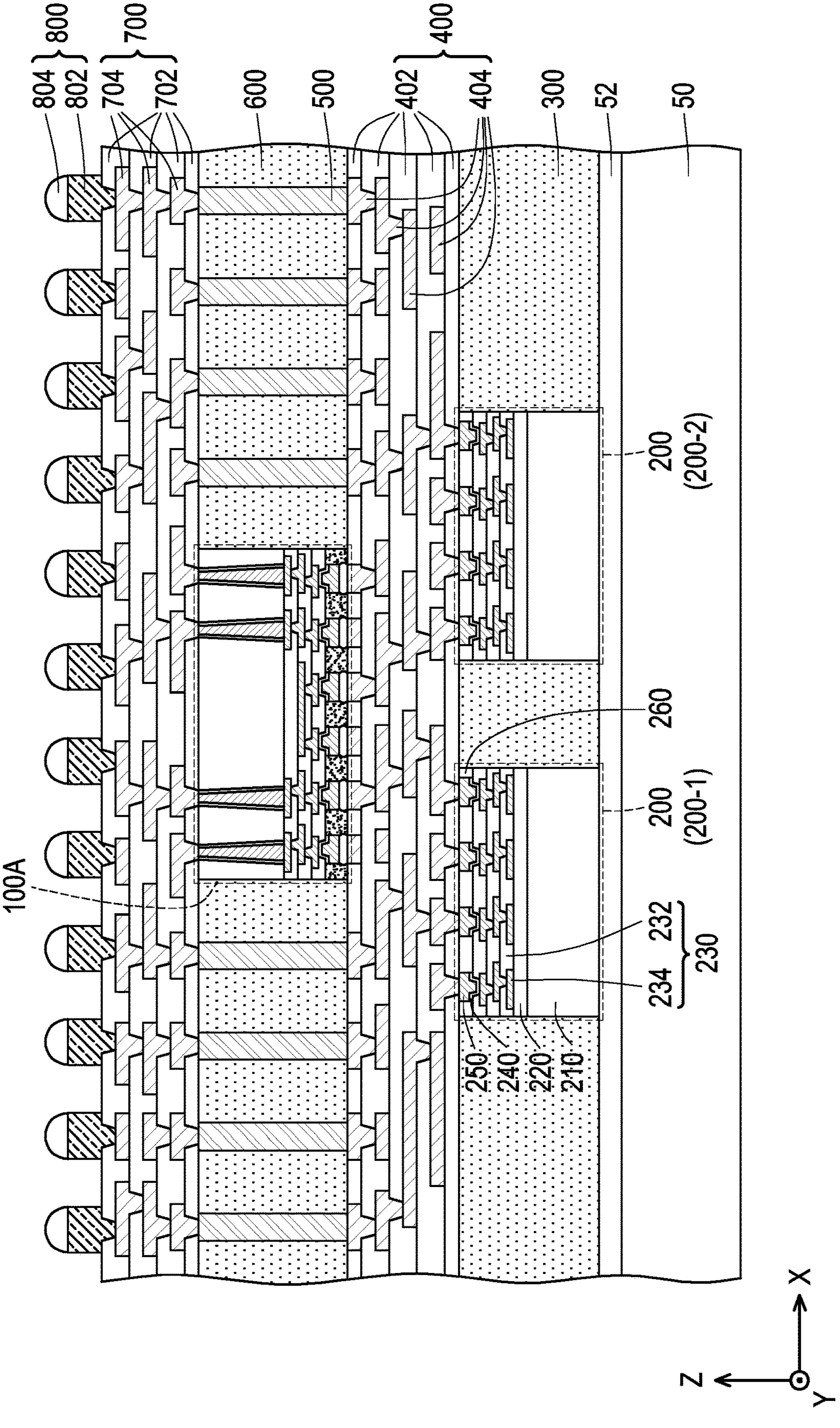
Figure 10:
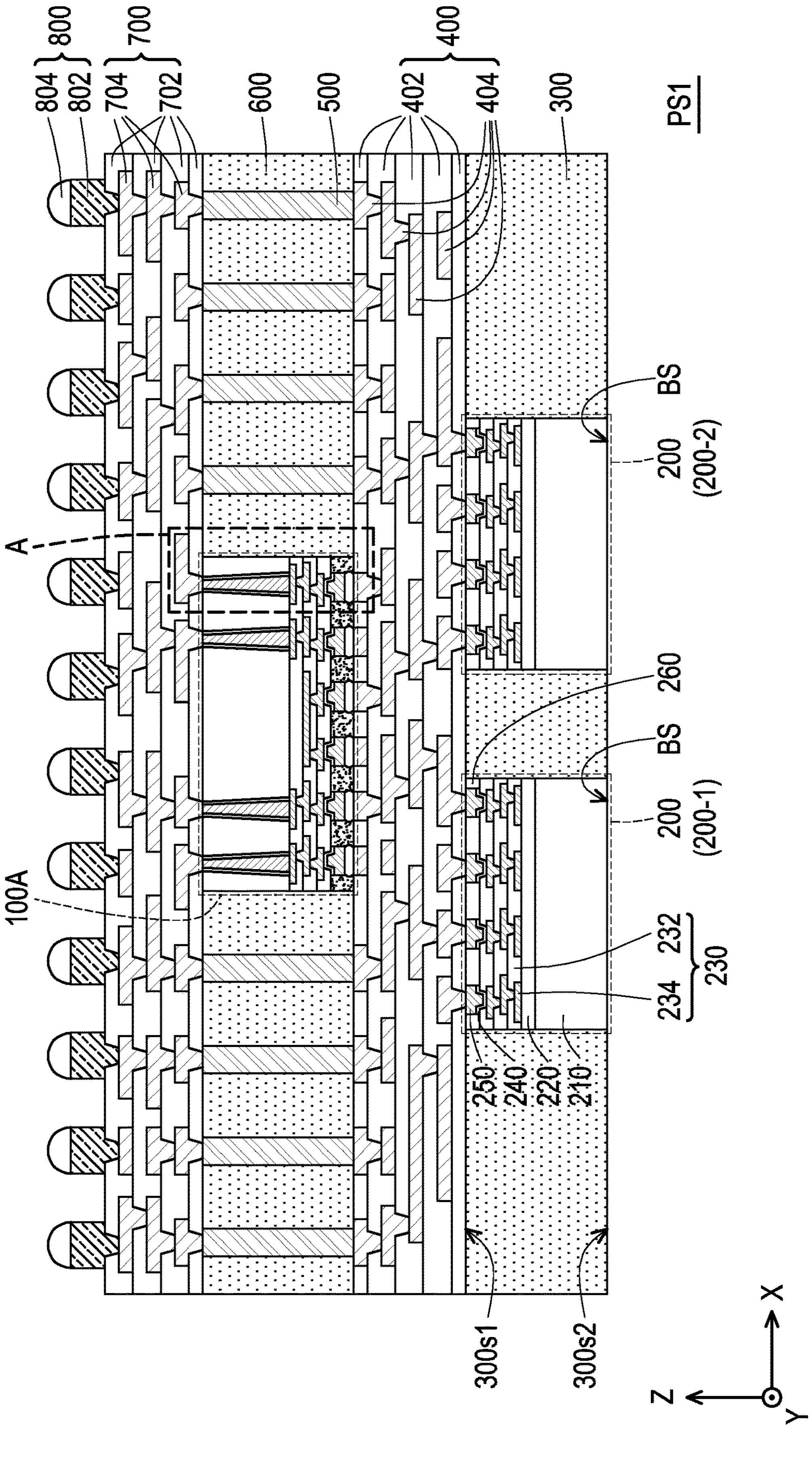
Figure 12:
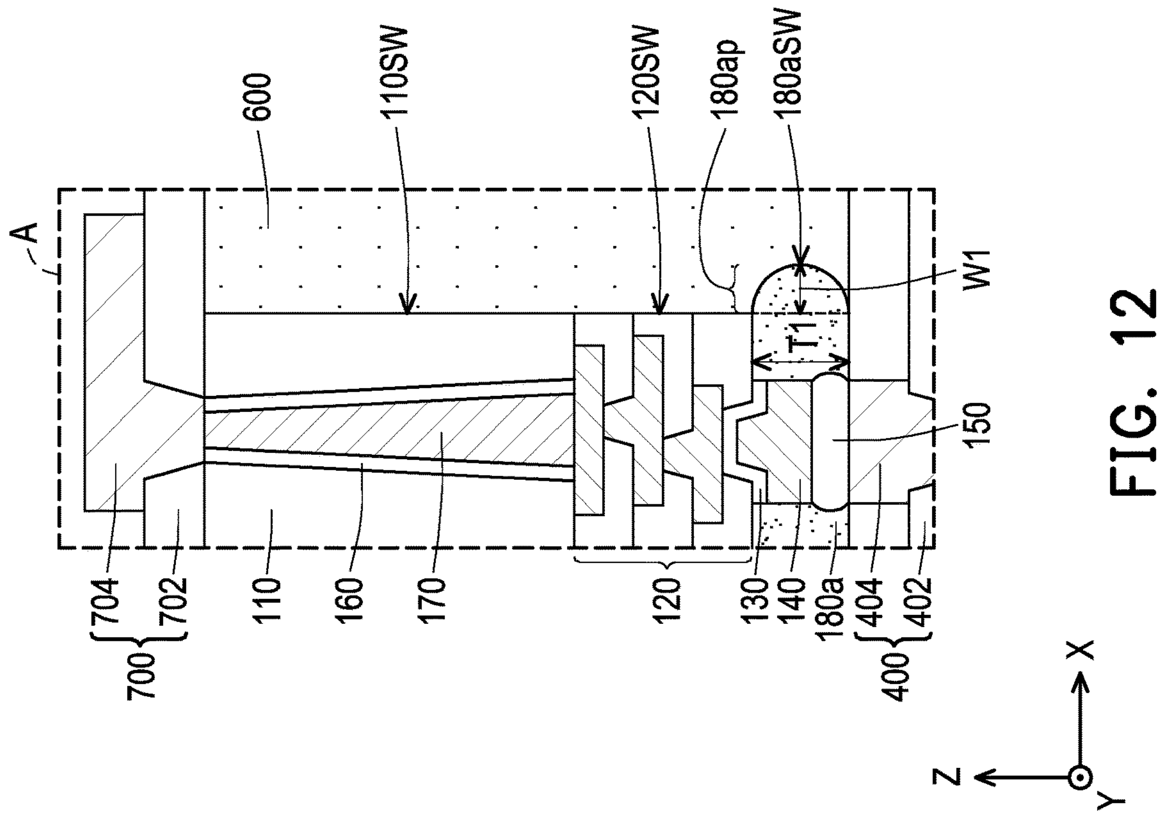
FIG. 12 through FIG. 14 are schematic cross-sectional views respectively showing various configurations of bonding between a semiconductor device and a redistribution circuit structure included in a package structure in accordance with alternative embodiments of the disclosure.
Figure 11:
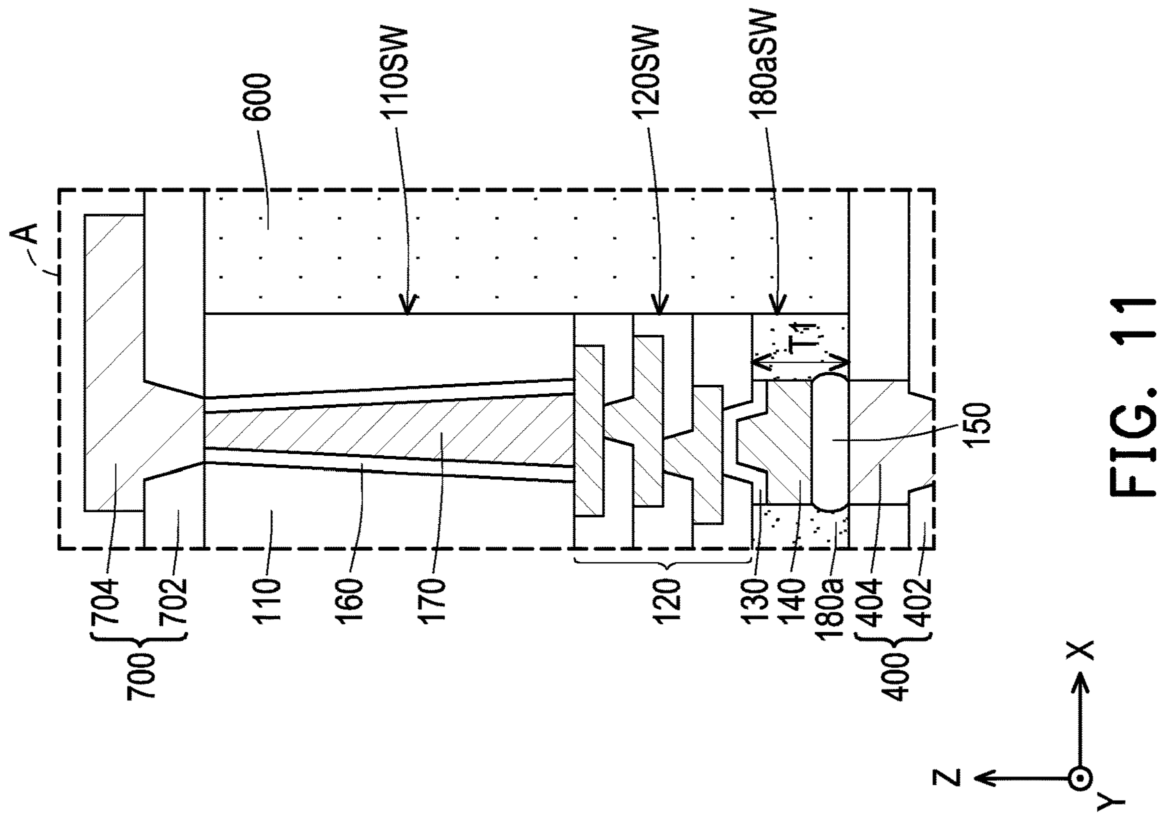
FIG. 11 is an enlarged and schematic cross-sectional view showing a configuration of bonding between a semiconductor device and a redistribution circuit structure included in the package structure depicted in FIG. 10.
Figure 14:
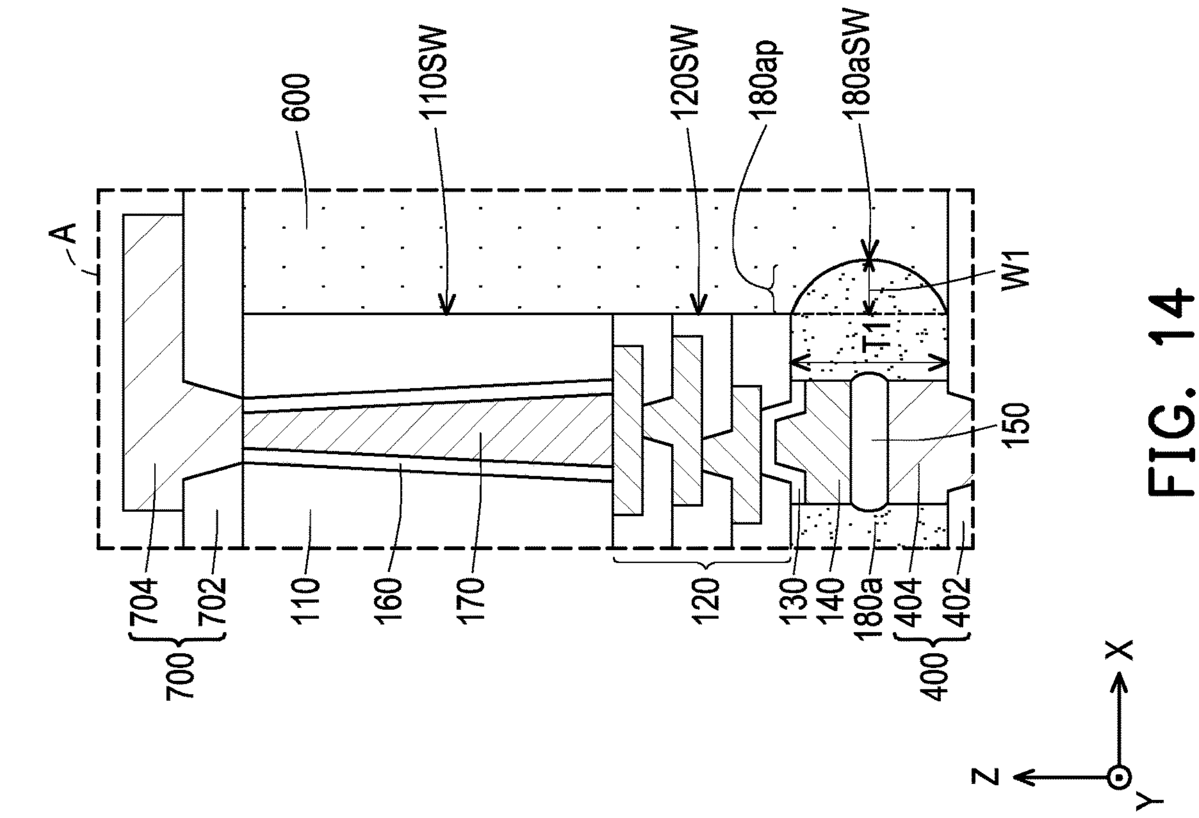
Figure 13:
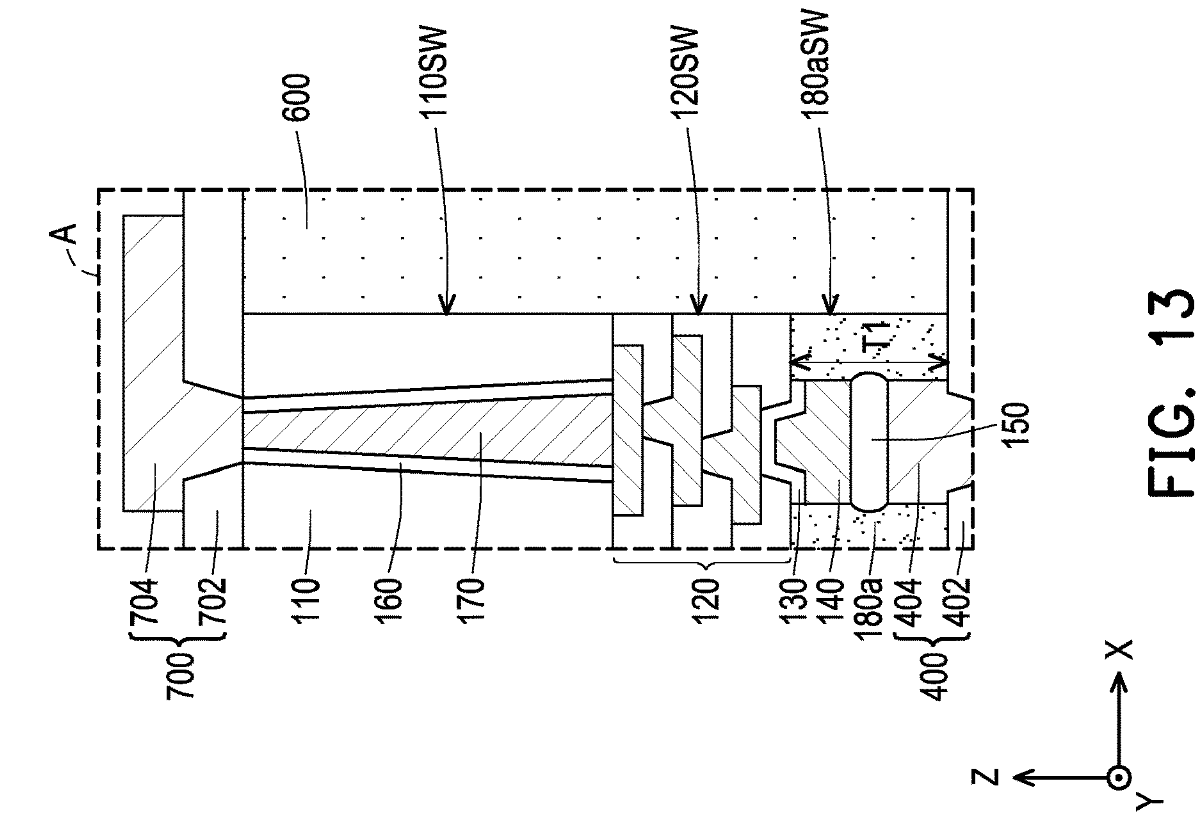

FIG. 1 to FIG. 10 are schematic views of various stages in a manufacturing method of a package structure PSI in accordance with some embodiments of the disclosure. FIG. 11 is an enlarged and schematic cross-sectional view showing a configuration of bonding between a semiconductor device and a redistribution circuit structure included in the package structure PSI depicted in FIG. 10. FIG. 12 through FIG. 14 are schematic cross-sectional views respectively showing various configurations of bonding between a semiconductor device and a redistribution circuit structure included in a package structure in accordance with alternative embodiments of the disclosure. In some embodiments, the enlarged and schematic cross-sectional views of FIG. 11 through FIG. 14 are outlined in a dashed box A as shown in FIG. 10.

Referring to FIG. 1, in some embodiments, a wafer 1000 is provided. The wafer 1000 may be a semiconductor wafer. In some embodiments, if considering a top view along a direction Z, the wafer 1000 is in a wafer or panel form. In other words, the wafer 1000 is processed in the form of a reconstructed wafer/panel. The wafer 1000 may be in a form of wafer-size having a diameter of about 4 inches or more. The wafer 1000 may be in a form of wafer-size having a diameter of about 6 inches or more. The wafer 1000 may be in a form of wafer-size having a diameter of about 8 inches or more. Or alternatively, the wafer 1000 may be in a form of wafer-size having a diameter of about 12 inches or more. In some embodiments, the wafer 1000 includes a plurality of device regions R1 arranged in a form of an array along a direction X and a direction Y, where each device region R1 is a pre-determined location for a later-formed semiconductor device (die or chip). The direction X, the direction Y and the direction Z may be different from each other. For example, the direction X is perpendicular to the direction Y, and the direction X and the direction Y are independently perpendicular to the direction Z, as shown in FIG. 1. In the disclosure, the direction Z may be referred to as a stacking direction, and an X-Y plane defined by the direction X and the direction Y may be referred to as a plane view or top view.

Before a wafer sawing or dicing process along scribe lines SL (shown as the dotted line in FIG. 1 through FIG. 3) is performed on the wafer 1000, the device regions R1 of the wafer 1000 are physically connected to one another, as shown in FIG. 1, for example. In FIG. 1, only four device regions R1 are shown for illustrative purposes, however the disclosure is not limited thereto. In some embodiments, the wafer 1000 includes a semiconductor substrate 110, an interconnect structure 120 disposed on the semiconductor substrate 110, a plurality of conductive pads 130 disposed on the interconnect structure 120, a plurality of conductive vias 140 disposed on and connected to the conductive pads 130, a plurality of solder regions 150 disposed on and connected to the conductive vias 140, a plurality of conductive vias 170 formed in the semiconductor substrate 110 and connected to the interconnect structure 120, and a plurality of liners 160 separating the conductive vias 170 from the semiconductor substrate 110.

In some embodiments, the semiconductor substrate 110 includes a bulk semiconductor, a semiconductor-on-insulator (SOI) substrate, other supporting substrate (e.g., quartz, glass, etc.), combinations thereof, or the like, which may be doped or undoped. In some embodiments, the semiconductor substrate 110 includes an elementary semiconductor (e.g., silicon or germanium in a crystalline, a polycrystalline, or an amorphous structure, etc.), a compound semiconductor (e.g., silicon carbide, gallium arsenide, gallium phosphide, indium phosphide, indium arsenide, and/or indium antimonide, etc.), an alloy semiconductor (e.g., silicon-germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), etc.), combinations thereof, or other suitable materials. The compound semiconductor substrate may have a multilayer structure, or the substrate may include a multilayer compound semiconductor structure. The alloy SiGe may be formed over a silicon substrate. The SiGe substrate may be strained. In some embodiments, a thickness T110*a* of the semiconductor substrate 110 is greater than or substantially equal to 400 μm, in the direction Z. For example, the thickness T110*a* of the semiconductor substrate 110 is approximately ranging from about 400 μm to 1500 μm. In some embodiments, the thickness T110*a* of the semiconductor substrate 110 is 775 μm. In such case, a thickness T180*a* of the dielectric layer 180*a* is approximately ranging from 3 μm to 15 μm.

In some embodiments, the semiconductor substrate 110 includes the semiconductor components formed therein or thereon, where the semiconductor components include active components (e.g., transistors, diodes, etc.) and/or passive components (e.g., capacitors, resistors, inductors, etc.), or other suitable electrical components. In some embodiments, the semiconductor components are formed at the active surface **110*s*1 of the semiconductor substrate 110 proximal to the interconnect structure 120. In some embodiments, as shown in FIG. 1, the semiconductor substrate 110 has an active surface 110*s*1 and a rear surface 110*s*2 opposite to the active surface 110*s*1 along the direction Z, and the interconnect structure 120 is disposed on and covers the active surface 110*s*1 of the semiconductor substrate 110. For a non-limiting example, the interconnect structure 120 may cover the semiconductor substrate 110 and may be electrically connected to the semiconductor components formed in or on the semiconductor substrate 110**.

The semiconductor substrate 110 may further include circuitry (not shown) formed in a front-end-of-line (FEOL) fabrication processes of the wafer 1000 to provide routing functions to the semiconductor components (if any) for internal connections, and the interconnect structure 120 may be formed in a back-end-of-line (BEOL) fabrication processes of the wafer 1000 for providing further routing functions to the semiconductor components (if any) and the conductive vias 160 for external connections. In some embodiments, in such BEOL fabrication process, the interconnect structure 120 includes an inter-layer dielectric (ILD) layer formed over the semiconductor substrate 110 and covering the semiconductor components (if any) and the conductive vias 160, and an inter-metallization dielectric (IMD) layer formed over the ILD layer. In some embodiments, the ILD layer and the IMD layer are formed of a low-K dielectric material or an extreme low-K (ELK) material, such as an oxide, silicon dioxide, boron-doped phosphosilicate glass (BPSG), phosphosilicate glass (PSG), fluorinated silicate glass (FSG), SiOxCy (x>0, y>0), Spin-On-Glass, Spin-On-Polymers, silicon carbon material, compounds thereof, composites thereof, combinations thereof, or the like. The ILD layer and the IMD layer may include any suitable number of dielectric material layers which is not limited thereto.

In some embodiments, the interconnect structure 120 includes one or more dielectric layers 122 and one or more metallization layers 124 in alternation, along the direction Z. The metallization layers 124 may be embedded in the dielectric layers 122. In some embodiments, the interconnect structure 120 is electrically coupled to the semiconductor components (if any) formed in and/or on the semiconductor substrate 110 and electrically coupled to external components (e.g., test pads, bonding conductors, etc.) formed thereon, and/or is electrically coupled to the conductive vias 160 formed in the semiconductor substrate 110 and electrically coupled to external components (e.g., test pads, bonding conductors, etc.) formed thereon. For example, the metallization layers 124 in the dielectric layers 122 route electrical signals between the semiconductor components (if any) of the semiconductor substrate 110 and route electrical signals between the semiconductor components of the semiconductor substrate 110 and the external components, and/or route electrical signals between the conductive vias 160 formed in the semiconductor substrate 110 and route electrical signals between the conductive vias 160 and the external components. In some embodiments, the semiconductor components (if any) and the metallization layers 124 are interconnected to perform one or more functions including memory structures (e.g., a memory cell), processing structures (e.g., a logic cell), input/output (I/O) circuitry (e.g., an I/O cell), or the like. In some embodiments, as shown in FIG. 1, the outermost layer of the dielectric layers 122 (referred to as an outermost dielectric layer) has openings (not labeled) exposing portions of a topmost layer of the metallization layers 124 for further electrical connection.

The dielectric layers 122 may be polyimide, polybenzoxazole (PBO), benzocyclobutene (BCB), a nitride such as silicon nitride, an oxide such as silicon oxide, PSG, borosilicate glass (BSG), BPSG, a combination thereof or the like, which may be patterned using a photolithography and/or etching process. In some embodiments, the dielectric layers 122 are formed by suitable fabrication techniques such as spin-on coating, chemical vapor deposition (CVD), plasma-enhanced chemical vapor deposition (PECVD) or the like. The dielectric layers 122 may together referred to as a dielectric structure of the interconnect structure 120.

The metallization layers 124 may be made of conductive materials formed by electroplating or deposition, such as copper, copper alloy, aluminum, aluminum alloy, or combinations thereof, which may be patterned using a photolithography and etching process. In some embodiments, the metallization layers 124 are patterned copper layers or other suitable patterned metal layers. The metallization layers 124 may be metal lines, metal vias, metal pads, metal traces, or combinations thereof, etc. For example, each layer of the metallization layers 124 includes a horizontal portion (or a line portion) extending along the direction X and/or the direction Y and a vertical portion (or a via portion) extending along the direction Z, where every horizontal portion is electrically connected to one or more than one vertical portion. Throughout the description, the term “copper” is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc. The numbers of the dielectric layers 122 and the number of the metallization layers 124 are not limited in the disclosure, and may be selected and designated based on demand and design layout/requirement. The metallization layers 124 may together referred to as a redistribution structure of the interconnect structure 120, where the redistribution structure is embedded in the dielectric structure.

In some embodiments, as shown in FIG. 1, the conductive pads 130 are disposed on the interconnect structure 120 and are electrically connected to (e.g., in physical contact with) the exposed portions of the topmost layer of the metallization layers 124 through the opening formed in the topmost layer of the dielectric layers 122, and the conductive vias 140 are disposed on and electrically connected to (e.g., in physical contact with) the conductive pads 130 contacting the topmost layer of the metallization layers 124 of the interconnect structure 120. The conductive pads 130 contacting the topmost layer of the metallization layers 124 of the interconnect structure 120 may be referred to as under bump metallurgies (UBMs). The conductive pads 130 may be omitted. In alternative embodiments, if the conductive pads 130 are omitted, the conductive vias 140 are disposed on and electrically connected the topmost layer of the metallization layers 124 of the interconnect structure 120 through the openings formed in the topmost layer of the dielectric layers 122 of the interconnect structure 120. In some embodiments, the solder regions 150 are disposed on and electrically connected to (e.g., in physical contact with) the conductive vias 140, where the conductive vias 140 are interposed between the solder regions 150 and the conductive pads 130, and the conductive pads 130 are interposed between the conductive vias 140 and the interconnect structure 120.

For example, the formation of the conductive pads 130, the conductive vias 140, and the solder regions 150 includes, but not limited to, a seed layer (not shown) is conformally and entirely formed over the interconnect structure 120 and extends into the openings to be in contact with the topmost layer of the metallization layers 124. In some embodiments, the seed layer is a metal layer, which may be a single layer or a composite layer comprising a plurality of sub-layers formed of different materials. In some embodiments, the seed layer comprises a titanium layer and a copper layer over the titanium layer, or two titanium layers and a cupper layer sandwiched between the two titanium layers. The seed layer may be formed using, for example, sputtering or the like.

A photo resist (not shown) is then formed and patterned on the seed layer, for example. The photo resist may be formed by spin coating or the like, and may be exposed to light for patterning. In some embodiments, a material of the photo resist includes a positive resist material or a negative resist material, that is suitable for a patterning process such as a photolithography process with a mask or a mask-less photolithography process (such as an electron-beam (e-beam) writing or an ion-beam writing). In the disclosure, the photo resist may be referred to as a photoresist layer or a resist layer. In some embodiments, the pattern of the photo resist is corresponding to the positioning locations of the conductive vias 140. For example, the photo resist is patterned to obtain the pattern having a plurality of through holes exposing the seed layer located underneath, where the conductive vias 140 are formed in the through holes in a sequential step.

A conductive material (not shown) is then formed in the through holes patterned in the photo resist and on the exposed portions of the seed layer to form the plurality of the conductive vias 140 on the exposed portions of the seed layer contacting the topmost layer of the metallization layers 124, for example. In other words, the conductive vias 140 are electrically connected to the interconnect structure 120 through the underneath seed layer. In some embodiments, some of the conductive vias 140 are used to electrically connect other semiconductor components (if any), the conductive vias 160, or be electrically grounded. The disclosed is not limited thereto.

The conductive material may be formed in the through holes patterned in the photo resist by plating (such as electroplating or electroless plating) or the like. The conductive material may comprise a metal, such as copper, aluminum, gold, nickel, silver, palladium, tin, or the like. In some embodiments, the conductive vias 140 may be high lead or head-free. The conductive vias 140 may be controlled collapse chip connection (C4) bumps, micro bumps, electroless nickel-immersion gold technique (ENIG) formed bumps, electroless nickel-electroless palladium-immersion gold technique (ENEPIG) formed bumps, or the like. The disclosure is not limited thereto. In some embodiments, a pitch D1 between two immediately adjacent conductive vias 140 is of about 6 μm to about 25 μm, although other suitable thickness may alternatively be utilized.

Figure 3:
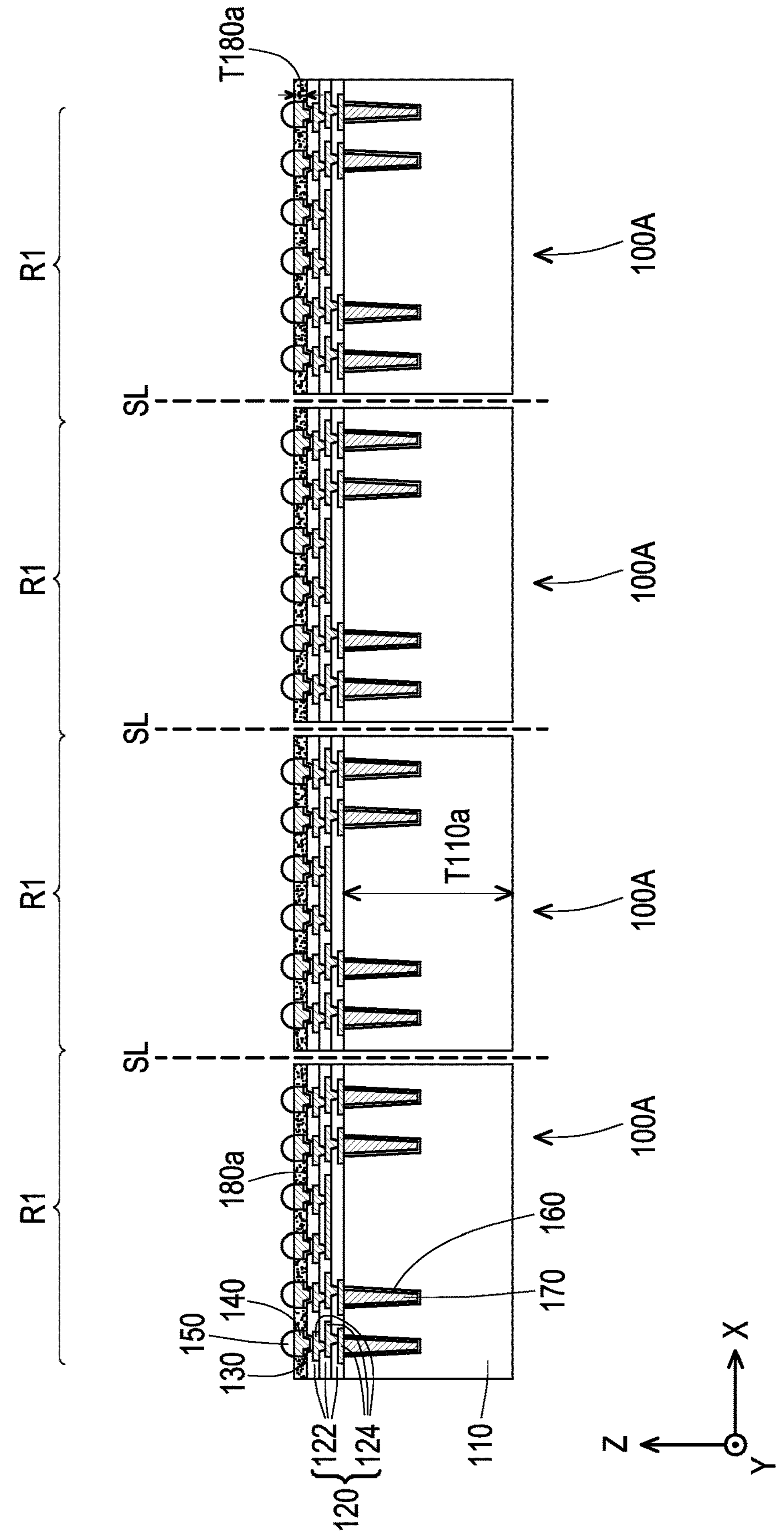

A solder material may be formed on the conductive vias 140 located in the through holes patterned in the photo resist, and a reflow process may be performed in order to shape the solder material into the desired bump shapes over the conductive vias 140 to form the solder regions 150. For example, the solder material is disposed on the conductive vias 140 by printing or the like. The material of the solder regions 150 may include either eutectic solder or non-eutectic solder. The solder may include lead or be lead-free, and may include Sn—Ag, Sn—Cu, Sn—Ag—Cu, or the like. For example, the material of the solder regions 150 may include a lead-free (LF) solder material (such as Sn-base materials) with or without additional impurity (such as Ni, Bi, Sb, Ag, Cu, Au, or the like). In the disclosure, one conductive via 140 and a respective one solder region 150 directly disposed thereon may together be referred to as a conductive terminal of a semiconductor device 100A as depicted in FIG. 3. The conductive terminals of the semiconductor device 100A may be referred to as conductors, conductive connectors, or conductive input/output terminals of the semiconductor device 100A for electrical connection with external components or elements (e.g., an additional semiconductor package/device, a circuit substrate or structure, an interposer, an capacitor, a power source, or the like, etc.).

After the plurality of the conductive vias 140 and the solder regions 150 are formed, the photo resist is removed by an ashing or stripping process, such as using an oxygen plasma or the like. Once the photo resist is removed, portions of the seed layer, which is not covered by the conductive vias 140 and the solder regions 150, are removed by using an etching process to form the conductive pads 130. In some embodiments, the etching process may be wet or dry etching. However, the disclosure is not limited thereto. In some embodiments, the portions of the seed layer, which is not covered by the conductive vias 140 and the solder regions 150, are removed by using the conductive vias 140 and the solder regions 150 as a mask for performing a self-align patterning process, as so to form the conductive pads 130. In such case, the conductive vias 140 and the conductive pads 130 underlying thereof share the same pattern. For example, as shown in FIG. 1, sidewalls of the conductive vias 140 and the conductive pads 130 underlying thereof are substantially aligned.

In some embodiments, as shown in FIG. 1, the conductive vias 140 share the same lateral width (or a diameter), and the solder regions 150 share the same lateral width (or a diameter), where the lateral width of the conductive vias 140 is substantially equal to the lateral width of the solder regions 150. However, the disclosure is not limited thereto; alternatively, the conductive vias 140 have different lateral widths, in part or all. The solder regions 150 have different lateral widths, in part or all. Only six conductive vias 140, six solder regions 150 and four conductive vias 170 are shown in each device region R1 depicted in FIG. 1 for illustrative purposes and simplicity, however the disclosure is not limited thereto. The numbers of the conductive vias 140, the solder regions 150 and the conductive vias 170 are not limited to the disclosure, and may be selected and designed based on the demand and design layout/requirement.

Continued on FIG. 1, in some embodiments, the conductive vias 170 are embedded in the semiconductor substrate 110. For example, the conductive vias 170 are formed in the semiconductor substrate 110 and extended from the active surface 110*s*1 towards the rear surface 110*s*2 along the direction Z. As shown in FIG. 1, for example, top surfaces 170*s*1 of the conductive vias 170 are substantially coplanar to the active surface 110*s*1 of the semiconductor substrate 110 to be in contact with a bottommost layer of the metallization layers 124 exposed by a lowest layer of the dielectric layers 122 of the interconnect structure 120. In some embodiments, the conductive vias 170 are not accessibly revealed by the rear surface 110_s_2 of the semiconductor substrate 110. In some embodiments, the conductive vias 170 may be tapered from the interconnect structure 120 to the rear surface 110_s_2. Alternatively, the conductive vias 170 have substantially vertical sidewalls. In a cross-sectional view along the direction Z, the shape of the conductive vias 170 may depend on the design requirements, and is not intended to be limiting in the disclosure. On the other hand, in a top (plane) view on the X-Y plane, the shape of the conductive vias 170 is circular shape. However, depending on the design requirements, and the shape of the conductive vias 170 may be an oval shape, a rectangular shape, a polygonal shape, or combinations thereof; the disclosure is not limited thereto.

In some embodiments, the conductive vias 170 are in physical contact with the bottommost layer of the metallization layers 124 of the interconnect structure 120 exposed by the lowest layer of the dielectric layers 122 of the interconnect structure 120 at the active surface 110_s_1, as illustrated in FIG. 1. That is, the conductive vias 170 are electrically connected to the semiconductor components (if any) in the semiconductor substrate 110 through the interconnect structure 120, are electrically connected to the conductive vias 140 through the interconnect structure 120 and the conductive pads 130, and are electrically connected to the solder regions 150 through the interconnect structure 120, the conductive pads 130 and the conductive vias 140. The conductive vias 170 may be formed of a conductive material, such as copper, tungsten, aluminum, silver, combinations thereof, or the like. The number of the conductive vias 170 is not limited in the disclosure, and may be selected and designated based on demand and design layout.

In some embodiments, each of the conductive vias 170 is covered by a liner 160. For example, the liners 160 are formed between the conductive vias 170 and the semiconductor substrate 110. The liners 160 may be formed of a barrier material, such as TiN, Ta, TaN, Ti, or the like. In alternative embodiments, a dielectric liner (not shown) (e.g., silicon nitride, an oxide, a polymer, a combination thereof, etc.) may be further optionally formed between the liners 160 and the semiconductor substrate 110. In some embodiments, the conductive vias 170, the liners 160 and the optional dielectric liner are formed by forming recesses in the semiconductor substrate 110 and respectively depositing the dielectric material, the barrier material, and the conductive material in the recesses, removing excess materials on the semiconductor substrate 110. For example, the recesses of the semiconductor substrate 110 are lined with the dielectric liner so as to laterally separate the liners 160 lining sidewalls of the conductive vias 170 from the semiconductor substrate 110. The conductive vias 170 are formed by using a via-first approach, in certain embodiments. In such embodiments, the conductive vias 170 are formed prior to the formation of the interconnect structure 120. As shown in FIG. 1, in some embodiments, the conductive vias 170 are separated from the semiconductor substrate 110 through at least the liners 160. Alternatively, the liners 160 may be omitted. As shown in FIG. 1, for example, top surfaces 160_s_1 of the liners 160 are substantially coplanar to the top surfaces 170_s_1 of the conductive vias 170 and the active surface 110_s_1 of the semiconductor substrate 110. In some embodiments, the liners 160 are not accessibly revealed by the rear surface 110_s_2 of the semiconductor substrate 110.

Figure 2:
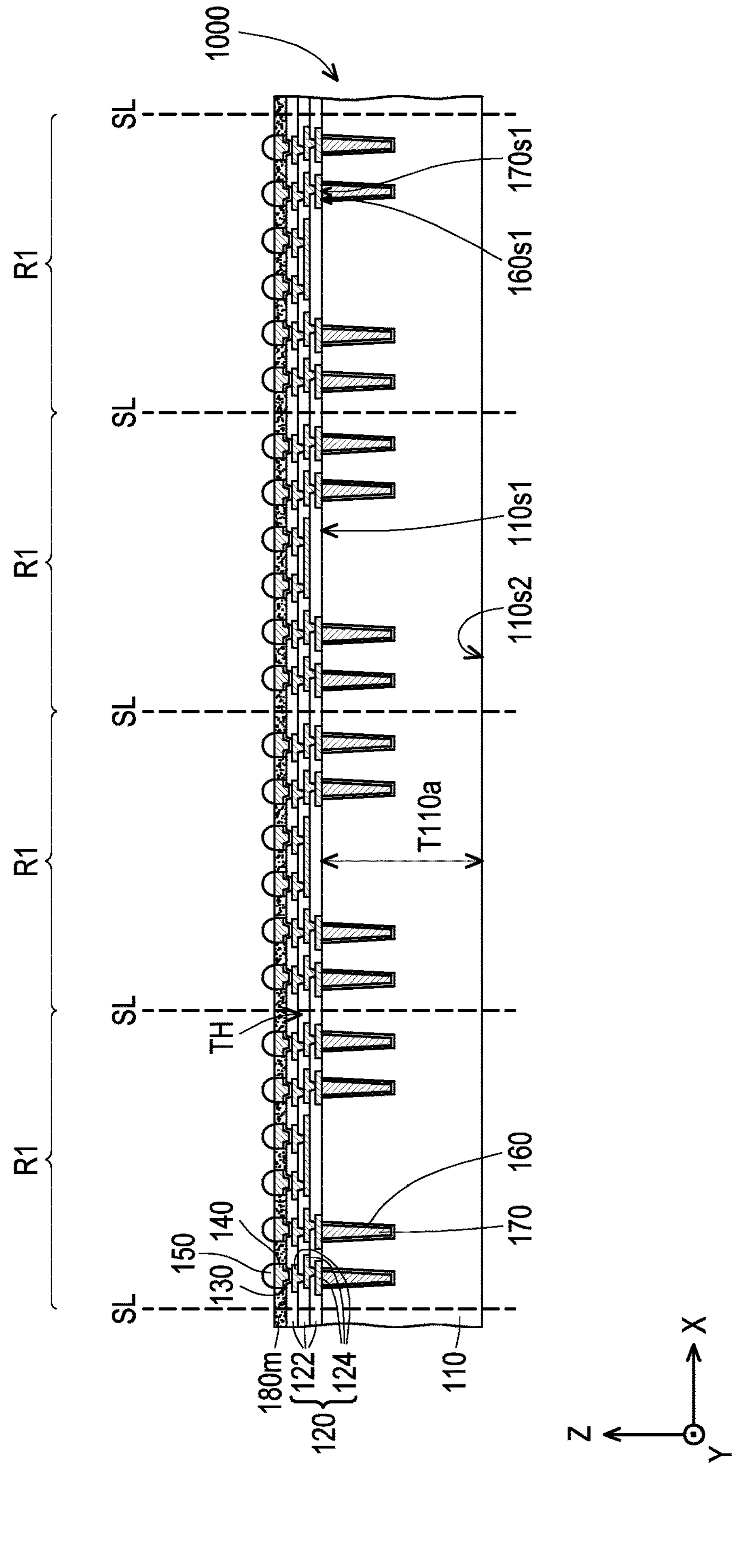

Referring to FIG. 2, in some embodiments, a dielectric material 180_m_ is formed on the wafer 1000. For example, the dielectric material 180_m_ is disposed on (e.g., in physical contact with) the interconnect structure 120 and laterally covers the conductive pads 130 and the conductive vias 140. In such case, the solder regions 150 are free from the dielectric material 180_m_, as shown in FIG. 2. Alternatively, the dielectric material 180_m_ may further partially cover the solder regions 150, where the solder regions 150 may still be accessibly revealed by the dielectric material 180_m_. For example, the dielectric material 180_m_ is formed on the wafer 1000 by compression molding process or like. However, the disclosure is not limited thereto.

In some embodiments, the dielectric material 180_m_ may include an organic dielectric material such as polymers (such as epoxy resins, phenolic resins, silicon-containing resins, rubber-based resin, acrylic polymer, or other suitable resins) or other suitable organic dielectric materials. In some embodiments, the dielectric material 180_m_ may further include inorganic filler or inorganic compound (e.g., silica, clay, aluminum oxide, and so on) which can be added therein to optimize CTE of the dielectric material 180_m_. In the case, an amount of the inorganic filler or inorganic compound (by weight percentage) presented in the dielectric material 180_m_ is ranging from about 70 wt % to about 90 wt %, such as 70 wt %, 75 wt %, 80 wt %, 85 wt %, or 90 wt %. In some embodiments, a ratio of the CTE of the semiconductor substrate 110 to the CTE of the dielectric material 180_m_ is approximately ranging 25:70 to 8:15.

Referring to FIG. 2 and FIG. 3 together, in some embodiments, a dicing (or singulation) process is sequentially performed along the scribe lines SL to cut through the dielectric material 180_m_, the interconnect structure 120 and the semiconductor substrate 110, thereby forming individual and separated semiconductor devices 100A corresponding to the device regions R1, where each of the semiconductor devices 100A includes the semiconductor substrate 110, the interconnect structure 120, the conductive pads 130, the conductive vias 140, the solder regions 150, the liners 160, the conductive vias 170, and a dielectric layer 180_a_. In such case, the dielectric material 180_m_ is diced into a plurality of discrete segments, such as the dielectric layers 180_a_ included in the individual and separated semiconductor devices 100A corresponding to the device regions R1. In some embodiments, the thickness T180_a_ (along the direction Z) of the dielectric layer 180_a_ is approximately from 3 μm to 15 μm, although other suitable thickness may alternatively be utilized. The dielectric layer 180_a_ may be referred to as an organic dielectric layer of the semiconductor devices 100A. The details of the dielectric layer 180_a_ are similar to or substantially identical to the details of the dielectric material 180_m_ previously described in FIG. 2, and thus are not repeated therein.

In one embodiment, the dicing (or singulation) process is a wafer dicing process including mechanical blade sawing or laser cutting. The disclosure is not limited thereto. As shown in FIG. 3, for each semiconductor device 100A, a sidewall of the dielectric layer 180_a_, a sidewall of the interconnect structure 120 and a sidewall of the semiconductor substrate 110 are substantially aligned with each other, in the direction Z. In the disclosure, for each semiconductor device 100A, the sidewall of the dielectric layer 180_a_, the sidewall of the interconnect structure 120 and the sidewall of the semiconductor substrate 110 together constitute a sidewall of the semiconductor device 100A. In such case, the sidewall of the semiconductor device 100A is a substantially vertical sidewall. In some embodiments, each of the semiconductor devices 100A is referred to as a bridge device, a bridge die, a bridge chip, or a bridge that providing electrical communication between two or more than two other semiconductor devices (or dies/chips) in the package structure PS1.

Figure 4:
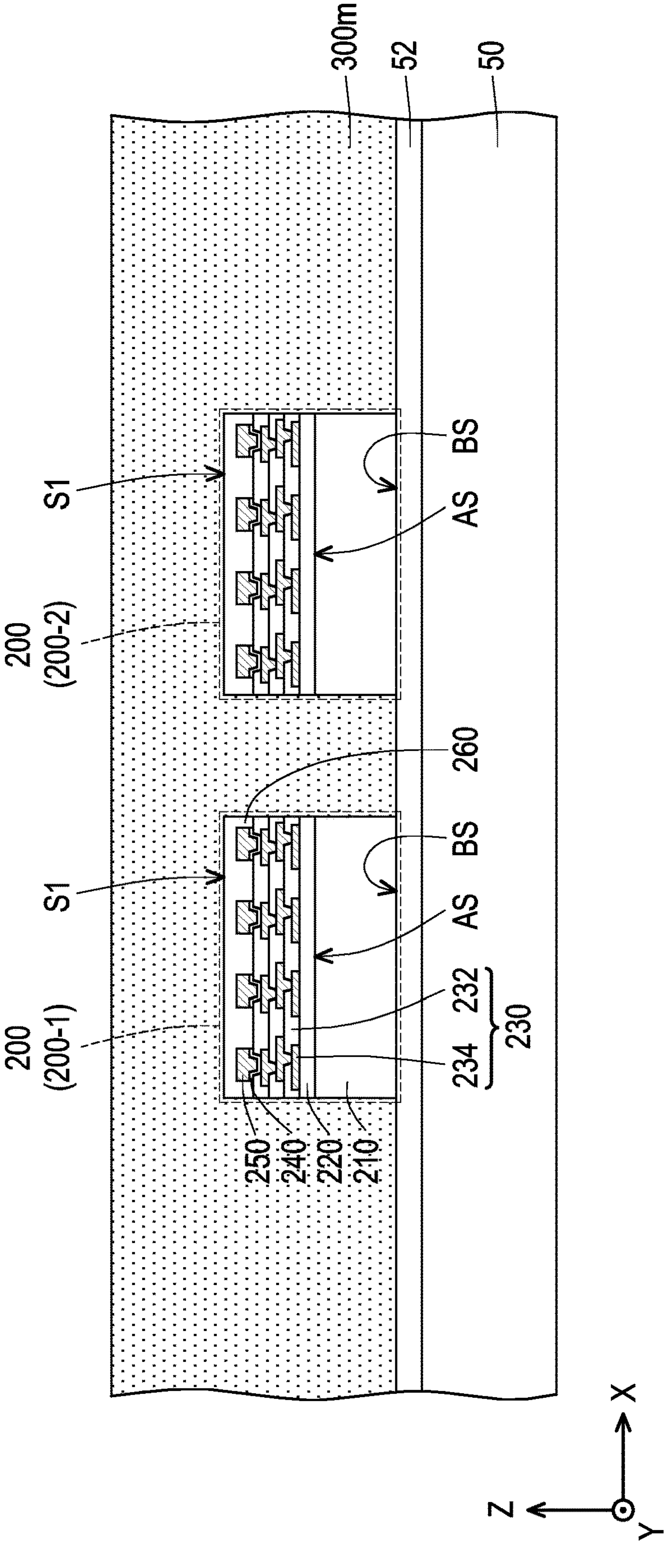

Referring to FIG. 4, in some embodiments, a carrier 50 is provide. In some embodiments, the carrier 50 may be a glass carrier, a ceramic carrier, or any suitable carrier for carrying a semiconductor wafer or a reconstituted wafer for the manufacturing method of the (semiconductor) package structure, such as the package structure PSI depicted in FIG. 10. In alternative embodiments, the carrier 50 may be a reclaim wafer or a reconstituted wafer for the manufacturing method of the (semiconductor) package structure. For a non-limiting example, as the material of the carrier 50 is a Si substrate, the carrier 50 may serve as a heat dissipating element for the package structure PS1. In such embodiments, the carrier 50 may further be used for warpage control during the manufacture of the package structure PS1. For another non-limiting example, as the carrier 50 is a glass carrier, the carrier 50 may be then removed after the manufacture of the package structure PS1. In one embodiment, the carrier 50 may be a temporary supporting structure, which may be removed during or after the manufacturing method of the package structure PS1. Or, the carrier 50 may be a mechanical supporting structure, which may not be removed after the manufacturing method of the package structure PS1.

In some embodiments, the carrier 50 is coated with a debond layer 52 (as shown in FIG. 4). The material of the debond layer 52 may be any material suitable for bonding and debonding the carrier 50 from the above layer(s) or any wafer(s) disposed thereon. In some embodiments, the debond layer 52 includes a dielectric material layer made of a dielectric material including any suitable polymer-based dielectric material (such as BCB, PBO). For a non-limiting example, the debond layer 52 includes a dielectric material layer made of an epoxy-based thermal-release material, which loses its adhesive property when heated, such as a light-to-heat-conversion (LTHC) release coating film. For another non-limiting example, the debond layer 52 includes a dielectric material layer made of an ultra-violet (UV) glue, which loses its adhesive property when exposed to UV lights. The debond layer 52 may be dispensed as a liquid and cured on the carrier 50, may be a laminate film laminated onto the carrier 50, or may be formed on the carrier 50 by any suitable method. For example, as shown in FIG. 4, an illustrated top surface of the debond layer 52, which is opposite to an illustrated bottom surface contacting the carrier 50, is leveled and has a high degree of coplanarity. In certain embodiments, the debond layer 52 is a LTHC layer with good chemical resistance, and such layer enables room temperature debonding from the carrier 50 by applying laser irradiation, however the disclosure is not limited thereto.

In an alternative embodiment, a buffer layer (not shown) is coated on the debond layer 52, where the debond layer 52 is sandwiched between the buffer layer and the carrier 50, and a top surface of the buffer layer may further provide a high degree of coplanarity. In some embodiments, the buffer layer may be a dielectric material layer. In some embodiments, the buffer layer may be a polymer layer which made of polyimide (PI), PBO, BCB, or any other suitable polymer-based dielectric material. In some embodiments, the buffer layer may be Ajinomoto Buildup Film (ABF), Solder Resist film (SRF), or the like. In other words, the buffer layer is an optional dielectric layer, and may be omitted based on the demand; the disclosure is not limited thereto. For example, the buffer layer may be formed by a suitable fabrication technique such as spin-coating, lamination, deposition, or the like.

In some embodiment, at least one semiconductor device 200 is provided on the debond layer 52 and over the carrier 50. For example, as shown in FIG. 4, two semiconductor devices 200 are shown for illustrative purposes, however the disclosure is not limited thereto. For example, the semiconductor devices 200 are picked-and-placed over on the debond layer 52 and over the carrier 50. As shown in FIG. 4, for illustrative purposes, the semiconductor device 200 at the left-hand side of the drawing can also be denoted as the semiconductor device 200-1, while the semiconductor device 200 at the right-hand side of the drawing can also be denoted as the semiconductor device 200-2.

In some embodiments, each of the semiconductor devices 200 includes a semiconductor substrate 210, a device layer 220 having semiconductor components (not shown) formed thereon, an interconnect structure 230 formed on the device layer 220 and over the semiconductor substrate 210, a plurality of connecting pads 240 formed on the interconnect structure 230, a plurality of connecting vias 250 formed on the connecting pads 240, and a protection layer 260 covers the interconnect structure 230, the connecting pads 240 and the connecting vias 250. In some embodiments, the semiconductor substrate 210 includes a bulk semiconductor, a semiconductor-on-insulator (SOI) substrate, other supporting substrate (e.g., quartz, glass, etc.), combinations thereof, or the like, which may be doped or undoped. In some embodiments, the semiconductor substrate 210 includes an elementary semiconductor (e.g., silicon or germanium in a crystalline, a polycrystalline, or an amorphous structure, etc.), a compound semiconductor (e.g., silicon carbide, gallium arsenide, gallium phosphide, indium phosphide, indium arsenide, and/or indium antimonide, etc.), an alloy semiconductor (e.g., silicon-germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), etc.), combinations thereof, or other suitable materials. The compound semiconductor substrate may have a multilayer structure, or the substrate may include a multilayer compound semiconductor structure. The alloy SiGe may be formed over a silicon substrate. The SiGe substrate may be strained.

In some embodiments, the device layer 220 includes the semiconductor components formed on (and/or partially formed in) the semiconductor substrate 210, where the semiconductor components include active components (e.g., transistors, diodes, memory, etc.) and/or passive components (e.g., capacitors, resistors, inductors, jumper, etc.), or other suitable electrical components. The device layer 220 may be disposed at an active surface AS of the semiconductor substrate 210 proximal to the interconnect structure 230, as shown in FIG. 4. In some embodiments, the semiconductor substrate 210 has the active surface AS and a bottom surface (or non-active surface) BS opposite to the active surface AS along the stacking direction Z of the interconnect structure 230, the device layer 220, and the semiconductor substrate 210. In some embodiments, the device layer 220 is interposed between the interconnect structure 230 and the active surface AS of the semiconductor substrate 210.

The device layer 220 may include circuitry (not shown) formed in a FEOL, and the interconnect structure 230 may be formed in a BEOL. In some embodiments, the interconnect structure 230 includes an ILD layer formed over the device layer 220, and an IMD layer formed over the ILD layer. In some embodiments, the ILD layer and the IMD layer are formed of a low-K dielectric material or ELK material, such as an oxide, silicon dioxide, BPSG, PSG, FSG, $SiO_xC_y$ ($x>0$, $y>0$), Spin-On-Glass, Spin-On-Polymers, silicon carbon material, compounds thereof, composites thereof, combinations thereof, or the like. The ILD layer and the IMD layer may include any suitable number of dielectric material layers which is not limited thereto.

In some embodiments, the interconnect structure 230 including one or more dielectric layers 232 and one or more metallization layer 234 in alternation. The metallization layer 234 may be embedded in the dielectric layers 232. In some embodiments, the interconnect structure 230 is electrically coupled to the semiconductor components of the device layer 220 to one another and to external components (e.g., test pads, bonding conductors, etc.) formed thereon. For example, the metallization layer 234 in the dielectric layers 232 route electrical signals between the semiconductor components of the device layer 220. The semiconductor components of the device layer 220 and the metallization layer 234 are interconnected to perform one or more functions including memory structures (e.g., a memory cell), processing structures (e.g., a logic cell), input/output (I/O) circuitry (e.g., an I/O cell), or the like. The uppermost layer of the interconnect structure 230 may be a passivation layer made of one or more suitable dielectric materials such as silicon oxide, silicon nitride, low-k dielectrics, polyimide (PI), combinations of these, or the like. In some embodiments, as shown in FIG. 4, the passivation layer (e.g., the uppermost layer of the dielectric layers 232) of the interconnect structure 230 has an opening exposing at least a portion of a topmost layer of the metallization layer 234 for further electrical connection.

The dielectric layers 232 may be PI, PBO, BCB, a nitride such as silicon nitride, an oxide such as silicon oxide, PSG, BSG, BPSG, a combination thereof or the like, which may be patterned using a photolithography and/or etching process. The etching process may include a dry etching, a wet etching, or a combination thereof. In some embodiments, the dielectric layers 232 are formed by suitable fabrication techniques such as spin-on coating, CVD, PECVD or the like.

The metallization layer 234 may be made of conductive materials formed by electroplating or deposition, such as copper, copper alloy, aluminum, aluminum alloy, or combinations thereof, which may be patterned using a photolithography and etching process. The etching process may include a dry etching, a wet etching, or a combination thereof. In some embodiments, the metallization layer 234 are patterned copper layers or other suitable patterned metal layers. For example, may be metal lines, metal vias, metal pads, metal traces, etc. The numbers of the dielectric layers 232 and the number of the metallization layers 234 are not limited in the disclosure, and may be selected and designated based on demand and design layout.

In some embodiments, as illustrated in FIG. 4, the connecting pads 240 are disposed over and electrically coupled to the topmost layer of the metallization layer 234 of the interconnect structure 230 exposed by the passivation layer (e.g., the uppermost layer of the dielectric layers 232) of the interconnect structure 230 for testing and/or further electrical connection. The connecting pads 240 may be made of aluminum, copper, or alloys thereof or the like, and may be formed by an electroplating process. The disclosure is not limited thereto. Some of the connecting pads 240 may be testing pads, and some of the connecting pads 240 may be conductive pads for further electrical connection. In alternative embodiments, the connecting pads 240 may be optional for simple structure and cost benefits. In such alternative embodiments, the connecting vias 250 may directly connect to the uppermost metallization layer 234.

In some embodiments, the connecting vias 250 are respectively disposed on and electrically connected to the connecting pads 240 for providing an external electrical connection to the circuitry and semiconductor components of the device layer 220. In one embodiment, the connecting vias 250 may be formed of conductive materials such as copper, gold, aluminum, the like, or combinations thereof, and may be formed by an electroplating process or the like. The connecting vias 250 may be bond vias, bond pads or bond bumps, or combinations thereof. The disclosure is not limited thereto. The connecting vias 250 may serve as bonding conductors for further electrical connection and may be formed over the connecting pads 250 (serving as the conductive pads for further electrical connection). The connecting vias 250 may be electrically coupled to the semiconductor components of the device layer 220 through the interconnect structure 230 and the connecting pads 240.

Alternatively, both of the connecting pads 240 and the connecting vias 250 may be formed on the interconnect structure 230. For example, the connecting vias 250 are disposed on and electrically connected to the topmost layer of the metallization layer 234 of the interconnect structure 230 exposed by the passivation layer (e.g., the uppermost layer of the dielectric layers 232) of the interconnect structure 230. That is, the connecting vias 250 and the connecting pads 240 may all be disposed on the topmost layer of the metallization layer 234 of the interconnect structure 230 exposed by the passivation layer in a manner of side-by-side. In such embodiments, the connecting pads 240 may be testing pads for testing while the connecting vias 250 may be the bonding conductors for further electrical connection. The connecting vias 250 may be electrically coupled to the semiconductor components of the device layer 220 through the interconnect structure 230.

In some embodiments, the protection layer 260 is formed on the interconnect structure 230 to cover the interconnect structure 230, the connecting pads 240, and the connecting vias 250. That is to say, the protection layer 260 prevents any possible damage(s) occurring on the connecting pads 240 and the connecting vias 250 during the transfer of the semiconductor devices 200. In addition, in some embodiments, the protection layer 260 further acts as a passivation layer for providing better planarization and evenness. In some embodiments, top surfaces of the connecting vias 250 are not accessibly revealed by a top surface S1 of the protection layer 260, as shown in FIG. 4.

The protection layer 260 may include one or more layers of dielectric materials, such as silicon nitride, silicon oxide, high-density plasma (HDP) oxide, tetra-ethyl-ortho-silicate (TEOS), undoped silicate glass (USG), silicon oxynitride, PBO, PI, silicon carbon, silicon carbon oxynitride, diamond like carbon (DLC), and the like, or a combination thereof. It should be appreciated that the protection layer 260 may include etch stop material layer(s) (not shown) interposed between the dielectric material layers depending on the process requirements. For example, the etch stop material layer is different from the overlying or underlying dielectric material layer(s). The etch stop material layer may be formed of a material having a high etching selectivity relative to the overlying or underlying dielectric material layer(s) so as to be used to stop the etching of layers of dielectric materials.

In some embodiments, the semiconductor devices 200 are picked and placed over the carrier 50 and disposed on the debond layer 52. In some embodiments, the semiconductor devices 200 are faced upwards and placed onto the debond layer 52 over the carrier 50. As shown in FIG. 4, surfaces S1 of the protection layers 260 of the semiconductor devices 200 are disposed away from the debond layer 52, where the bottom surfaces BS of the semiconductor devices 200 are disposed on the illustrated top surface of the debond layer 52, for example. The surfaces S1 of the protection layers 260 of the semiconductor devices 200 are facing upwards and accessibly revealed, in this case.

The semiconductor devices 200 may be referred to as semiconductor dies or chips, independently, including a digital chip, an analog chip, or a mixed signal chip. In some embodiments, the semiconductor devices 200 are, independently, a logic die such as a central processing unit (CPU), a graphics processing unit (GPU), a neural network processing unit (NPU), a deep learning processing unit (DPU), a tensor processing unit (TPU), a system-on-a-chip (SoC), an application processor (AP), and a microcontroller; a power management die such as a power management integrated circuit (PMIC) die; a wireless and radio frequency (RF) die; a baseband (BB) die; a sensor die such as a photo/image sensor chip; a micro-electro-mechanical-system (MEMS) die; a signal processing die such as a digital signal processing (DSP) die; a front-end die such as an analog front-end (AFE) dies; an application-specific die such as an application-specific integrated circuit (ASIC), a field-programmable gate array (FPGA); a combination thereof; or the like. In alternative embodiments, the semiconductor devices 200 are, independently, a memory die with a controller or without a controller, where the memory die includes a single-form die such as a dynamic random access memory (DRAM) die, a static random access memory (SRAM) die, a resistive random-access memory (RRAM), a magnetoresistive random-access memory (MRAM), a NAND flash memory, a wide I/O memory (WIO) a pre-stacked memory cube such as a hybrid memory cube (HMC) module, a high bandwidth memory (HBM) module; a combination thereof; or the like. In further alternative embodiments, the semiconductor devices 200 are, independently, an artificial intelligence (AI) engine such as an AI accelerator; a computing system such as an AI server, a high-performance computing (HPC) system, a high power computing device, a cloud computing system, a networking system, an edge computing system, a immersive memory computing system (ImMC), a SoIC system, etc.; a combination thereof; or the like. In some other embodiments, the semiconductor devices 200 are, independently, an electrical and/or optical input/output (I/O) interface die, an integrated passives die (IPD), a voltage regulator die (VR), a local silicon interconnect die (LSI) with or without deep trench capacitor (DTC) features, a local silicon interconnect die with multi-tier functions such as electrical and/or optical network circuit interfaces, IPD, VR, DTC, or the like. The types of the semiconductor devices 200 may be selected and designated based on the demand and design requirement, and thus are specifically limited in the disclosure.

In accordance with some embodiments of the disclosure, the types of some of the semiconductor devices 200 are different from each other, while some of the semiconductor devices 200 are identical types. In alternative embodiments, the types of all of the semiconductor devices 200 are different. In further alternative embodiments, the types of all of the semiconductor devices 200 are identical. In accordance with some embodiments of the disclosure, the sizes of some of the semiconductor devices 200 are different from each other, while some of the semiconductor devices 200 are the same sizes. In alternative embodiments, the sizes of all of the semiconductor devices 200 are different. In further alternative embodiments, the sizes of all of the semiconductor devices 200 are the same. In accordance with some embodiments of the disclosure, the shapes of some of the semiconductor devices 200 are different from each other, while the shapes of some of the semiconductor devices 200 are identical. In alternative embodiments, the shapes of all of the semiconductor devices 200 are different. In further alternative embodiments, the shapes of all of the semiconductor devices 200 are identical. The types, sizes and shapes of each of the semiconductor devices 200 are independent from each other, and may be selected and designed based on the demand and design layout, the disclosure is not limited thereto.

Although in FIG. 4, only two the semiconductor devices 200 are presented for illustrative purposes, however, it should be noted that the number of the semiconductor devices 200 (e.g., the semiconductor devices 200-1 and/or 200-2) may be one, two, three, or more than three, the disclosure is not limited thereto. The semiconductor devices 200 may be arranged aside to each other along the direction X. The semiconductor devices 200 may be arranged aside to each other along the direction Y. In some embodiments, the semiconductor devices 200 are arranged in the form of a matrix, such as the N×N array or N×M arrays (N, M>0, N may or may not be equal to M). However, the disclosure is not limited thereto, in an alternative embodiment, the semiconductor devices 200 are arranged in the form of a matrix, such as the N×N array or N×M arrays (N, M>0, N may or may not be equal to M). The disclosure is not limited thereto.

Continued on FIG. 4, in some embodiments, an encapsulation material 300*m* is formed on the debond layer 52 and over the carrier 50 to encapsulate the semiconductor devices 200. The semiconductor devices 200 are embedded in the encapsulation material 300*m*, and the debond layer 52 exposed by the semiconductor devices 200 is covered by the encapsulation material 300*m*, for example. In other words, the connecting vias 250 and the protection layers 260 of the semiconductor devices 200 may be not accessibly revealed and are well-protected by the encapsulation material 300*m*. In some embodiments, the encapsulation material 300*m* is a molding compound, a molding underfill, a resin (such as epoxy-based resin), or the like. The encapsulation material 300*m* may be formed by a molding process, such as a compression molding process or a transfer molding process. In some embodiments, the encapsulation material 300*m* may further include inorganic filler or inorganic compound (e.g., silica, clay, and so on) which can be added therein to optimize CTE of the encapsulation material 200*m*. The disclosure is not limited thereto. In some embodiments, the encapsulation material 300*m* is different from the dielectric material 180*m* and the dielectric layer 180*a*.

Figure 5:
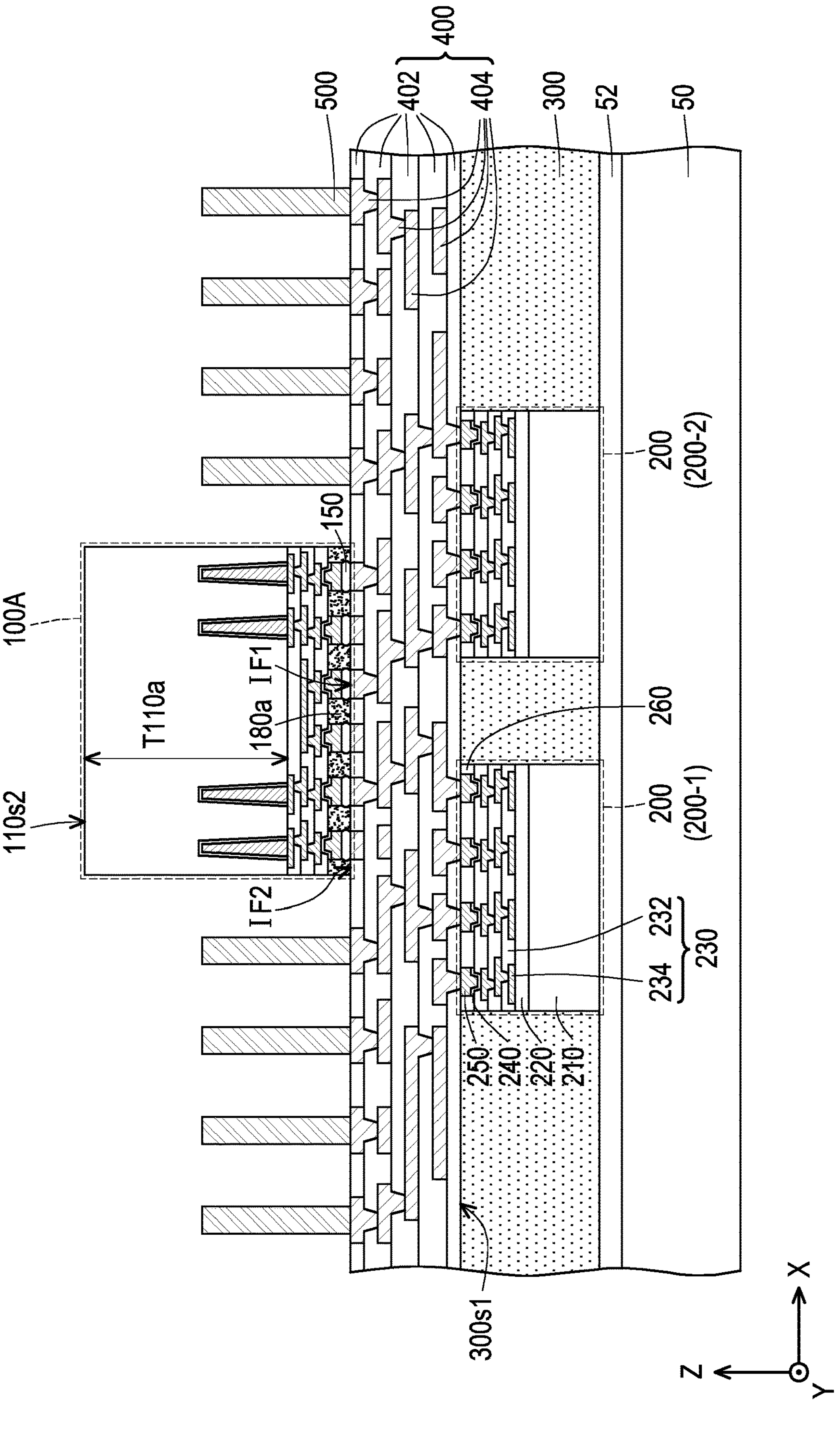

Referring to FIG. 4 and FIG. 5, in some embodiments, the encapsulation material 300*m* are planarized to form an insulating encapsulation 300 exposing the semiconductor devices 200. The insulating encapsulation 300 is disposed on the debond layer 52 to laterally encapsulate the semiconductor devices 200, for example, as shown in FIG. 5. In some embodiments, the encapsulation material 300*m* is planarized by a mechanical grinding process, a chemical mechanical polishing (CMP) process, an etching process, and/or combinations thereof. The etching process may include a dry etching, a wet etching, or a combination thereof. In some embodiments, during the planarizing process of the encapsulation material 300*m*, the protection layers 260 of the semiconductor devices 200 are planarized to accessibly reveal the connecting vias 250 of the semiconductor devices 200. In some embodiments, portions of the connecting vias 250 of the semiconductor devices 200 are slightly planarized as well. As shown in FIG. 5, a surface 300*s*1 of the insulating encapsulation 300 is substantially leveled with surfaces 250*s* of the connecting vias 250 and surfaces 260*s* of the protection layers 260 of each of the semiconductor devices 200, for example. In some embodiments, the surface 300*s*1 of the insulating encapsulation 300 is substantially coplanar to the surfaces 250*s* of the connecting vias 250 and the surfaces 260*s* of the protection layers 260 of the semiconductor devices 200. The surfaces 250*s* of the connecting vias 250 and the surface 260*s* of the protection layer 260 of each semiconductor devices 200 together may be referred to as a front surface FS of the semiconductor devices 200. For example, in direction Z, the front surfaces FS of the semiconductor devices 200 are opposite to the bottom surfaces BS of the semiconductor devices 200, as shown in FIG. 5. In some embodiments, the insulating encapsulation 300 encapsulates sidewalls of the semiconductor devices 200, where the connecting vias 250 of the semiconductor devices 200 are accessibly revealed by the insulating encapsulation 300.

In some embodiments, after the planarizing process, a cleaning step may be optionally performed to clean and remove the residue generated from the planarizing process. However, the disclosure is not limited thereto, and the planarizing process may be performed through any other suitable method.

Continued on FIG. 5, in some embodiments, a redistribution circuit structure 400 is formed on the insulating encapsulation 300 and is electrically coupled to the semiconductor devices 200, after the formation of the insulating encapsulation 300. In some embodiments, the redistribution circuit structure 400 is disposed on (e.g., in physical contact with) the surface 300*s*1 of the insulating encapsulation 300 and the front surfaces FS of the semiconductor devices 200. In some embodiments, the redistribution circuit structure 400 is fabricated to electrically connect with one or more connectors underneath. Here, the afore-said connectors may be the connecting vias 250 of the semiconductor device 200 embedded in the insulating encapsulation 300. In other words, the redistribution circuit structure 400 is physically connected and electrically connected to the connecting vias 250 of the semiconductor devices 200.

In some embodiments, the redistribution circuit structure 400 includes a plurality of dielectric layers 402 and a plurality of metallization layers 404 stacked alternately, and the metallization layers 404 are electrically connected to the connecting vias 250 of the semiconductor devices 200 embedded in the insulating encapsulation 300. As shown in FIG. 5, in some embodiments, the top surfaces 250*s* of the connecting vias 250 of the semiconductor devices 200 are in physical contact with the redistribution circuit structure 400. In such embodiments, the top surfaces 250*s* of the connecting vias 250 of the semiconductor devices 200 are in contact with a bottommost layer of the metallization layers 404 exposed by the bottommost layer of the dielectric layers 402. In some embodiments, the top surfaces 250*s* of the connecting vias 250 of the semiconductor devices 200 are partially covered by the bottommost layer of the dielectric layers 402.

The dielectric layers 402 may be PI, PBO, BCB, a nitride such as silicon nitride, an oxide such as silicon oxide, PSG, BSG, BPSG, a combination thereof or the like, which may be patterned using a photolithography and/or etching process. The etching process may include a dry etching, a wet etching, or a combination thereof. In some embodiments, the dielectric layers 402 are formed by suitable fabrication techniques such as spin-on coating, CVD, PECVD or the like. In some embodiments, the material of the dielectric layers 402 is different from the material of the dielectric layer 180*a*. The metallization layers 404 may be made of conductive materials formed by electroplating or deposition, such as copper, copper alloy, aluminum, aluminum alloy, or combinations thereof, which may be patterned using a photolithography and etching process. The etching process may include a dry etching, a wet etching, or a combination thereof. In some embodiments, the metallization layers 404 are patterned copper layers or other suitable patterned metal layers. For example, may be metal lines, metal vias, metal pads, metal traces, etc. The numbers of the dielectric layers 402 and the number of the metallization layers 404 are not limited in the disclosure, and may be selected and designated based on demand and design layout. In addition, a plurality of seed layers may be further included in the redistribution circuit structure 400.

As illustrated in FIG. 5, in some embodiments, a plurality of conductive pillars 500 are formed on the redistribution circuit structure 400. For example, the conductive pillars 500 are electrically connected to the redistribution circuit structure 400. In some embodiments, some of the conductive pillars 500 are electrically coupled to the semiconductor device 200-1 through the redistribution circuit structure 400, while some of the conductive pillars 500 are electrically coupled to the semiconductor device 200-2 through the redistribution circuit structure 400. Additionally, some of conductive pillars 500 are electrically coupled to the semiconductor device 100A through the redistribution circuit structure 400. In some embodiments, the conductive pillars 500 are arranged along but not on a cutting line (not shown) between two package structures PS1. A material of the conductive pillars 500 may include a metal material such as copper or copper alloys, or the like. For simplification, only eight conductive pillars 500 are presented in FIG. 5 for illustrative purposes, however, it should be noted that more than eight conductive pillars 500 may be formed; the disclosure is not limited thereto. The number of the conductive pillars 500 can be selected based on the demand and design requirements, and is not limited thereto.

The conductive pillars 500 are disposed on (e.g., in physical contact with) a topmost layer of the metallization layers 404 of the redistribution circuit structure 400 exposed from a topmost layer of the dielectric layers 402 of the redistribution circuit structure 400, as shown in FIG. 5, for example. The formation of the conductive pillars 500 may include, but not limited to, forming another photo resist (not shown) over the topmost layer of the metallization layers 404 of the redistribution circuit structure 400 exposed from a topmost layer of the dielectric layers 402 of the redistribution circuit structure 400, where the topmost layer of the metallization layers 404 of the redistribution circuit structure 400 exposed from the topmost layer of the dielectric layers 402 of the redistribution circuit structure 400 serves as a seed layer; patterning the another photo resist to form a plurality of openings (not shown) penetrating the another photo resist and exposing at least portions of the topmost layer of the metallization layers 404 of the redistribution circuit structure 400 exposed from the topmost layer of the dielectric layers 402 of the redistribution circuit structure 400 corresponding to (e.g., overlapped with) predetermined locations of the conductive pillars 500; forming a conductive material (not shown) in the openings to be in (physical) contact with the exposed portions of the topmost layer of the metallization layers 404 of the redistribution circuit structure 400 exposed from the topmost layer of the dielectric layers 402 of the redistribution circuit structure 400 to form the conductive pillars 500 (e.g., by plating (such as electroplating or electroless plating) or the like); and removing the patterned photo resist (e.g., by acceptable ashing process and/or photoresist stripping process (such as using an oxygen plasma or the like)). The formation, patterning, and material of the photo resist is similar to or substantially identical to the formation, patterning, and material of the photo resist as described in FIG. 1, and thus are not repeated herein for brevity.

Continued on FIG. 5, in some embodiments, one or more than one semiconductor device 100A is provided and bonded on the redistribution circuit structure 400. For illustrative purposes, only one semiconductor device 100A is shown in FIG. 5 for simplicity; the disclosure is not limited thereto. The number of the semiconductor devices 100A may be one, two, three, or more than three, the disclosure is not limited thereto. The details of the semiconductor device 100A are previously discussed in FIG. 1 through FIG. 3, and thus are not repeated for brevity. In some embodiments, the semiconductor device 100A is picked and placed over the redistribution circuit structure 400. For example, as shown in FIG. 5, the semiconductor device 100A is arranged to be overlapped with the semiconductor devices 200 (e.g., 200-1 and 200-2) in a vertical projection along the direction Z. In the case, in the cross-sectional view, the semiconductor device 100A extends from the semiconductor device 200-1 towards to the semiconductor device 200-2. In some embodiments, the semiconductor device 100A is placed over the redistribution circuit structure 400 for bonding by pick-and-place process.

For example, the semiconductor device 100A is bonded to the redistribution circuit structure 400 by bonding process including both of a metal-to-metal bonding and a dielectric-to-dielectric bonding. For example, the semiconductor device 100A is disposed on (e.g., in physical contact with) and electrically connected to the redistribution circuit structure 400. In some embodiments, as shown in FIG. 5 and FIG. 11, the solder regions 150 of the semiconductor device 100A and the topmost layer of the metallization layers 404 of the redistribution circuit structure 400 prop against each other and are bonded together through direct metal-to-metal bonding (e.g., such as a 'solder'-to-'copper' bonding). In addition, as shown in FIG. 5 and FIG. 11, the dielectric layer 180*a* of the semiconductor device 100A and the topmost layer of the dielectric layers 402 of the redistribution circuit structure 400 prop against each other and are bonded together through a direct dielectrics-to-dielectrics bonding (such as an 'organic dielectric'-to-'inorganic dielectric' bonding), for example. In such embodiments, a bonding interface IF1 (e.g., a metal-to-metal interface such as a 'solder'-to-'copper' bonding interface) and a bonding interface IF2 (e.g., a dielectric-to-dielectric bonding interface such as an 'organic dielectric'-to-'inorganic dielectric' bonding) are co-existing between the semiconductor device 100A and the redistribution circuit structure 400, which is considered as a bonding interface of the semiconductor device 100A and the redistribution circuit structure 400. Due to the dielectric layer 180*a,* the CTE mismatch is greatly suppressed, thereby ensuring the reliability of the package structure PS1. The bonding process may include thermo-compression bonding (TCB) involving pressing and heating steps; however, the disclosure is not limited thereto.

It should be noted that bonding methods described above are merely examples and are not intended to be limiting. An offset may present between sidewalls of the solder regions 150 and sidewalls of the portions of the topmost layer of the metallization layers 404 respectively underlying thereto, see FIG. 11. Since one of the solder regions 150 and the respective portions of the topmost layer of the metallization layers 404 may have a larger bonding surface than the other one, the direct metal-to-metal bonding may still be achieved even if misalignment occurs, thereby the reliability of electrical connections between the semiconductor device 100A and the redistribution circuit structure 400 can be ensured. With such, for certain embodiments, either the dielectric layer 180*a* immediately adjacent to the solder regions 150 is bonded to a portion of each of the respective portions of the topmost layer of the metallization layers 404 (e.g., a dielectric-to-metal bonding), or the dielectric layer 402 immediately adjacent to the respective portions of the topmost layer of the metallization layers 404 is bonded to a portion of each of the solder regions 150 (e.g., a dielectric-to-metal bonding).

In some embodiments, the semiconductor device 100A is electrically coupled to the semiconductor devices 200 through the redistribution circuit structure 400 for providing electrical communication between the semiconductor devices 200. In other words, the semiconductor devices 200 are electrically coupled and electrically communicated to one another through the semiconductor device 100A. As shown in FIG. 5, for example, in the cross-sectional view, the semiconductor device 100A is overlapped with the both of the semiconductor devices 200. In other words, in a vertical projection on the carrier 50 along the direction Z, the positioning location of the semiconductor device 100A is overlapped with the positioning locations of the semiconductor device 200.

In some embodiments, the conductive pillars 500 are disposed on the redistribution circuit structure 400 prior to the bonding the semiconductor device 100A onto the redistribution circuit structure. In alternative embodiments, the conductive pillars 500 are disposed on the redistribution circuit structure 400 after the bonding the semiconductor device 100A onto the redistribution circuit structure 400. The disclosure is not limited thereto. As shown in FIG. 5, for example, the overall thickness of the semiconductor device 100A is greater than the thickness of the conductive pillars 500 in a significant amount.

Figure 6:
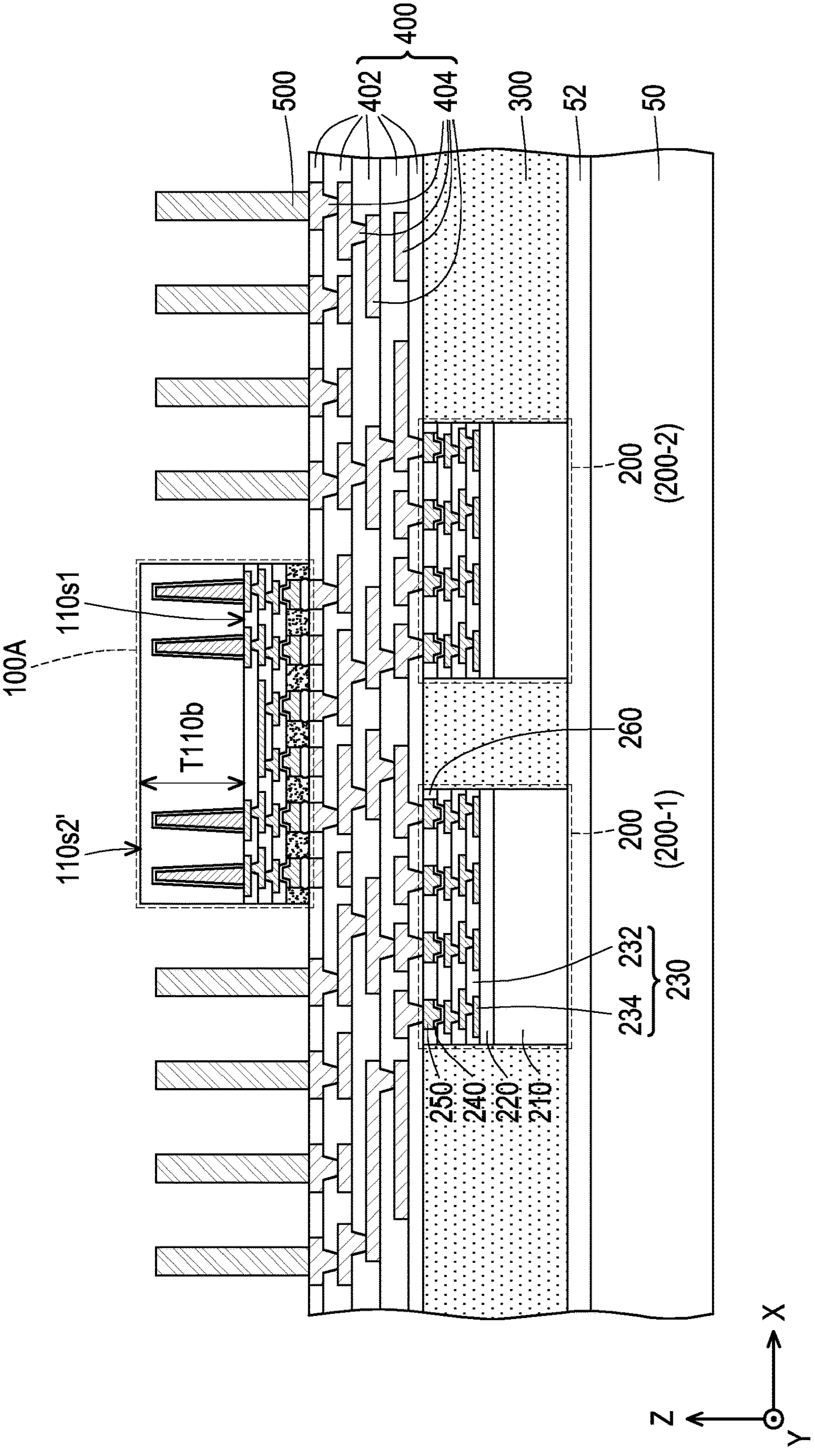

Referring to FIG. 5 and FIG. 6 together, in some embodiments, a pre-thinning process is performed on the semiconductor device 100A, e.g., on the rear surface 110*s*2 of the semiconductor substrate 110. For example, the semiconductor substrate 110 of the semiconductor device 100A is thinned to have the active surface 110*s*1 and a rear surface 110*s*2' opposite to the active surface 110*s*1 along the direction Z, where the rear surface 110*s*2' is proximate to but not accessibly revealing the liners 160 and the conductive vias 170. In some embodiments, after the pre-thinning, the semiconductor substrate 110 has a thickness T110*b* greater than or substantially equal to 100 μm, in the direction Z. For example, the thickness T110*b* of the semiconductor substrate 110 is approximately ranging from about 25 μm to 35 μm. In some embodiments, the overall thickness of the semiconductor device 100A is still greater than the thickness of the conductive pillars 500 in an insignificant amount. Alternatively, the overall thickness of the semiconductor device 100A may be less than the thickness of the conductive pillars 500 in an insignificant amount. Or alternatively, the overall thickness of the semiconductor device 100A may be substantially equal to the thickness of the conductive pillars 500. The disclosure is not limited thereto. For example, the above pre-thinning process may include a CMP process, a mechanical grinding process, the combination thereof or other suitable removal processes.

Figure 7:
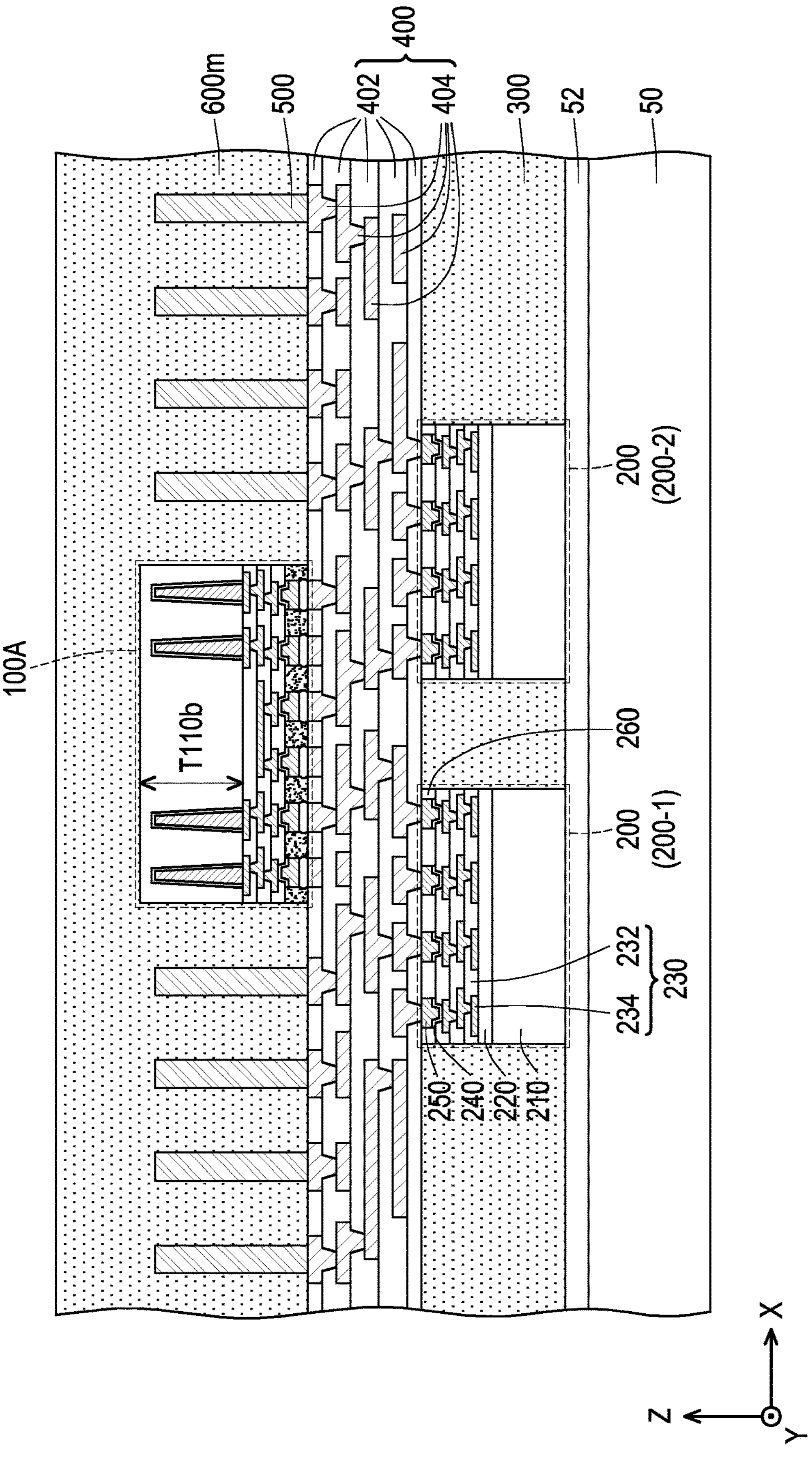

Referring to FIG. 7, in some embodiments, an encapsulation material 600*m* is formed on the redistribution circuit structure 400 to encapsulate the semiconductor device 100A and the conductive pillars 500 and further cover the redistribution circuit structure 400 exposed by the semiconductor device 100A and the conductive pillars 500. The semiconductor device 100A and the conductive pillars 500 are completely embedded in the encapsulation material 600*m*, as shown in FIG. 7, for example. The formation and material of the encapsulation material 600*m* are similar to or substantially identical to the formation and material of the encapsulation material 300*m* previously described in FIG. 4, and thus are not repeated herein. For one example, the encapsulation material 600*m* is the same as the encapsulation material 300*m*. For another example, the encapsulation material 600*m* is different from the encapsulation material 300*m*. In some embodiments, the encapsulation material 600*m* is different from the dielectric material 180*m* and the dielectric layer 180*a*. In some embodiments, a ratio of the CTE of the encapsulation material 600*m* to the CTE of the dielectric material 180*m* (or saying the dielectric layer 180*a*) is approximately ranging 25:70 to 8:15.

Referring to FIG. 7 and FIG. 8, in some embodiments, the encapsulation material 600*m* are planarized to form an insulating encapsulation 600 exposing the semiconductor device 100A and the conductive pillars. The insulating encapsulation 600 is disposed on the redistribution circuit structure 400 to laterally encapsulate the semiconductor device 100A and the conductive pillars 500, for example, as shown in FIG. 8. In some embodiments, the encapsulation material 600*m* is planarized by a mechanical grinding process, a CMP process, an etching process, and/or combinations thereof. The etching process may include a dry etching, a wet etching, or a combination thereof. In some embodiments, during the planarizing process of the encapsulation material 600*m*, the semiconductor substrate 110 and the liners 160 of the semiconductor device 100A are planarized to accessibly reveal the conductive vias 170 of the semiconductor device 100A. As shown in FIG. 8, the semiconductor substrate 110 has the active surface 110*s*1 and a rear surface 110*s*3 opposite to the active surface 110*s*1 along the direction Z, where the rear surface 110*s*3 accessibly reveals the liners 160 and the conductive vias 170. In some embodiments, after the formation of the insulating encapsulation 600, the semiconductor substrate 110 has a thickness T110 greater than or substantially equal to 25 μm, in the direction Z. For example, the thickness T110 of the semiconductor substrate 110 is approximately ranging from about 25 μm to 35 μm. In some embodiments, portions of the conductive vias 160 of the semiconductor device 100A and/or the conductive pillars 500 are slightly planarized as well. As shown in FIG. 8, a surface 600*s*1 of the insulating encapsulation 600 is substantially leveled with surfaces 160*s*2 of the liners 160, surfaces 170*s*2 of the conductive vias 170 and the rear surface 110*s*3 of the semiconductor substrate 110 of the semiconductor device 100A and surfaces 500*s*1 of the conductive pillars 500, for example. In some embodiments, the surface 600*s*1 of the insulating encapsulation 600 is substantially coplanar to the surfaces 160*s*2 of the liners 160, the surfaces 170*s*2 of the conductive vias 170 and the rear surface 110*s*3 of the semiconductor substrate 110 of the semiconductor device 100A and the surfaces 500*s*1 of the conductive pillars 500. The surfaces 160*s*2 of the liners 160, the surfaces 170*s*2 of the conductive vias 170 and the rear surface 110*s*3 of the semiconductor substrate 110 of the semiconductor device 100A together may be referred to as a back surface BS of the semiconductor device 100A. In some embodiments, the insulating encapsulation 600 encapsulates sidewalls of the semiconductor device 100A and the conductive pillars 500, where the conductive vias 170 of the semiconductor device 100A and the conductive pillars 500 are accessibly revealed by the insulating encapsulation 600.

In some embodiments, after the planarizing process, a cleaning step may be optionally performed to clean and remove the residue generated from the planarizing process. However, the disclosure is not limited thereto, and the planarizing process may be performed through any other suitable method.

Referring to FIG. 9, in some embodiments, a redistribution circuit structure 700 is formed on the insulating encapsulation 600 and is electrically coupled to the semiconductor device 100A and the conductive pillars 500, after the formation of the insulating encapsulation 600. In some embodiments, the redistribution circuit structure 700 is disposed on (e.g., in physical contact with) the surface 600*s*1 of the insulating encapsulation 600, the surfaces 500*s*1 of the conductive pillars 500, and the back surface BS of the semiconductor device 100A (e.g., the surfaces 170*s*2 of the conductive vias 170). In some embodiments, the redistribution circuit structure 700 is fabricated to electrically connect with one or more connectors underneath. Here, the aforesaid connectors may be the conductive pillars 500 and the conductive vias 170 of the semiconductor device 100A embedded in the insulating encapsulation 600. In other words, the redistribution circuit structure 700 is physically connected and electrically connected to the conductive pillars 500 and the conductive vias 170 of the semiconductor device 100A. As shown in FIG. 9, for example, the semiconductor devices 200 are electrically coupled to the redistribution circuit structure 700 through the conductive pillars 500. In alternative embodiments, the semiconductor devices 200 are electrically coupled to the redistribution circuit structure 700 through the semiconductor device 100A. The disclosure is not limited thereto.

In some embodiments, the redistribution circuit structure 700 includes a plurality of dielectric layers 702 and a plurality of metallization layers 704 stacked alternately, and the metallization layers 704 are electrically connected to the conductive pillars 500 and the conductive vias 170 of the semiconductor device 100A embedded in the insulating encapsulation 700. In such embodiments, the surfaces 500*s*1 of the conductive pillars 500 and the surfaces 170*s*2 of the conductive vias 170 of the semiconductor device 100A are in contact with a bottommost layer of the metallization layers 704 exposed by the bottommost layer of the dielectric layers 702. In some embodiments, the surfaces 500*s*1 of the conductive pillars 500 and the surfaces 170*s*2 of the conductive vias 170 of the semiconductor device 100A are partially covered by the bottommost layer of the dielectric layers 702. In addition, a plurality of seed layers may be further included in the redistribution circuit structure 700. The formation and material of the dielectric layers 702 and the metallization layers 704 of the redistribution circuit structure 700 are similar to or substantially identical to the formation and material of the dielectric layers 402 and the metallization layers 404 of the redistribution circuit structure 400 previously described in FIG. 5, thus are not repeated herein. In some embodiments, the material of the dielectric layers 702 is different from the material of the dielectric layer 180*a*.

Continued on FIG. 9, in some embodiments, after the formation of the redistribution circuit structure 700, a plurality of conductive terminals 800 are formed on the redistribution circuit structure 700. For example, the conductive terminals 800 are disposed on (e.g., in physical contact with) and electrically connected to the redistribution circuit structure 700. In some embodiments, some of the conductive terminals 800 are electrically coupled to the conductive pillars 500 through the redistribution circuit structure 700. In some embodiments, some of the conductive terminals 800 are electrically coupled to the semiconductor device 100A through the redistribution circuit structure 700. In some embodiments, some of the conductive terminals 800 are electrically coupled to the semiconductor device 200-1 through the redistribution circuit structure 700, some of the conductive pillars 500, and the redistribution circuit structure 400. In some embodiments, some of the conductive terminals 800 are electrically coupled to the semiconductor device 200-1 through the redistribution circuit structure 700, the semiconductor device 100A, and the redistribution circuit structure 400. In some embodiments, some of the conductive terminals 800 are electrically coupled to the semiconductor device 200-2 through the redistribution circuit structure 700, some of the conductive pillars 500, and the redistribution circuit structure 400. In some embodiments, some of the conductive terminals 800 are electrically coupled to the semiconductor device 200-2 through the redistribution circuit structure 700, the semiconductor device 100A, and the redistribution circuit structure 400.

Each of the conductive terminals 800 includes a conductive via 802 and a solder region 804 disposed thereon, for example. In the case, the solder regions 804 are physically connected to and electrically connected to the conductive vias 802, respectively. However, the disclosure is not limited thereto; alternatively, each of the conductive terminals 800 includes one conductive via 802 only. Or alternatively, each of the conductive terminals 800 includes one solder region 804 only. For example, the conductive vias 802 of the conductive terminals 800 includes micro-bumps, metal pillars, controlled collapse chip connection (C4) bumps (for example, which may have, but not limited to, a size of about 80 μm), a ball grid array (BGA) bumps (for example, which may have, but not limited to, a size of about 400 μm), electroless nickel-immersion gold technique (ENIG) formed bumps, electroless nickel-electroless palladium-immersion gold technique (ENEPIG) formed bumps, or the like. The disclosure is not limited thereto. The solder regions 804 include, for example, solder caps. The material of the solder regions 800 may include either eutectic solder or non-eutectic solder. The solder may include lead or be lead-free, and may include Sn—Ag, Sn—Cu, Sn—Ag—Cu, or the like. For example, the material of the solder regions 800 may include a lead-free (LF) solder material (such as Sn-base materials) with or without additional impurity (such as Ni, Bi, Sb, Ag, Cu, Au, or the like). The numbers of the conductive terminals 800 is not limited to the drawings of the embodiments, and may be selected and designated based on the demand and design requirements. The formations of the conductive vias 802 and the solder regions 804 are similar to or substantially identical to the formations of the conductive vias 140 and the solder regions 150 previously described in FIG. 3 except for the dimensions thereof, and thus are not repeated herein.

Referring to FIG. 9 and FIG. 10, in some embodiments, after the conductive terminals 800 are formed, the carrier 50 is de-bonded from the debond layer 52 carried by the carrier 50, such that the semiconductor devices 200 and the insulating encapsulation 300 are separated from the carrier 50. In embodiments where the debond layer 52 is the LTHC release layer, an UV laser irradiation may be utilized to facilitate peeling of the semiconductor devices 200 and the insulating encapsulation 300 from the carrier 50. In certain embodiments, the semiconductor devices 200 (e.g., the back surfaces BS) and the insulating encapsulation 300 (e.g., a surface 300$s$2 opposing to the surface 300$s$1 in the direction Z) are exposed, as show in FIG. 10. As shown in FIG. 10, for example, the surface 300$s$2 of the insulating encapsulation 300 is substantially level with the back surfaces BS of the semiconductor devices 200. In the case, the surface 300$s$2 of the insulating encapsulation 300 is substantially coplanar to the back surfaces BS of the semiconductor devices 200.

In some embodiments, before debonding the carrier 50 and the debond layer 52, a dicing (singulation) process is performed to cut a plurality of the package structures PS1 interconnected therebetween into individual and separated package structures PS1. In one embodiment, the dicing (singulation) process is a wafer dicing process including mechanical blade sawing or laser cutting. The disclosure is not limited thereto. Up to here, the manufacture of the package structure PS1 is completed. In some embodiments, a height of the conductive pillars 500 is approximately ranging from 80 μm to 100 μm as measured in the direction Z, although other suitable thickness may alternatively be utilized.

In some embodiments, prior to debonding the debond layer 52 and the carrier 50, the whole structure depicted in FIG. 9 along with the carrier 50 may be flipped (turned upside down), where the conductive terminals 800 are placed to a holding device (not shown) for securing the package structures PS1 before debonding the carrier 50 and the debond layer 52, and the carrier 50 is then debonded from the semiconductor devices 200 and the insulating encapsulation 300. In some embodiments, the holding device may include a polymer film, and the conductive terminals 80 are mounted into the polymer film. For example, the material of the polymer film may include a polymer film having sufficient elasticity to allow the conductive terminals 80 being embedded therein. In certain embodiments, the holding device may be a parafilm or a film made of other suitable soft polymer materials or the like. In an alternative embodiment, the holding device may be an adhesive tape, a carrier film or a suction pad. The disclosure is not limited thereto.

As shown in FIG. 10 and FIG. 11, in the package structure PS1, the semiconductor device 100A is mounted to and electrically connected to the redistribution circuit structure 400, where the sidewall 180$a$SW of the dielectric layer 180$a$ is substantially vertical, for example. In some embodiments, the sidewall 110SW of the semiconductor substrate 110, the sidewall 120SW of the interconnect structure 120, and the sidewall 180$a$SW of the dielectric layer 180$a$ are substantially aligned to each other, as shown in FIG. 11. In other words, the sidewall of the semiconductor device 100A included in the package structure PS1 is a substantially vertical sidewall. However, the disclosure is not limited thereto; alternatively, the sidewall of the semiconductor device 100A included in the package structure PS1 may be a curved sidewall. For a non-limiting example, as shown in FIG. 12, the sidewall 180$a$SW of the dielectric layer 180$a$ is curved (e.g., non-planar). For example, after the semiconductor device 100A is mounted to and electrically connected to the redistribution circuit structure 400, the dielectric layer 180$a$ further includes an extended portion 180$ap$, where the sidewall 180$a$SW of the dielectric layer 180$a$ is protruding out of the sidewall 110SW of the semiconductor substrate 110 and the sidewall 120SW of the interconnect structure 120 with a lateral size W1, as shown in FIG. 12. In such case, a ratio of a thickness T1 (of the dielectric layer 180*a* overlapping with the interconnection 120) to the lateral size W1 (of the extending portion 180*ap*) is approximately ranging from 1:1 to 1:4.

In alternative embodiments of which the topmost layer of the dielectric layers 402 of the redistribution circuit structure 400 is omitted and after the semiconductor device 100A is mounted to the redistribution circuit structure 400, the dielectric layer 180*a* of the semiconductor device 100A may further extend onto and laterally cover the sidewall of the topmost layer of the metallization layers 404 being exposed from the dielectric layers 402 of the redistribution circuit structure 400, where the sidewall 180*a*SW of the dielectric layer 180*a* may be substantially vertical, for example, as shown in FIG. 13. In some embodiments, the sidewall 110SW of the semiconductor substrate 110, the sidewall 120SW of the interconnect structure 120, and the sidewall 180*a*SW of the dielectric layer 180*a* are substantially aligned to each other, as shown in FIG. 13. In other words, the sidewall of the semiconductor device 100A included in the package structure is a substantially vertical sidewall. However, the disclosure is not limited thereto; in further alternative embodiments of which the topmost layer of the dielectric layers 402 of the redistribution circuit structure 400 is omitted and after the semiconductor device 100A is mounted to the redistribution circuit structure 400, the dielectric layer 180*a* of the semiconductor device 100A may further extend onto and laterally cover the sidewall of the topmost layer of the metallization layers 404 being exposed from the dielectric layers 402 of the redistribution circuit structure 400, where the sidewall 180*a*SW of the dielectric layer 180*a* may be substantially curved (e.g., non-planar), for example, as shown in FIG. 14. In some embodiments, after the semiconductor device 100A is mounted to and electrically connected to the redistribution circuit structure 400, the dielectric layer 180*a* further includes an extended portion 180*ap*, where the sidewall 180*a*SW of the dielectric layer 180*a* is protruding out of the sidewall 110SW of the semiconductor substrate 110 and the sidewall 120SW of the interconnect structure 120 with the lateral size W1, as shown in FIG. 14. In such case, the ratio of the thickness T1 (of the dielectric layer 180*a* overlapping with the interconnection 120) to the lateral size W1 (of the extending portion 180*ap*) is approximately ranging from 1:1 to 1:4.

Figure 16:
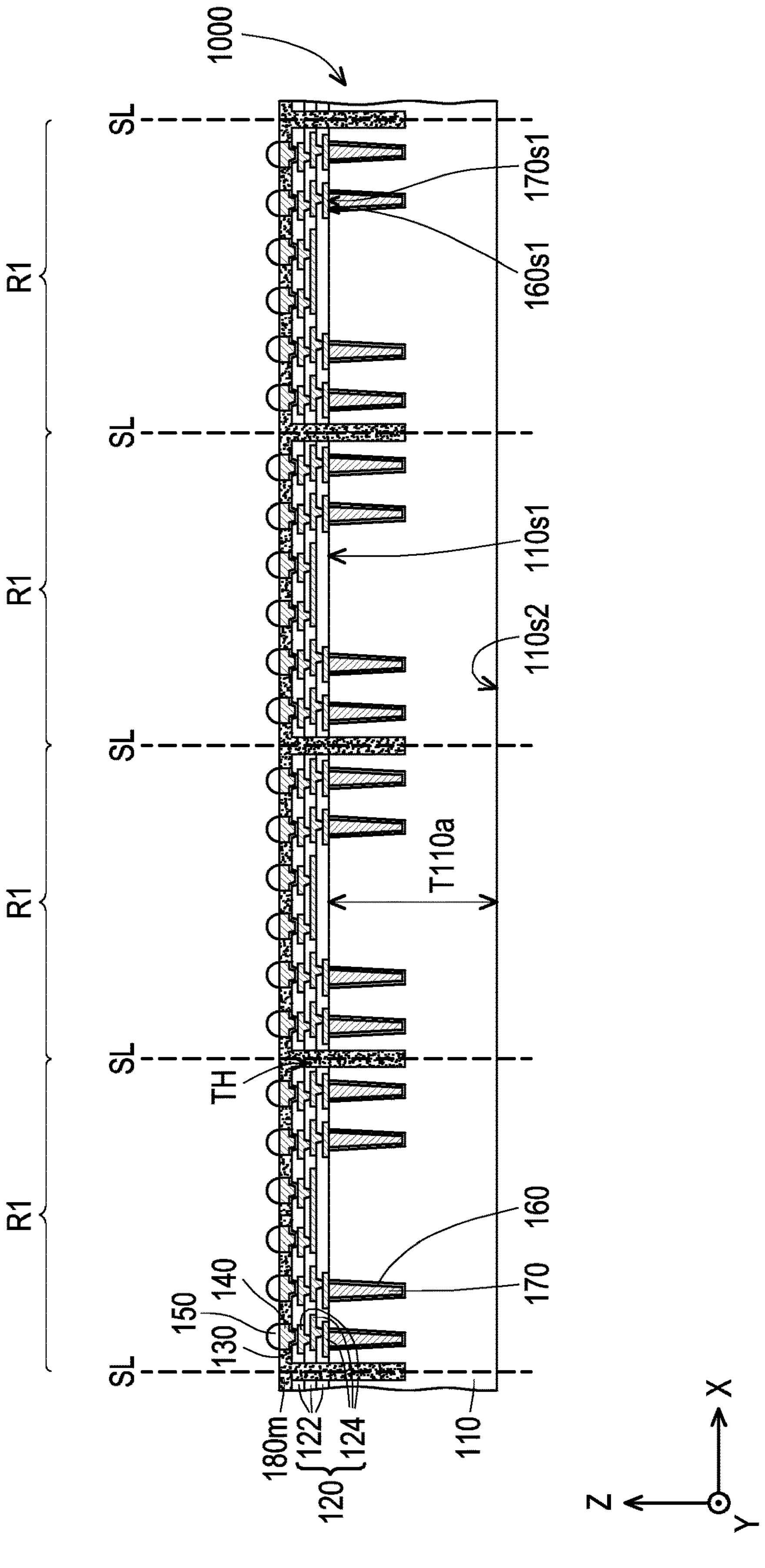
Figure 17:
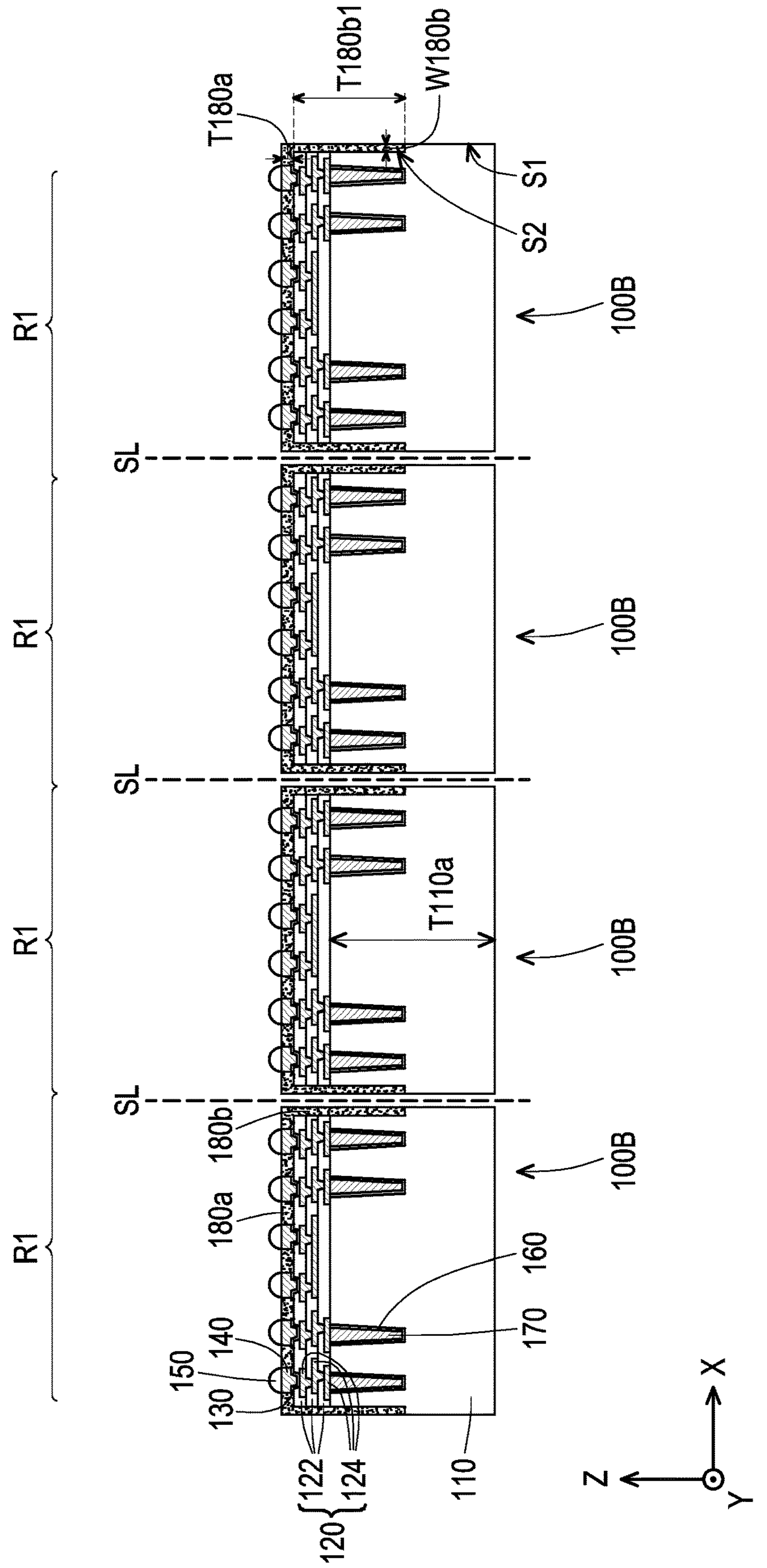
Figure 18:
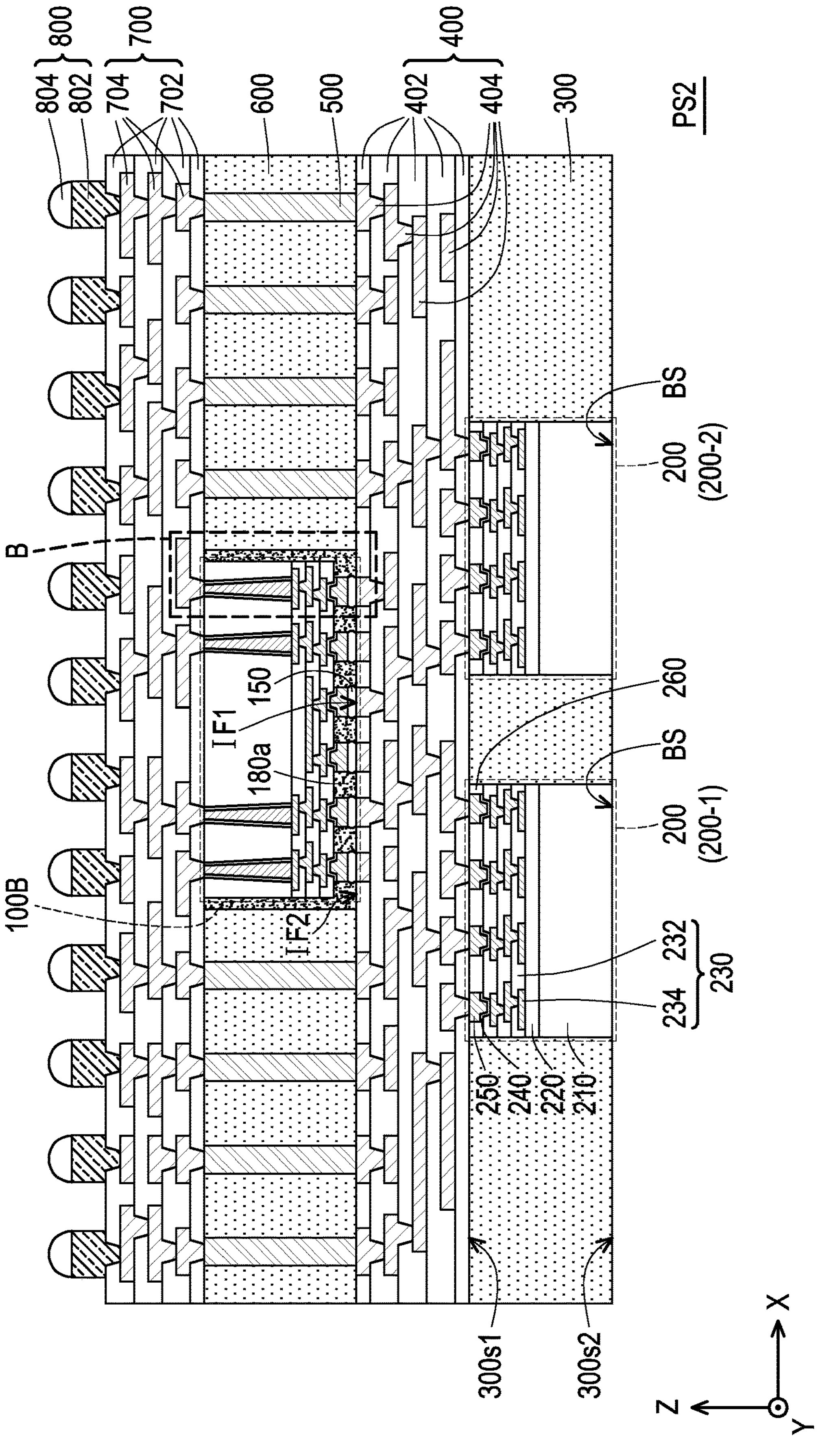
Figure 20:
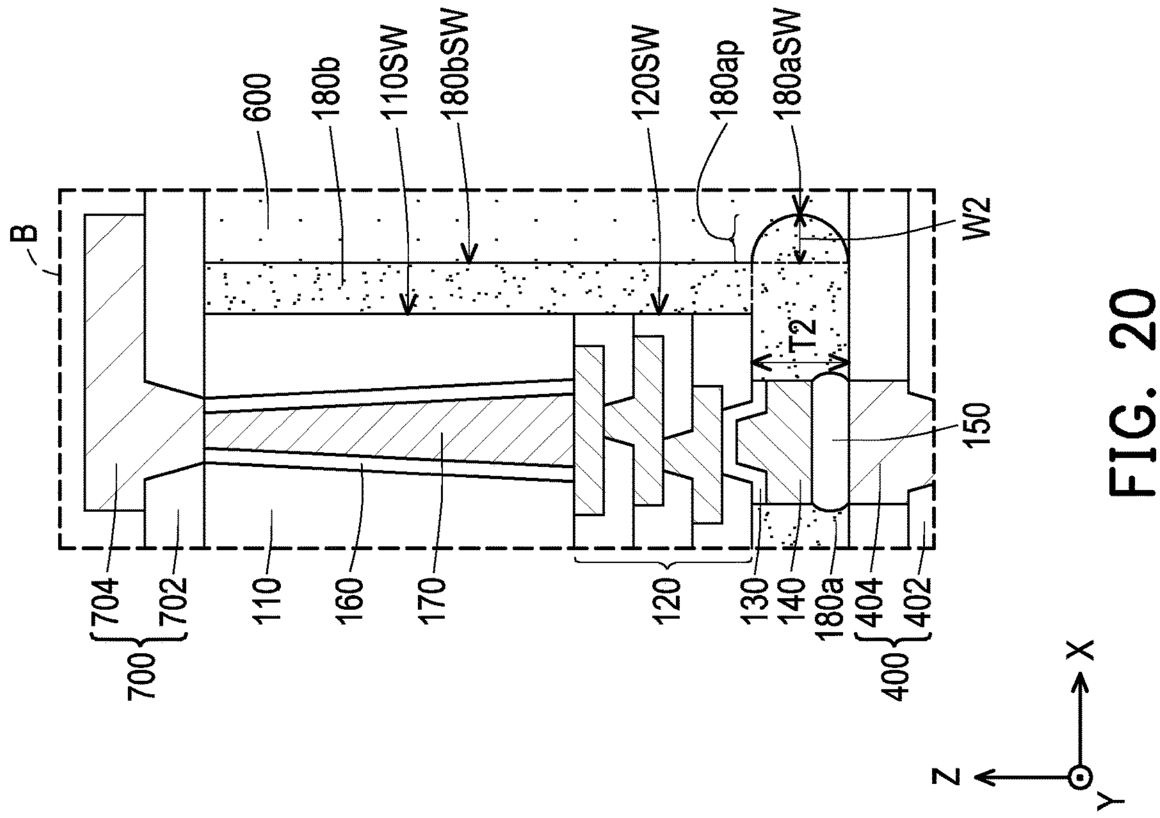
FIG. 20 through FIG. 22 are schematic cross-sectional views respectively showing various configurations of bonding between a semiconductor device and a redistribution circuit structure included in a package structure in accordance with alternative embodiments of the disclosure.
Figure 19:
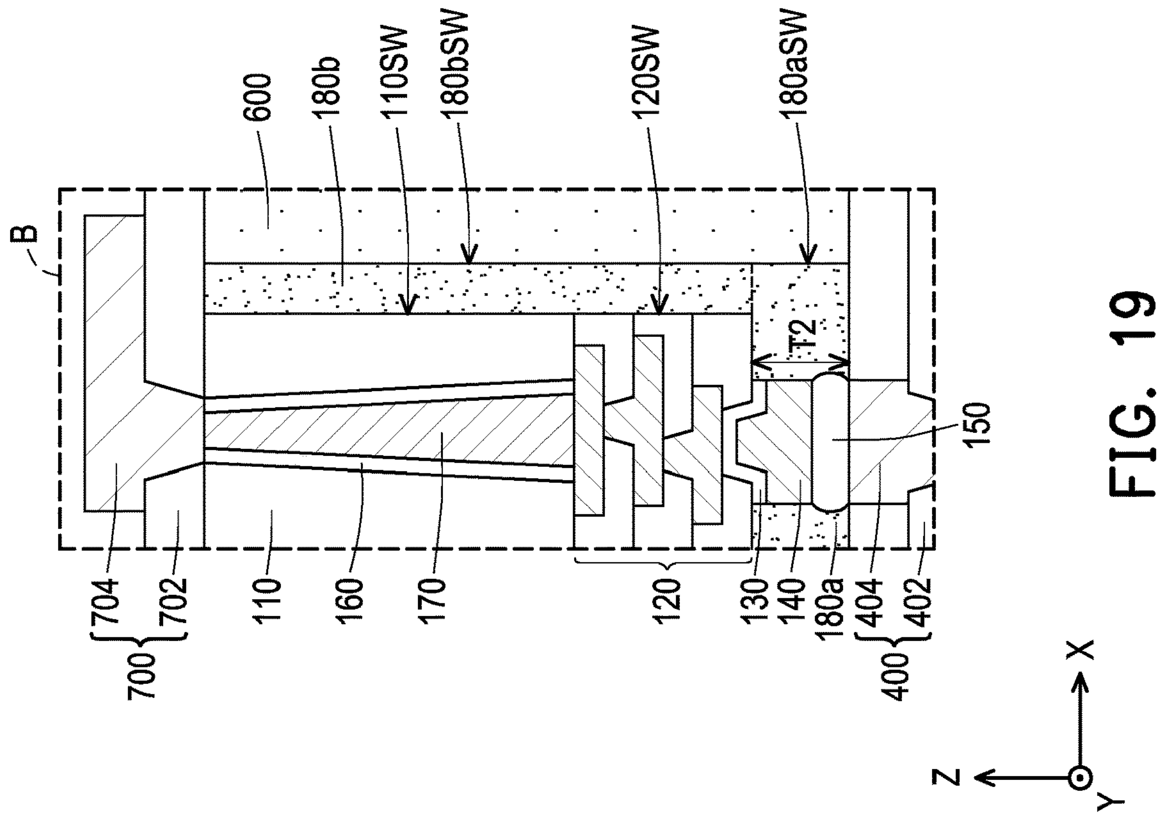
FIG. 19 is an enlarged and schematic cross-sectional view showing a configuration of bonding between a semiconductor device and a redistribution circuit structure included in the package structure depicted in FIG. 18.
Figure 22:
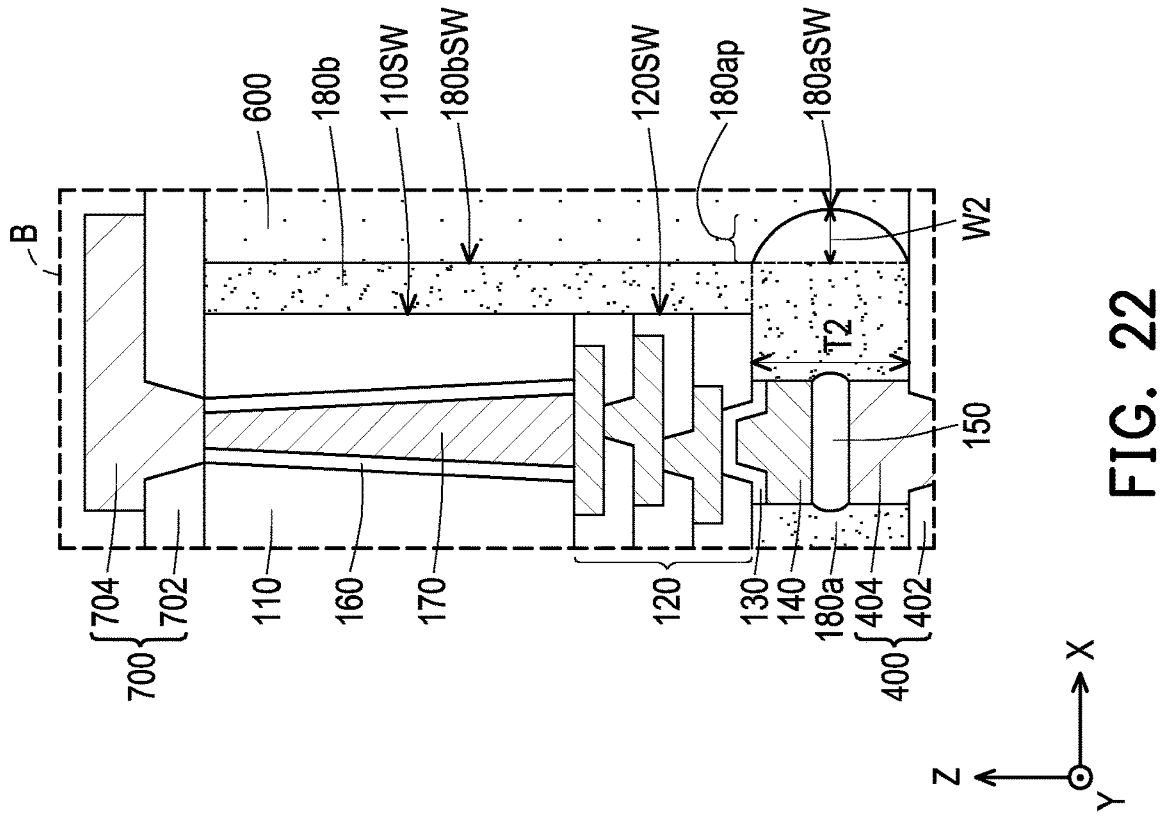
Figure 21:
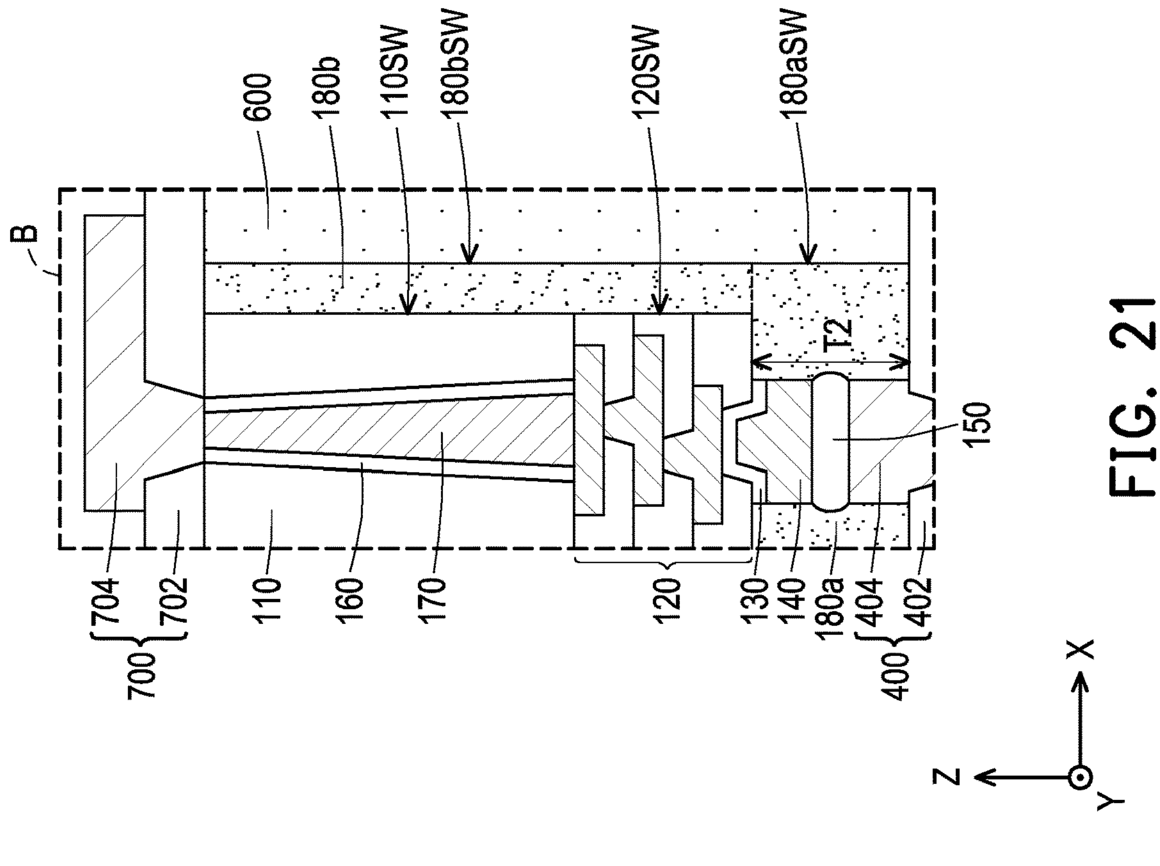

FIG. 15 to FIG. 18 are schematic views of various stages in a manufacturing method of a package structure PS2 in accordance with some embodiments of the disclosure. FIG. 19 is an enlarged and schematic cross-sectional view showing a configuration of bonding between a semiconductor device and a redistribution circuit structure included in the package structure PS2 depicted in FIG. 18. FIG. 20 through FIG. 22 are schematic cross-sectional views respectively showing various configurations of bonding between a semiconductor device and a redistribution circuit structure included in a package structure in accordance with alternative embodiments of the disclosure. In some embodiments, the enlarged and schematic cross-sectional views of FIG. 19 through FIG. 22 are outlined in a dashed box B as shown in FIG. 18. The elements similar to or substantially the same as the elements described above will use the same reference numbers, and certain details or descriptions of the same elements (e.g., the formations and materials) and the relationship thereof (e.g., the relative positioning configuration and electrical connection) will not be repeated herein.

Figure 15:
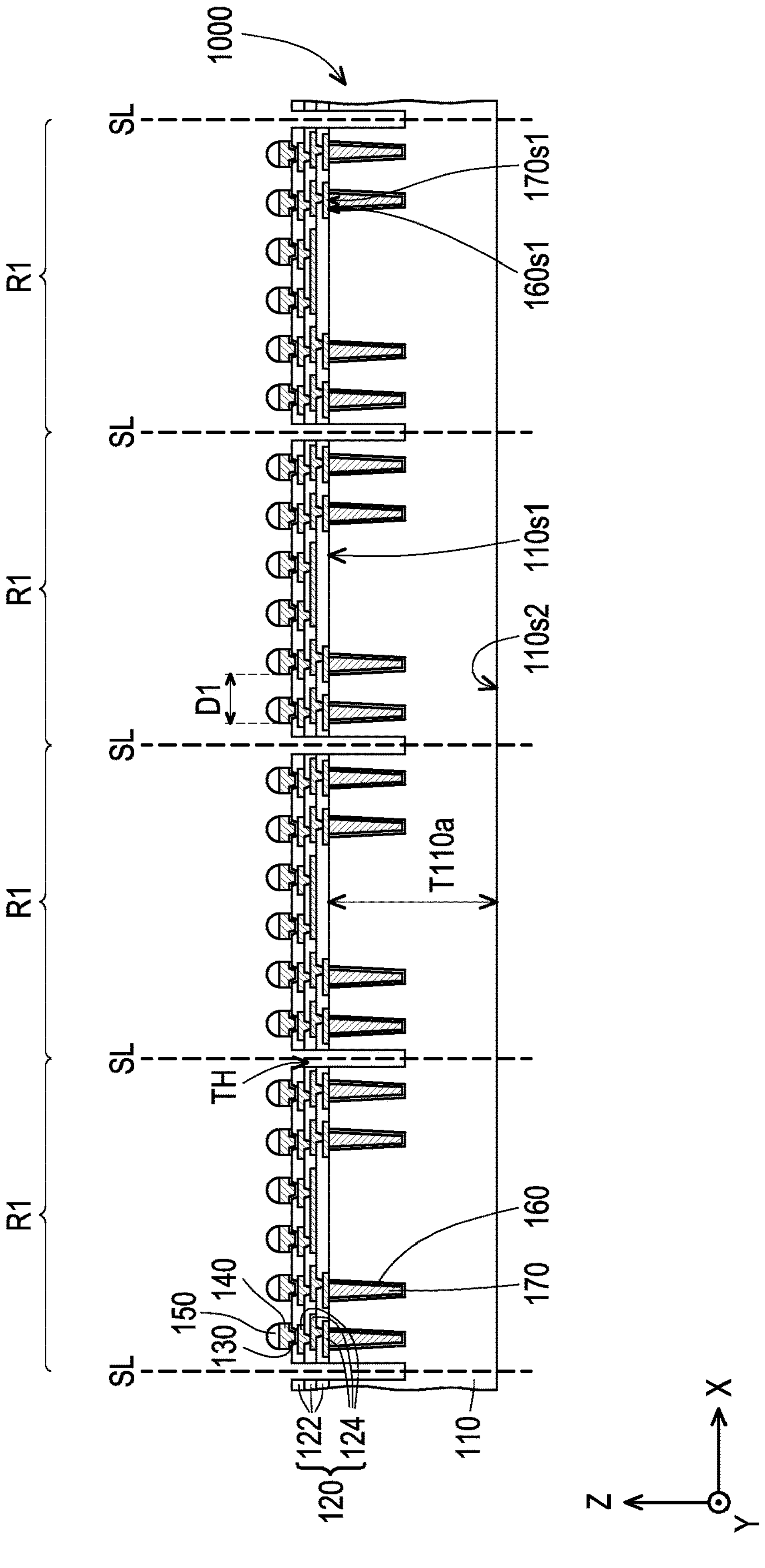
FIG. 15 to FIG. 18 are schematic views of various stages in a manufacturing method of a package structure in accordance with some embodiments of the disclosure.

Referring to FIG. 15, in some embodiments, a wafer 1000 is provided. The details of the wafer 1000 have been described in FIG. 1, and thus are not repeated herein. In some embodiments, a pre-cutting process (or step) is performed along the scribe lines SL of the wafer 1000, such that a plurality of trenches TH are formed on a front surface of the wafer 1000 and penetrate through the interconnect structure 120 and partially penetrate through the semiconductor substrate 110. In some embodiments, the pre-cutting process is performed by a mechanical cutting process with a blade. That is to say, the pre-cutting process is a contact cutting process. For example, as shown in FIG. 15, illustrated bottom surfaces of the trenches TH is below illustrated bottom ends of the liners 160 and conductive vias 170. Alternatively, the illustrated bottom surfaces of the trenches TH is substantially being coplanar to the illustrated bottom surface of the conductive vias 170. In some embodiments, each of the trenches TH has a planar sidewall. As shown in FIG. 15, the sidewalls of the trenches TH are substantially vertical, planar sidewalls. However, the disclosure is not limited thereto; alternatively, the sidewalls of the trenches TH may be substantially slant, planar sidewalls. In some embodiments, each of the trenches TH has a curved bottom surface. As shown in FIG. 15, the bottom surfaces of the trenches TH are convex surfaces in respect with a plane where the rear surface 110*s*2 located at. However, the disclosure is not limited thereto; alternatively, the bottom surfaces of the trenches TH may be substantially flat with a rounded corner connecting to the sidewalls thereof.

Before the pre-cutting process, the wafer 1000 is placed onto a holding device (not shown), in some embodiments. The rear surface 110*s*2 of the semiconductor substrate 110 of the wafer 1000 is attached to the holding device, so that the wafer 1000 is secured in place during the pre-cutting process. For example, the holding device may be an adhesive tape, a carrier film or a suction pad. The disclosure is not limited thereto.

Referring to FIG. 16, in some embodiments, a dielectric material 180*m* is formed on the wafer 1000 to fill the trenches TH. For example, the dielectric material 180*m* is disposed on (e.g., in physical contact with) the interconnect structure 120 (the sidewall exposed by the trenches and the illustrated top surface exposed by the conductive vias 140 and the solder regions 150) and laterally covers the conductive pads 130 and the conductive vias 140. In such case, the solder regions 150 are free from the dielectric material 180*m* and the trenches TH are filled with the dielectric material 180*m*, as shown in FIG. 16. Alternatively, the dielectric material 180*m* may further partially cover the solder regions 150, where the solder regions 150 may still be accessibly revealed by the dielectric material 180*m*. For example, the dielectric material 180*m* is formed on the wafer 1000 by compression molding process or like. However, the disclosure is not limited thereto. The details of the dielectric material 180*m* have been described in FIG. 2, and thus are not repeated herein for brevity.

Referring to FIG. 16 and FIG. 17 together, in some embodiments, a dicing (or singulation) process is sequentially performed on the trenches TH along the scribe lines SL to cut through the dielectric material 180*m*, the interconnect structure 120 and the semiconductor substrate 110, thereby forming individual and separated semiconductor devices 100B corresponding to the device regions R1, where each of the semiconductor devices 100B includes the semiconductor substrate 110, the interconnect structure 120, the conductive pads 130, the conductive vias 140, the solder regions 150, the liners 160, the conductive vias 170, and dielectric layers 180*a*, 180*b*. In such case, the dielectric material 180*m* is diced into a plurality of discrete segments each including one dielectric layer 180*a* (also referred to as a horizontal dielectric layer over an illustrated top surface of the interconnect structure 120) and two dielectric layer 180*b* (also referred to a vertical dielectric layer below the illustrated top surface of the interconnect structure 120) included in the individual and separated semiconductor devices 100B corresponding to the device regions R1, where the dielectric layers 180*b* are respectively connected to two opposite ends of a surface of the dielectric layer 180*a*. In other words, the dielectric layers 180*a* and 180*b* are integrally formed. The dielectric layers 180*a* and 180*b* may be referred to as an organic dielectric layer of the semiconductor devices 100B. The details of the dielectric layers 180*a* and 180*b* are similar to or substantially identical to the details of the dielectric material 180*m* previously described in FIG. 2, and thus are not repeated therein.

In some embodiments, a thickness T180*a* (along the direction Z) of the dielectric layer 180*a* is approximately from 3 μm to 15 μm, although other suitable thickness may alternatively be utilized. In some embodiments, a thickness T180*b*1 (along the direction Z) of the dielectric layer 180*b* is approximately from 30 μm to 50 μm, although other suitable thickness may alternatively be utilized. In some embodiments, a width W180*b* of the dielectric layer 180*b* is approximately from 15 μm to 35 μm, although other suitable thickness may alternatively be utilized. In one embodiment, the dicing (or singulation) process is a wafer dicing process including mechanical blade sawing or laser cutting. The disclosure is not limited thereto.

As shown in FIG. 17, for each semiconductor device 100B, the semiconductor substrate 110 has a sidewall of step-form which having an first sidewall S1 and a second sidewall S2 indented from the first sidewall S1, where the first sidewall S1 is substantially aligned with the sidewall of the dielectric layer 180*a* and the sidewall of the dielectric layer 180*b*, the second sidewall S2 is substantially aligned with the sidewall of the interconnect structure 120, and the dielectric layer 180*b* covers the second sidewall S2 and the interconnect structure 120, for example. In the disclose, for each semiconductor device 100B, the sidewall of the dielectric layer 180*a*, the sidewall of the dielectric layer 180*b* and the sidewall (e.g., S1) of the semiconductor substrate 110 together constitute a sidewall of the semiconductor device 100B. In such case, the sidewall of the semiconductor device 100B is a substantially vertical sidewall. In some embodiments, each of the semiconductor devices 100B is referred to as a bridge device, a bridge die, a bridge chip, or a bridge that providing electrical communication between two or more than two other semiconductor devices (or dies/chips) in the package structure PS2.

Referring to FIG. 18, in some embodiments, the processes of FIG. 4 through FIG. 10 are performed using the semiconductor device 100B to form the package structure PS2. In some embodiments, the package structure PS2 includes two or more than two semiconductor devices 200, an insulating encapsulation 300, a redistribution circuit structure 400, a semiconductor device 100B, a plurality of conductive pillars 500, an insulating encapsulation 600, a redistribution circuit structure 700, and a plurality of conductive terminals 800. The details of the semiconductor devices 200, the insulating encapsulation 300, the redistribution circuit structure 400, the plurality of conductive pillars 500, the insulating encapsulation 600, the redistribution circuit structure 700, and the plurality of conductive terminals 800 have been previously described in FIG. 4 through FIG. 10, and the details of the semiconductor device 100B have been previously described in FIG. 15 through FIG. 17, and thus are not repeated herein. For example, the semiconductor devices 200 are laterally encapsulated in the insulating encapsulation 300, where the bottom surfaces BS of the semiconductor devices 200 are accessibly revealed by the insulating encapsulation 300. In some embodiments, the redistribution circuit structure 400 is electrically connected to the semiconductor devices 200 through the metallization layers 404 embedded in the dielectric layers 402. In the case, the semiconductor device 100B is bonded to and electrically connected to the redistribution circuit structure 400 by connecting the conductive vias 140, through the solder regions 150, to the topmost layer of the metallization layers 404 of the redistribution circuit structure 400, where the semiconductor devices 200 are electrically communicated with each other through the semiconductor device 100B. In some embodiments, the conductive pillars 500 are standing on and electrically connected to the redistribution circuit structure 400, and are arranged next to the semiconductor device 100B. For example, some of the conductive pillars 500 are electrically coupled to the semiconductor device 200-1 through the redistribution circuit structure 400, and some of the conductive pillars 500 are electrically coupled to the semiconductor device 200-2 through the redistribution circuit structure 400. Additionally, some of conductive pillars 500 may be electrically coupled to the semiconductor device 100B through the redistribution circuit structure 400. In some embodiments, the conductive pillars 500 and the semiconductor device 100B are laterally encapsulated in the insulating encapsulation 600. In some embodiments, the redistribution circuit structure 700 is disposed over and electrically connected to the conductive pillars 500 and the semiconductor device 100B, and the conductive terminals 800 are disposed on and electrically connected to the redistribution circuit structure 700. For example, the redistribution circuit structure 700 is disposed between the conductive terminals 800 and the insulating encapsulation 600. In some embodiments, some of the conductive terminals 800 are electrically coupled to the semiconductor device 200-1 through the redistribution circuit structure 700, some of the conductive pillars 500, and the redistribution circuit structure 400. In some embodiments, some of the conductive terminals 800 are electrically coupled to the semiconductor device 200-2 through the redistribution circuit structure 700, some of the conductive pillars 500, and the redistribution circuit structure 400. In some embodiments, some of the conductive terminals 800 are electrically coupled to the semiconductor device 100B through the redistribution circuit structure 700 and some of the conductive pillars 500. In some embodiments, the materials of the dielectric layers 402, 702 are different from the material of the dielectric layer 180*a*. Due to the dielectric layer 180*a*, the CTE mismatch is greatly suppressed. In addition, owing to the dielectric layer 180*b*, the adhesion between the semiconductor device 100B and the insulating encapsulation 600 is further improved. Therefore, the reliability of the package structure PS2 is ensured.

As shown in FIG. 18 and FIG. 19, for example, the semiconductor device 100B includes a substantially vertical sidewall including a substantially vertical sidewall 180*a*SW of the dielectric layer 180*a* and a substantially vertical sidewall 180*b*SW of the dielectric layer 180*b*, where a portion of the semiconductor substrate 110 (correspondingly having the first sidewall S1) included in the semiconductor devices 100B has been removed during performing the process of FIG. 5, so to accessibly reveal the conductive vias 170 for further electrical connections (e.g., being electrically connected to the redistribution circuit structure 700). In some cases, a portion of the semiconductor substrate 110

(correspondingly having the first sidewall S2) included in the semiconductor devices 100B, the liners 160, and/or the conductive vias 170 have been partially removed as well.

In some alternative embodiments, the semiconductor device 100B may include a curved sidewall including a curved sidewall 180*a*SW of the dielectric layer 180*a* and a substantially vertical sidewall 180*b*SW of the dielectric layer 180*b*, as shown in FIG. 20. For example, after the semiconductor device 100B is mounted to and electrically connected to the redistribution circuit structure 400, the dielectric layer 180*a* further includes an extended portion 180*ap*, where the sidewall 180*a*SW of the dielectric layer 180*a* is protruding out of the sidewall 180*b*SW of the dielectric layer 180*b* with a lateral size W2, as shown in FIG. 20. In such case, a ratio of a thickness T2 of the dielectric layer 180*a* to the lateral size W2 of the extending portion 180*ap* is approximately ranging from 1:1 to 1:4.

However, the disclosure is not limited thereto; alternatively, when the topmost layer of the dielectric layers 402 of the redistribution circuit structure 400 is omitted and after the semiconductor device 100B is mounted to the redistribution circuit structure 400, the dielectric layer 180*a* of the semiconductor device 100A may further extend onto and laterally cover the sidewall of the topmost layer of the metallization layers 404 being exposed from the dielectric layers 402 of the redistribution circuit structure 400. In one non-limiting example, the sidewall 180*a*SW of the dielectric layer 180*a* may be substantially vertical, where the sidewall (including 180*a*SW and 180*b*SW) of the semiconductor device 100B is substantially vertical, for example, as shown in FIG. 21. In other non-limiting example, the sidewall 180*a*SW of the dielectric layer 180*a* may be substantially curved as being protruding away from the sidewall 180*b*SW of the dielectric layer 180*b* (e.g., by the lateral size W2), where the sidewall (including 180*a*SW and 180*b*SW) of the semiconductor device 100B is curved, for example, as shown in FIG. 22.

Figure 25:
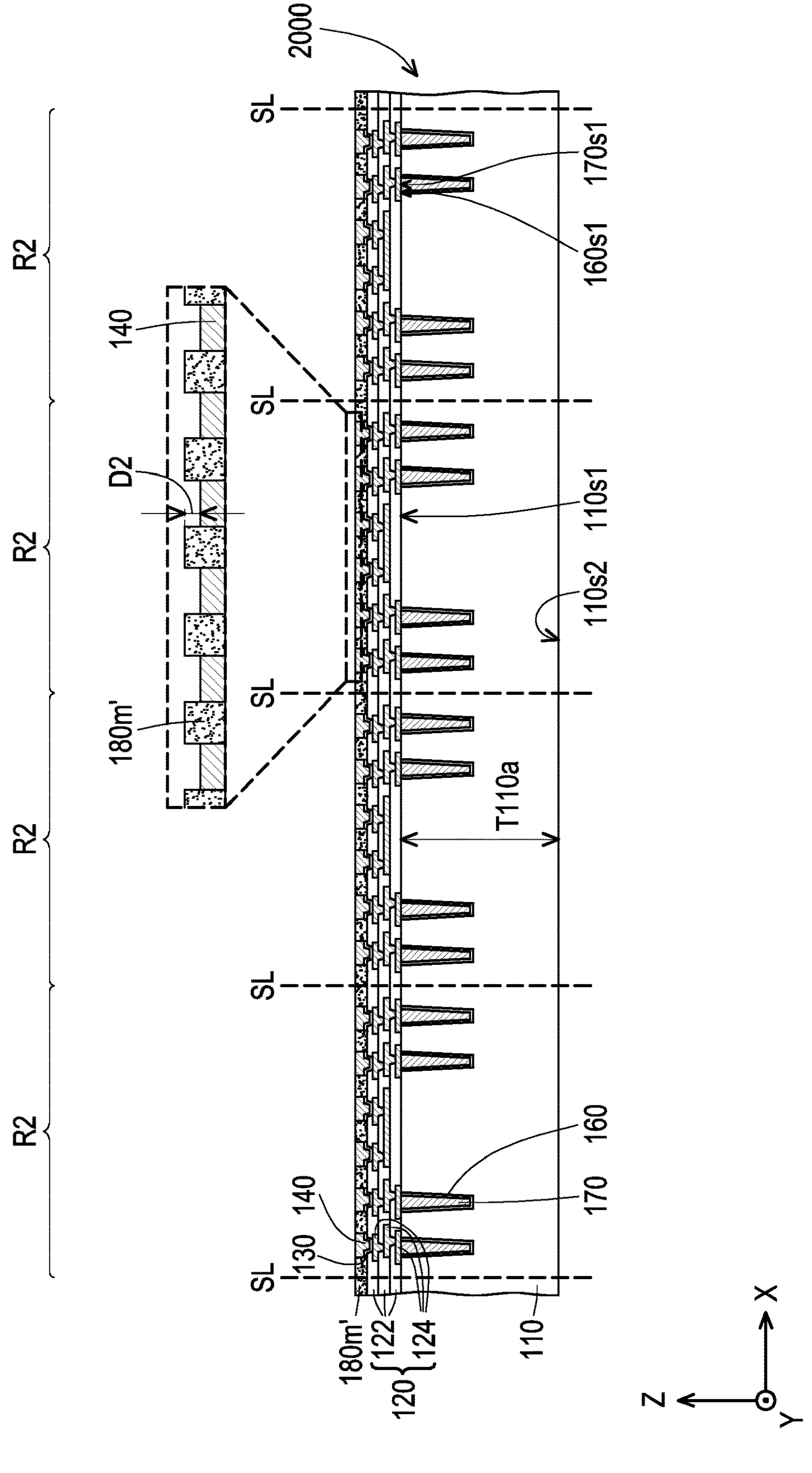
Figure 26:
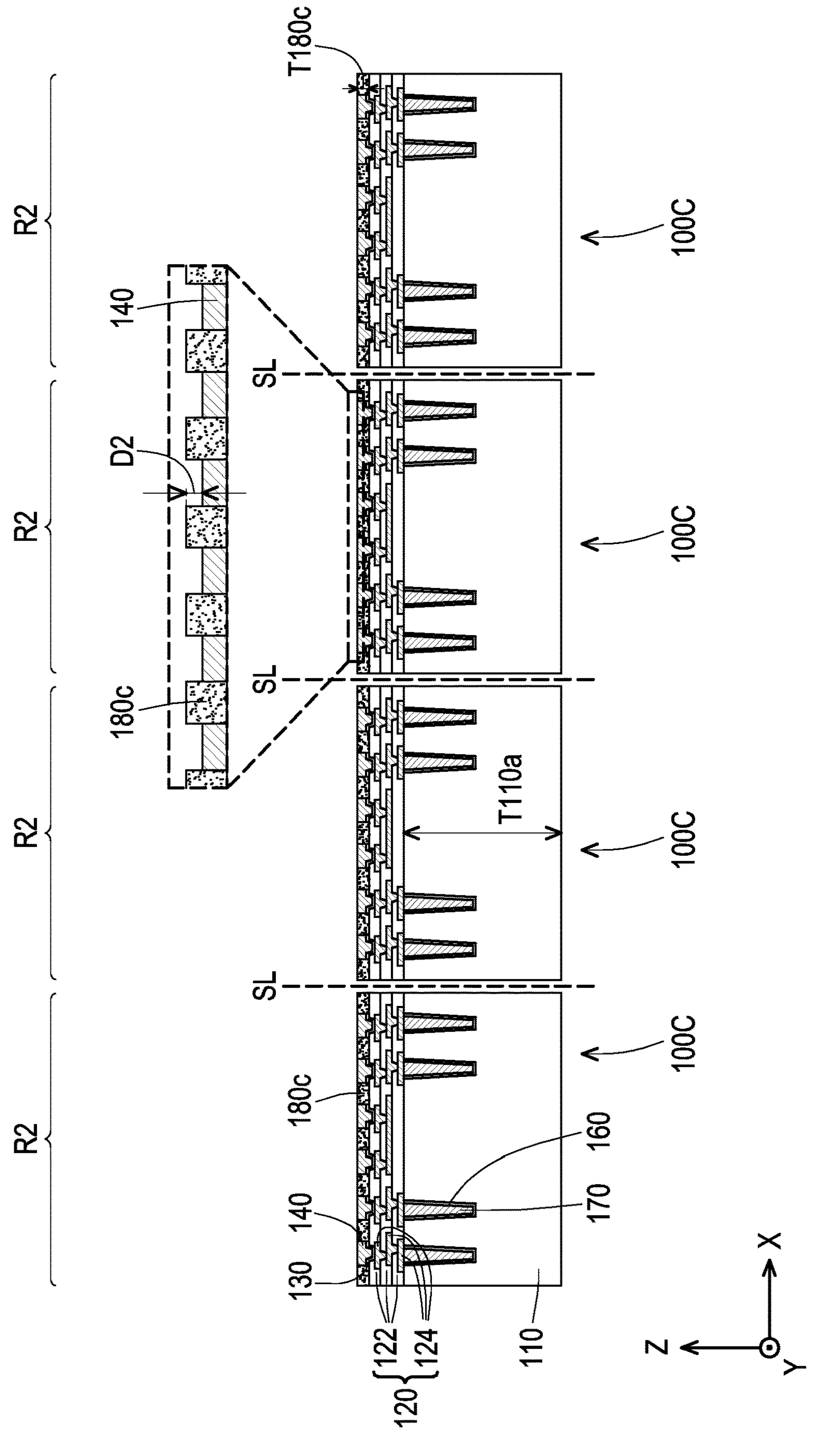
Figure 27:
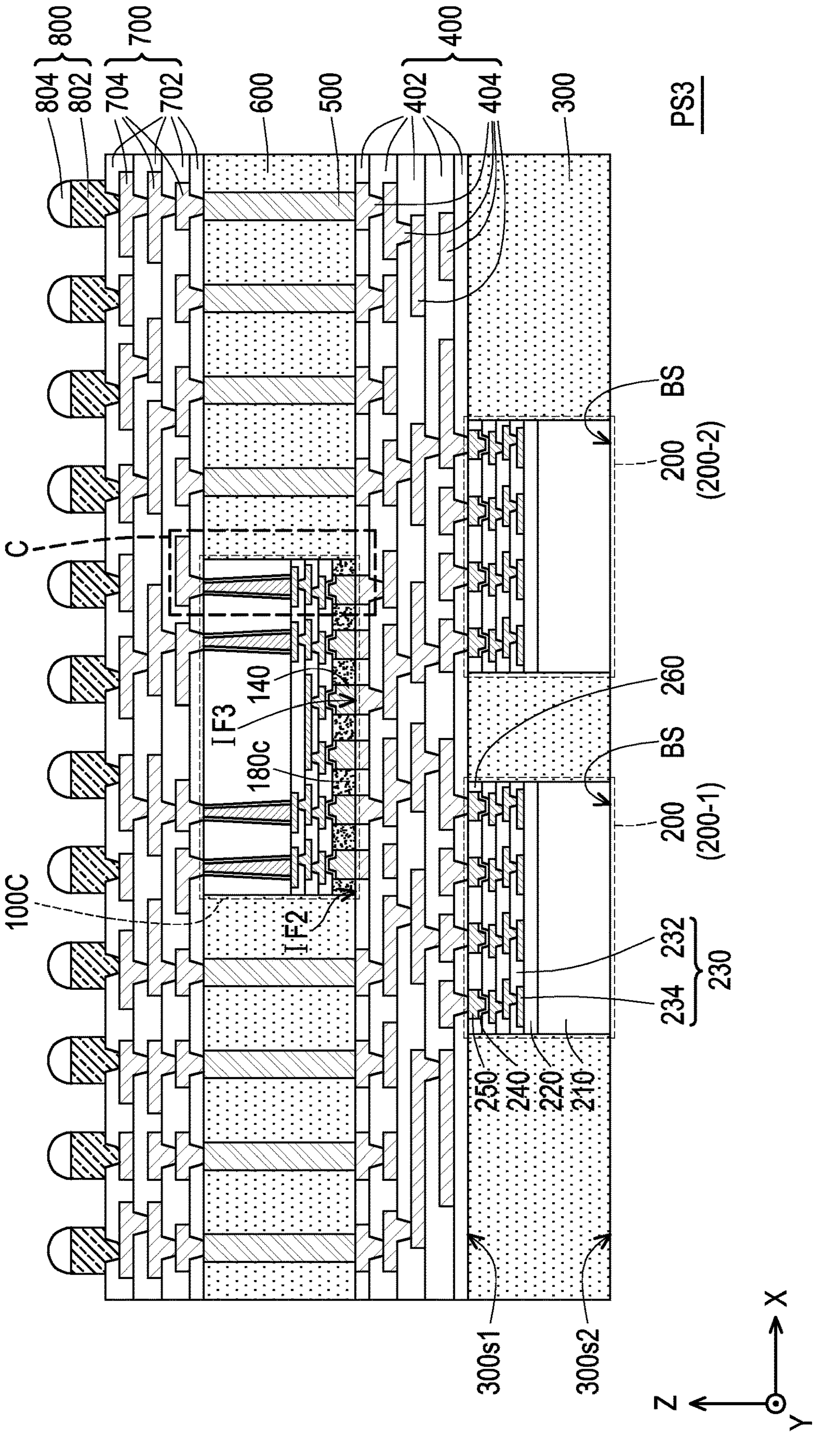
Figure 29:
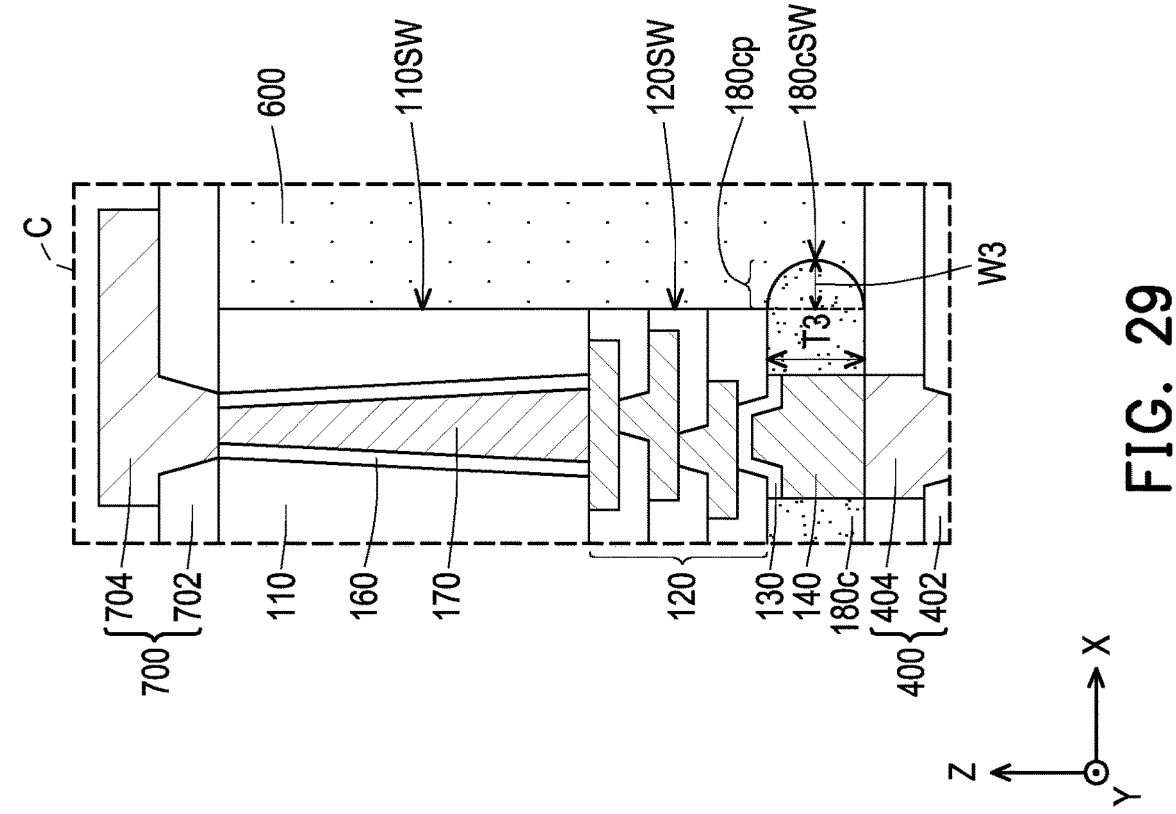
FIG. 29 through FIG. 31 are schematic cross-sectional views respectively showing various configurations of bonding between a semiconductor device and a redistribution circuit structure included in a package structure in accordance with alternative embodiments of the disclosure.
Figure 28:
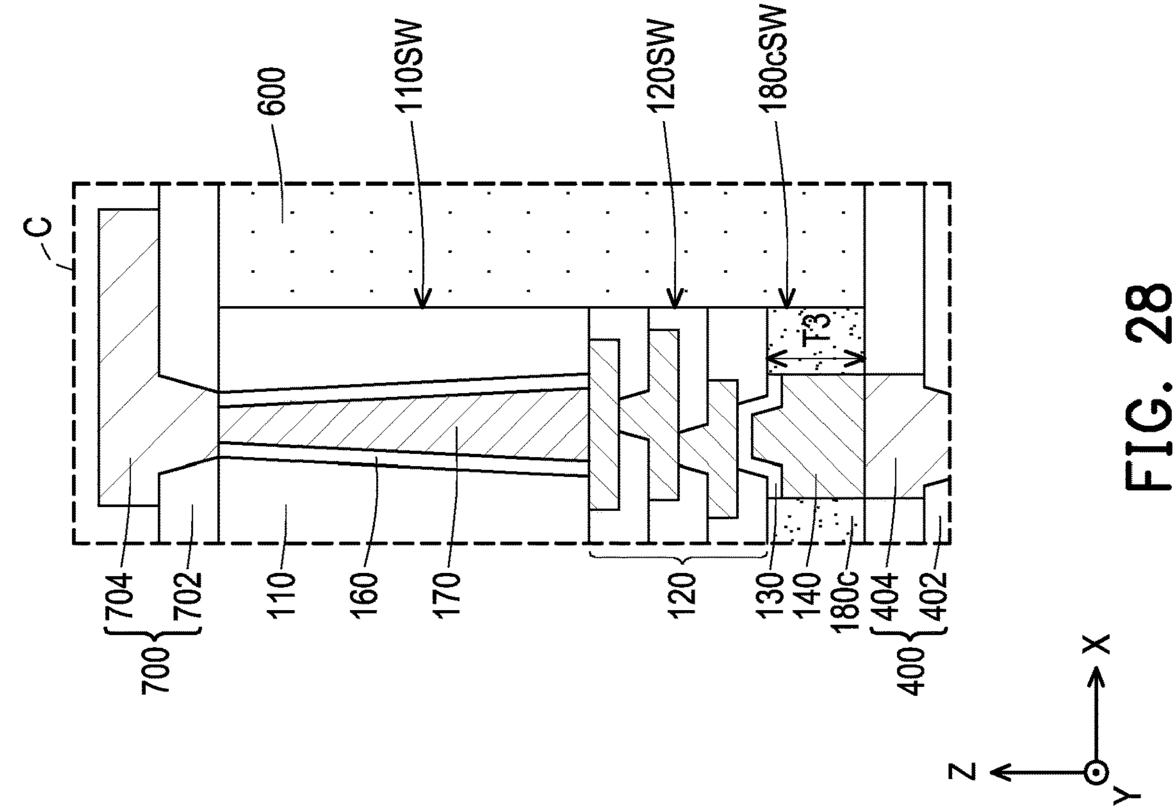
FIG. 28 is an enlarged and schematic cross-sectional view showing a configuration of bonding between a semiconductor device and a redistribution circuit structure included in the package structure depicted in FIG. 27.
Figure 31:
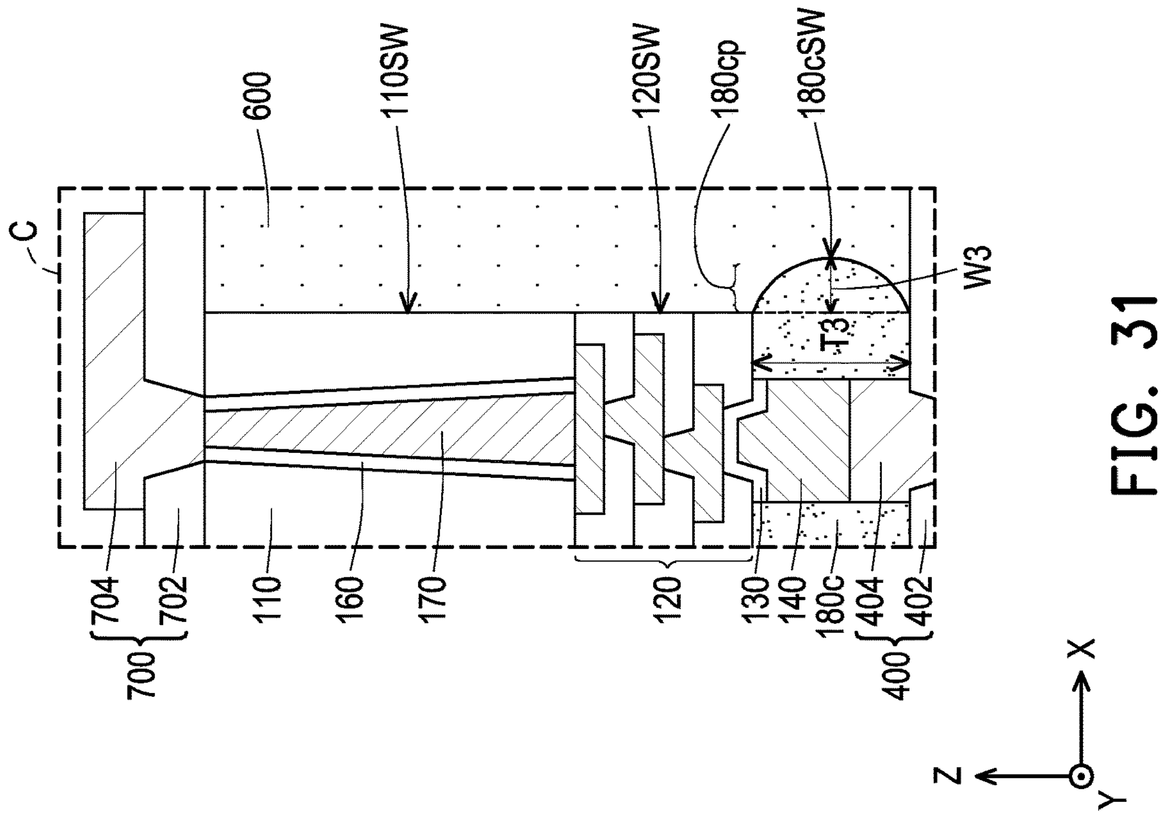
Figure 30:
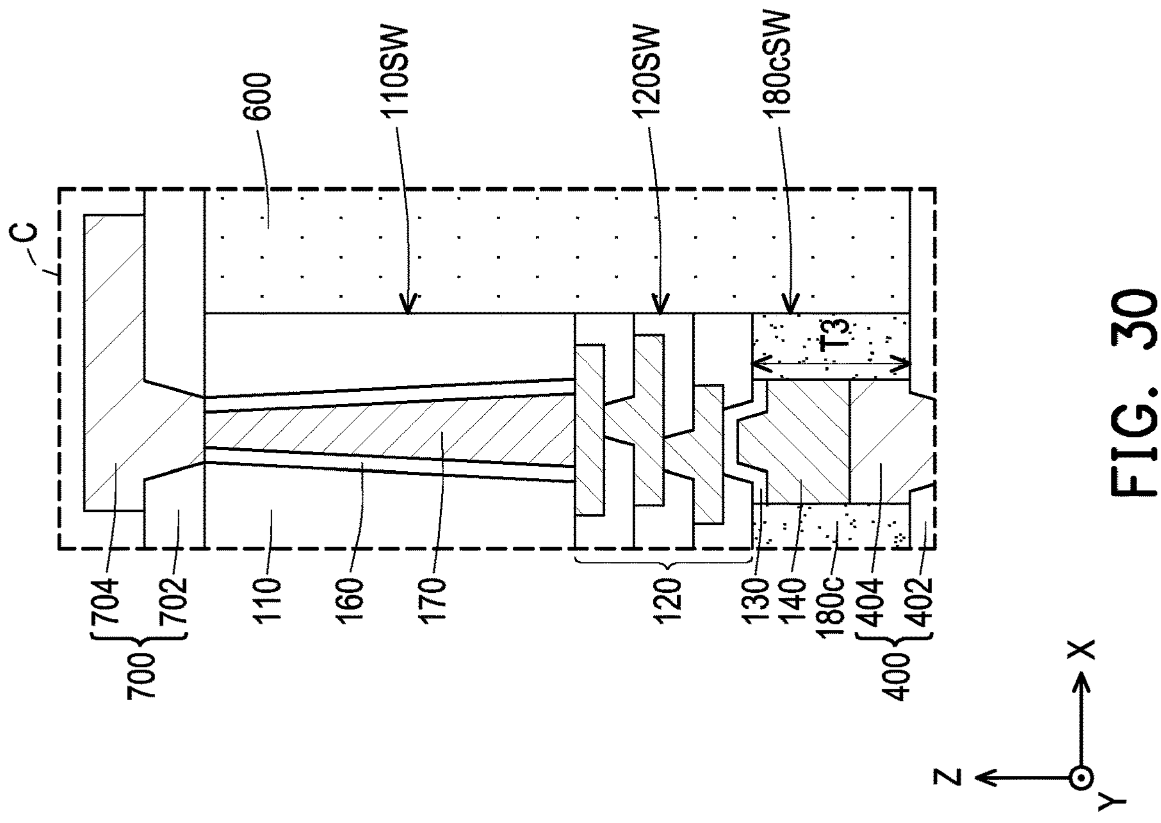

FIG. 23 to FIG. 27 are schematic views of various stages in a manufacturing method of a package structure PS3 in accordance with some embodiments of the disclosure. FIG. 28 is an enlarged and schematic cross-sectional view showing a configuration of bonding between a semiconductor device and a redistribution circuit structure included in the package structure PS3 depicted in FIG. 27. FIG. 29 through FIG. 31 are schematic cross-sectional views respectively showing various configurations of bonding between a semiconductor device and a redistribution circuit structure included in a package structure in accordance with alternative embodiments of the disclosure. In some embodiments, the enlarged and schematic cross-sectional views of FIG. 28 through FIG. 31 are outlined in a dashed box C as shown in FIG. 27. The elements similar to or substantially the same as the elements described above will use the same reference numbers, and certain details or descriptions of the same elements (e.g., the formations and materials) and the relationship thereof (e.g., the relative positioning configuration and electrical connection) will not be repeated herein.

Figure 23:
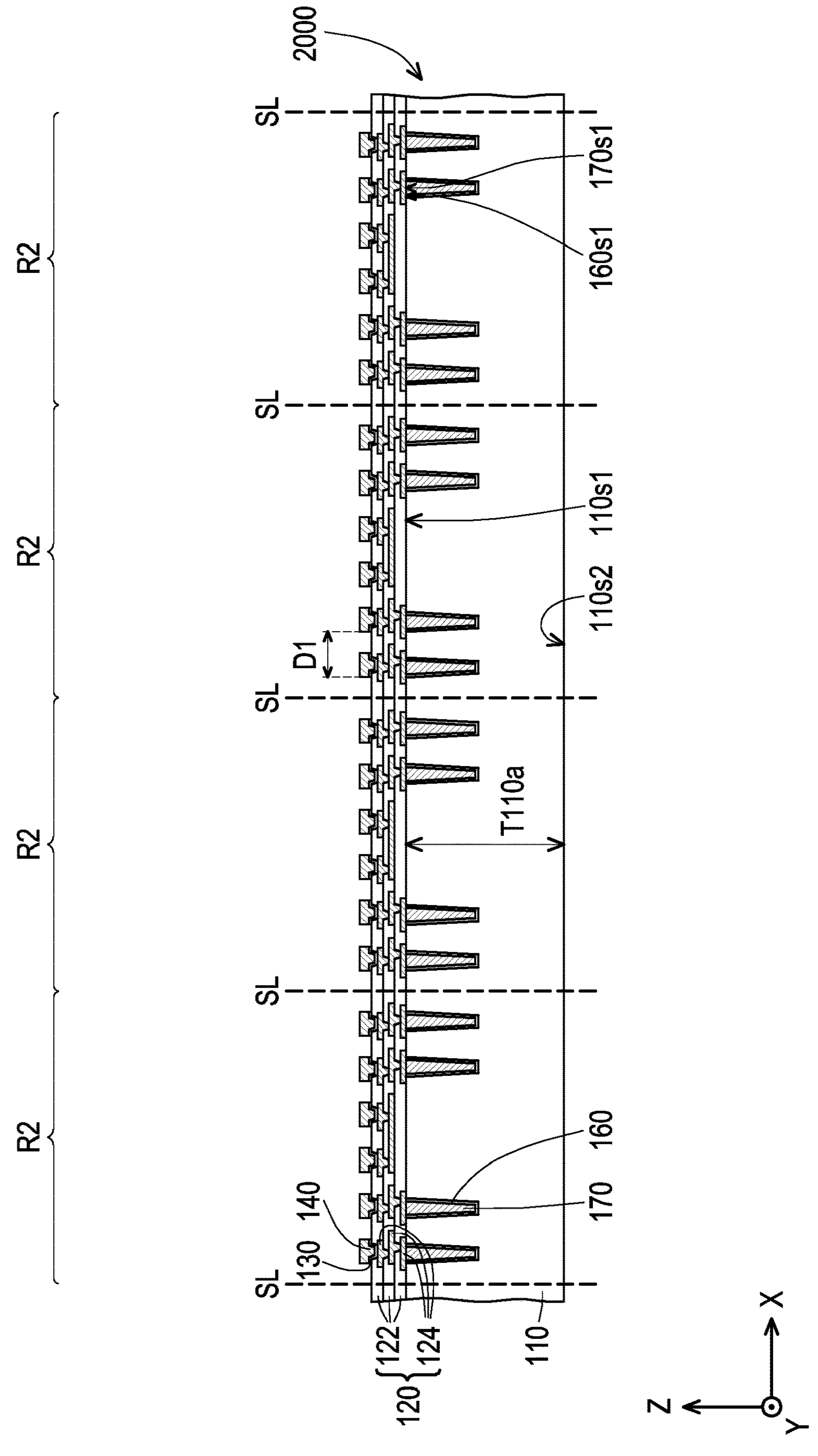
FIG. 23 to FIG. 27 are schematic views of various stages in a manufacturing method of a package structure in accordance with some embodiments of the disclosure.

Referring to FIG. 23, in some embodiments, a wafer 2000 is provided. It is appreciated that the wafer 2000 is similar to the wafer 1000, and the difference is that the wafer 2000 is provided without solder regions being pre-disposed thereon. In some embodiments, the wafer 2000 includes a semiconductor substrate 110, an interconnect structure 120, a plurality of conductive pads 130, a plurality of conductive vias 140, a plurality of liners 160, and a plurality of conductive vias 170. The details of the semiconductor substrate 110, the interconnect structure 120, the plurality of conductive pads 130, the plurality of conductive vias 140, the plurality of liners 160, and the plurality of conductive vias 170 have been previously described in FIG. 1, and thus are not repeated herein for brevity. For example, as shown in FIG. 23, the interconnect structure 120 electrically connects and is disposed between the semiconductor components (if any)/the conductive vias 170 and the conductive pads 130, the conductive pads 130 electrically connects and is disposed between the interconnect structure 120 and the conductive vias 140. In some embodiments, the wafer 2000 includes a plurality of device regions R2 arranged in a form of an array along the direction X and the direction Y, where each device region R2 is a pre-determined location for a later-formed semiconductor device (die or chip). Before a wafer sawing or dicing process along scribe lines SL (shown as the dotted line in FIG. 23 through FIG. 26) is performed on the wafer 2000, the device regions R2 of the wafer 2000 are physically connected to one another, for example. In FIG. 23, only four device regions R2 and only six conductive vias 140 and four conductive vias 170 are shown in each device region R2 for illustrative purposes and simplicity, however the disclosure is not limited thereto. The numbers of device regions R2, the conductive vias 140 and the conductive vias 170 are not limited to the disclosure, and may be selected and designed based on the demand and design layout/requirement.

Figure 24:
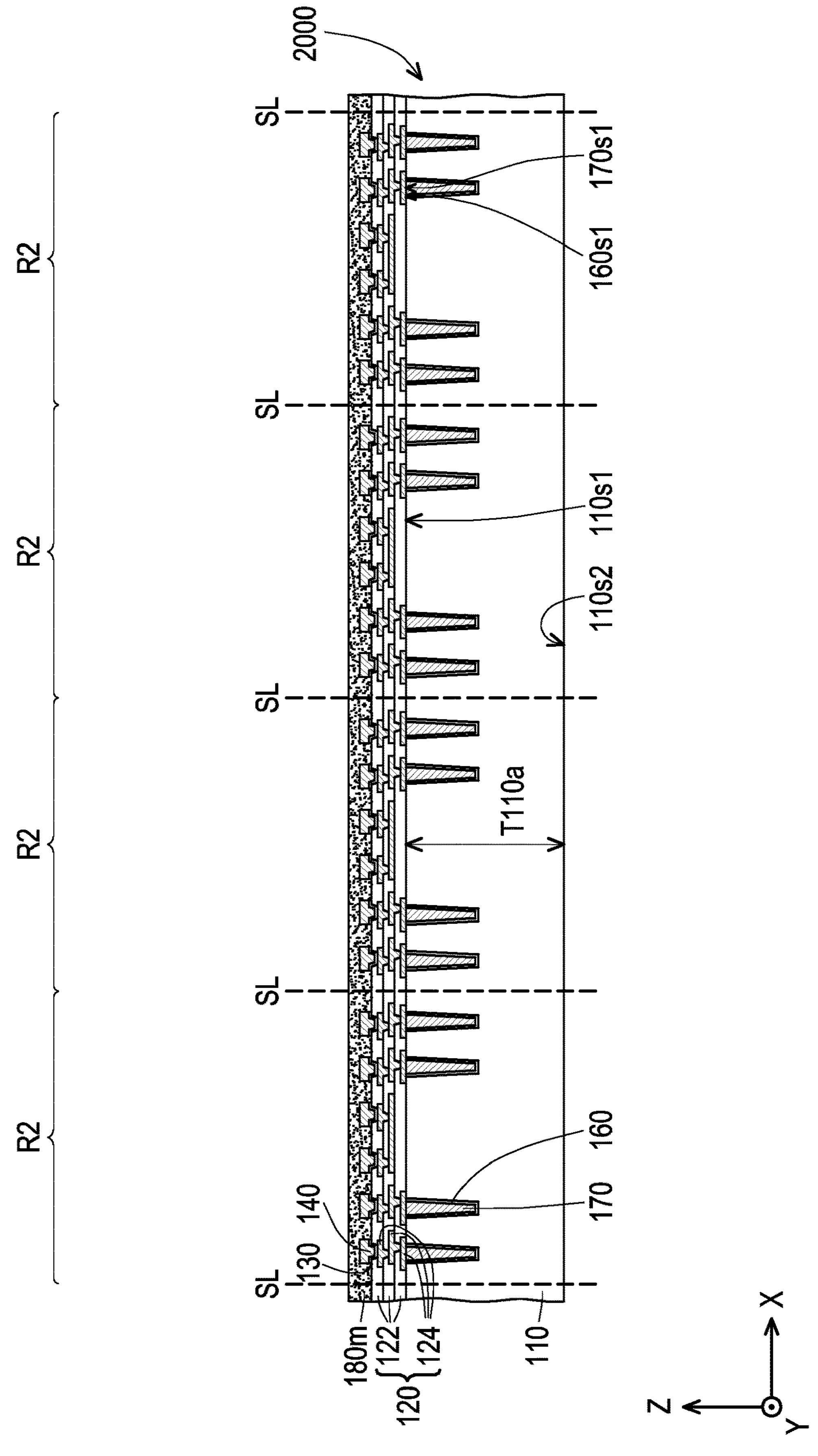

Referring to FIG. 24, in some embodiments, a dielectric material 180*m* is formed on the wafer 2000 to cover the conductive pads 130, the conductive vias 140, and the interconnect structure 120 exposed by the conductive pads 130 and the conductive vias 140. For example, the dielectric material 180*m* is disposed on (e.g., in physical contact with) the interconnect structure 120 and embeds the conductive pads 130 and the conductive vias 140. In other words, the conductive pads 130 and the conductive vias 140 are not accessibly revealed by the dielectric material 180*m*. For example, the dielectric material 180*m* is formed on the wafer 2000 by compression molding process, over-molding process or like. However, the disclosure is not limited thereto. The details of the dielectric material 180*m* have been described in FIG. 2, and thus are not repeated herein for brevity.

Referring to FIG. 25, in some embodiments, a planarizing process is performed on the dielectric material 180*m* to form a dielectric material 180*m*' accessibly revealing the conductive vias 140. During the planarization process (such as a CMP process), an illustrated top surface of the dielectric material 180*m*' is above illustrated top surfaces of the conductive vias 140, where the conductive vias 140 are accessibly revealed by the dielectric material 180*m*' by over-dishing during the CMP process. With such configuration, a height difference D2 between the illustrated top surface of the dielectric material 180*m*' and the illustrated top surfaces of the conductive vias 140 is approximately ranging from 0 μm to 0.04 μm, although other suitable thickness may alternatively be utilized. For example, the height difference D2 may be in a range of 0.001 μm to 0.01 μm.

Referring to FIG. 25 and FIG. 26 together, in some embodiments, a dicing (or singulation) process is sequentially performed along the scribe lines SL to cut through the dielectric material 180*m*', the interconnect structure 120 and the semiconductor substrate 110, thereby forming individual and separated semiconductor devices 100C corresponding to the device regions R2, where each of the semiconductor devices 100C includes the semiconductor substrate 110, the interconnect structure 120, the conductive pads 130, the conductive vias 140, the liners 160, the conductive vias 170, and a dielectric layer 180*c*. In such case, the dielectric material 180*m*' is diced into a plurality of discrete segments, such as the dielectric layers 180*c* included in the individual and separated semiconductor devices 100C corresponding to the device regions R2. In some embodiments, a thickness T180*c* (along the direction Z) of the dielectric layer 180*c* is approximately from 1 μm to 20 μm, although other suitable thickness may alternatively be utilized. The dielectric layer 180*c* may be referred to as an organic dielectric layer of the semiconductor devices 100C. The details of the dielectric layer 180*c* are similar to or substantially identical to the details of the dielectric material 180*m* previously described in FIG. 2, and thus are not repeated therein.

In one embodiment, the dicing (or singulation) process is a wafer dicing process including mechanical blade sawing or laser cutting. The disclosure is not limited thereto. As shown in FIG. 26, for each semiconductor device 100C, a sidewall of the dielectric layer 180*c*, a sidewall of the interconnect structure 120 and a sidewall of the semiconductor substrate 110 are substantially aligned with each other, in the direction Z. In the disclosure, for each semiconductor device 100C, the sidewall of the dielectric layer 180*c*, the sidewall of the interconnect structure 120 and the sidewall of the semiconductor substrate 110 together constitute a sidewall of the semiconductor device 100C. In such case, the sidewall of the semiconductor device 100C is a substantially vertical sidewall. In some embodiments, each of the semiconductor devices 100C is referred to as a bridge device, a bridge die, a bridge chip, or a bridge that providing electrical communication between two or more than two other semiconductor devices (or dies/chips) in the package structure PS3.

Referring to FIG. 27, in some embodiments, the processes of FIG. 4 through FIG. 10 are performed using the semiconductor device 100C to form the package structure PS3. In some embodiments, the package structure PS3 includes two or more than two semiconductor devices 200, an insulating encapsulation 300, a redistribution circuit structure 400, a semiconductor device 100C, a plurality of conductive pillars 500, an insulating encapsulation 600, a redistribution circuit structure 700, and a plurality of conductive terminals 800. The details of the semiconductor devices 200, the insulating encapsulation 300, the redistribution circuit structure 400, the plurality of conductive pillars 500, the insulating encapsulation 600, the redistribution circuit structure 700, and the plurality of conductive terminals 800 have been previously described in FIG. 4 through FIG. 10, and the details of the semiconductor device 100C have been previously described in FIG. 23 through FIG. 26, and thus are not repeated herein. For example, the semiconductor devices 200 are laterally encapsulated in the insulating encapsulation 300, where the bottom surfaces BS of the semiconductor devices 200 are accessibly revealed by the insulating encapsulation 300. In some embodiments, the redistribution circuit structure 400 is electrically connected to the semiconductor devices 200 through the metallization layers 404 embedded in the dielectric layers 402. In the case, the semiconductor device 100C is bonded to and electrically connected to the redistribution circuit structure 400 by directly connecting (e.g., physically contacting) the conductive vias 140 to the topmost layer of the metallization layers 404 of the redistribution circuit structure 400, where the semiconductor devices 200 are electrically communicated with each other through the semiconductor device 100C. In some embodiments, the conductive pillars 500 are standing on and electrically connected to the redistribution circuit structure 400, and are arranged next to the semiconductor device 100C. For example, some of the conductive pillars 500 are electrically coupled to the semiconductor device 200-1 through the redistribution circuit structure 400, and some of the conductive pillars 500 are electrically coupled to the semiconductor device 200-2 through the redistribution circuit structure 400. Additionally, some of conductive pillars 500 may be electrically coupled to the semiconductor device 100C through the redistribution circuit structure 400. In some embodiments, the conductive pillars 500 and the semiconductor device 100C are laterally encapsulated in the insulating encapsulation 600. In some embodiments, the redistribution circuit structure 700 is disposed on and electrically connected to the conductive pillars 500 and the semiconductor device 100C, and the conductive terminals 800 are disposed on and electrically connected to the redistribution circuit structure 700. For example, the redistribution circuit structure 700 is disposed between the conductive terminals 800 and the insulating encapsulation 600. In some embodiments, some of the conductive terminals 800 are electrically coupled to the semiconductor device 200-1 through the redistribution circuit structure 700, some of the conductive pillars 500, and the redistribution circuit structure 400. In some embodiments, some of the conductive terminals 800 are electrically coupled to the semiconductor device 200-2 through the redistribution circuit structure 700, some of the conductive pillars 500, and the redistribution circuit structure 400. In some embodiments, some of the conductive terminals 800 are electrically coupled to the semiconductor device 100C through the redistribution circuit structure 700 and some of the conductive pillars 500. In some embodiments, the materials of the dielectric layers 402, 702 are different from the material of the dielectric layer 180*c*.

For example, the semiconductor device 100C is bonded to the redistribution circuit structure 400 by bonding process including both of a metal-to-metal bonding and a dielectric-to-dielectric bonding. For example, the semiconductor device 100C is disposed on (e.g., in physical contact with) and electrically connected to the redistribution circuit structure 400. In some embodiments, as shown in FIG. 27, the conductive vias 140 of the semiconductor device 100C and the topmost layer of the metallization layers 404 of the redistribution circuit structure 400 prop against each other and are bonded together through direct metal-to-metal bonding (e.g., such as a 'copper-to-'copper' bonding). In addition, as shown in FIG. 27, the dielectric layer 180*c* of the semiconductor device 100C and the topmost layer of the dielectric layers 402 of the redistribution circuit structure 400 prop against each other and are bonded together through a direct dielectrics-to-dielectrics bonding (such as an 'organic dielectric'-to-'inorganic dielectric' bonding), for example. In such embodiments, a bonding interface IF3 (e.g., a metal-to-metal interface such as a 'copper'-to-'copper' bonding interface) and a bonding interface IF2 (e.g., a dielectric-to-dielectric bonding interface such as an 'organic dielectric'-to-'inorganic dielectric' bonding) are co-existing between the semiconductor device 100C and the redistribution circuit structure 400, which is considered as a bonding interface of the semiconductor device 100C and the redistribution circuit structure 400. Due to the dielectric layer 180*c*, the CTE mismatch is greatly suppressed, thereby ensuring the reliability of the package structure PS3. It should be noted that bonding methods described above are merely examples and are not intended to be limiting. An offset may present between sidewalls of the conductive vias 140 and sidewalls of the portions of the topmost layer of the metallization layers 404 respectively underlying thereto, see FIG. 27. Since one of the conductive vias 140 and the respective portions of the topmost layer of the metallization layers 404 may have a larger bonding surface than the other one, the direct metal-to-metal bonding may still be achieved even if misalignment occurs, thereby the reliability of electrical connections between the semiconductor device 100C and the redistribution circuit structure 400 can be ensured. With such, for certain embodiments, either the dielectric layer 180*c* immediately adjacent to the conductive vias 140 is bonded to a portion of each of the respective portions of the topmost layer of the metallization layers 404 (e.g., a dielectric-to-metal bonding), or the dielectric layer 402 immediately adjacent to the respective portions of the topmost layer of the metallization layers 404 is bonded to a portion of each of the conductive vias 140 (e.g., a dielectric-to-metal bonding).

As shown in FIG. 27 and FIG. 28, in the package structure PS3, the semiconductor device 100C is mounted to and electrically connected to the redistribution circuit structure 400, where the sidewall 180*c*SW of the dielectric layer 180*c* is substantially vertical, for example. In some embodiments, the sidewall 110SW of the semiconductor substrate 110, the sidewall 120SW of the interconnect structure 120, and the sidewall 180*c*SW of the dielectric layer 180*c* are substantially aligned to each other, as shown in FIG. 28. In other words, the sidewall of the semiconductor device 100C included in the package structure PS3 is a substantially vertical sidewall. However, the disclosure is not limited thereto; alternatively, the sidewall of the semiconductor device 100C included in the package structure PS3 may be a curved sidewall. For a non-limiting example, as shown in FIG. 29, the sidewall 180*c*SW of the dielectric layer 180*c* is curved (e.g., non-planar). For example, after the semiconductor device 100C is mounted to and electrically connected to the redistribution circuit structure 400, the dielectric layer 180*c* further includes an extended portion 180*cp*, where the sidewall 180*c*SW of the dielectric layer 180*c* is protruding out of the sidewall 110SW of the semiconductor substrate 110 and the sidewall 120SW of the interconnect structure 120 with a lateral size W3, as shown in FIG. 29. In such case, a ratio of a thickness T3 (of the dielectric layer 180*c* overlapping with the interconnection 120) to the lateral size W3 (of the extending portion 180*cp*) is approximately ranging from 1:1 to 1:4.

In alternative embodiments of which the topmost layer of the dielectric layers 402 of the redistribution circuit structure 400 is omitted and after the semiconductor device 100C is mounted to the redistribution circuit structure 400, the dielectric layer 180*c* of the semiconductor device 100C may further extend onto and laterally cover the sidewall of the topmost layer of the metallization layers 404 being exposed from the dielectric layers 402 of the redistribution circuit structure 400, where the sidewall 180*c*SW of the dielectric layer 180*c* may be substantially vertical, for example, as shown in FIG. 30. In some embodiments, the sidewall 110SW of the semiconductor substrate 110, the sidewall 120SW of the interconnect structure 120, and the sidewall 180*c*SW of the dielectric layer 180*c* are substantially aligned to each other, as shown in FIG. 30. In other words, the sidewall of the semiconductor device 100C included in the package structure is a substantially vertical sidewall. However, the disclosure is not limited thereto; in further alternative embodiments of which the topmost layer of the dielectric layers 402 of the redistribution circuit structure 400 is omitted and after the semiconductor device 100C is mounted to the redistribution circuit structure 400, the dielectric layer 180*c* of the semiconductor device 100C may further extend onto and laterally cover the sidewall of the topmost layer of the metallization layers 404 being exposed from the dielectric layers 402 of the redistribution circuit structure 400, where the sidewall 180*c*SW of the dielectric layer 180*c* may be substantially curved (e.g., non-planar), for example, as shown in FIG. 31. In some embodiments, after the semiconductor device 100C is mounted to and electrically connected to the redistribution circuit structure 400, the dielectric layer 180*c* further includes an extended portion 180*cp*, where the sidewall 180*c*SW of the dielectric layer 180*c* is protruding out of the sidewall 110SW of the semiconductor substrate 110 and the sidewall 120SW of the interconnect structure 120 with the lateral size W3, as shown in FIG. 31. In such case, the ratio of the thickness T3 (of the dielectric layer 180*c* overlapping with the interconnection 120) to the lateral size W3 (of the extending portion 180*cp*) is approximately ranging from 1:1 to 1:4.

Figure 34:
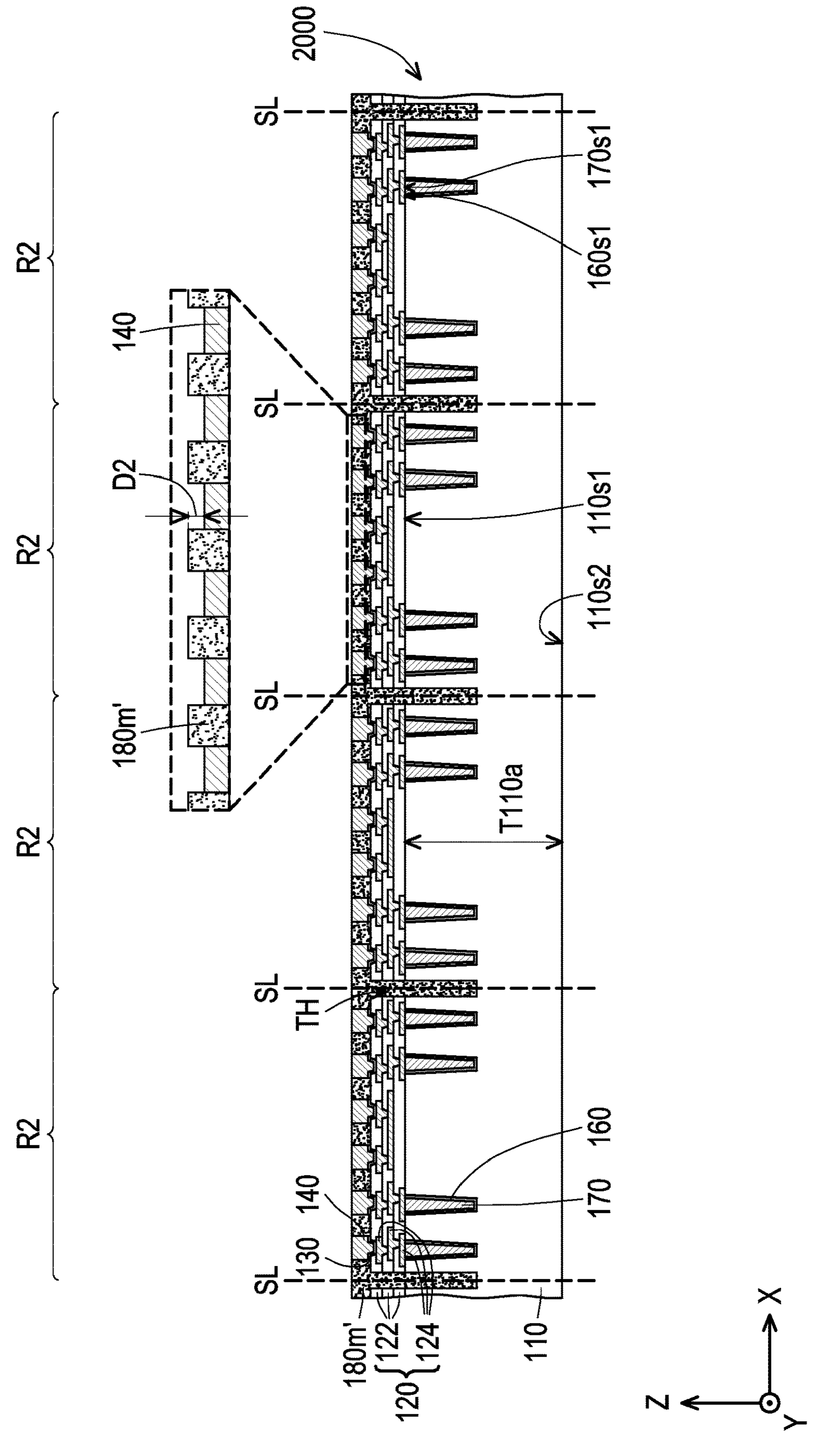
Figure 35:
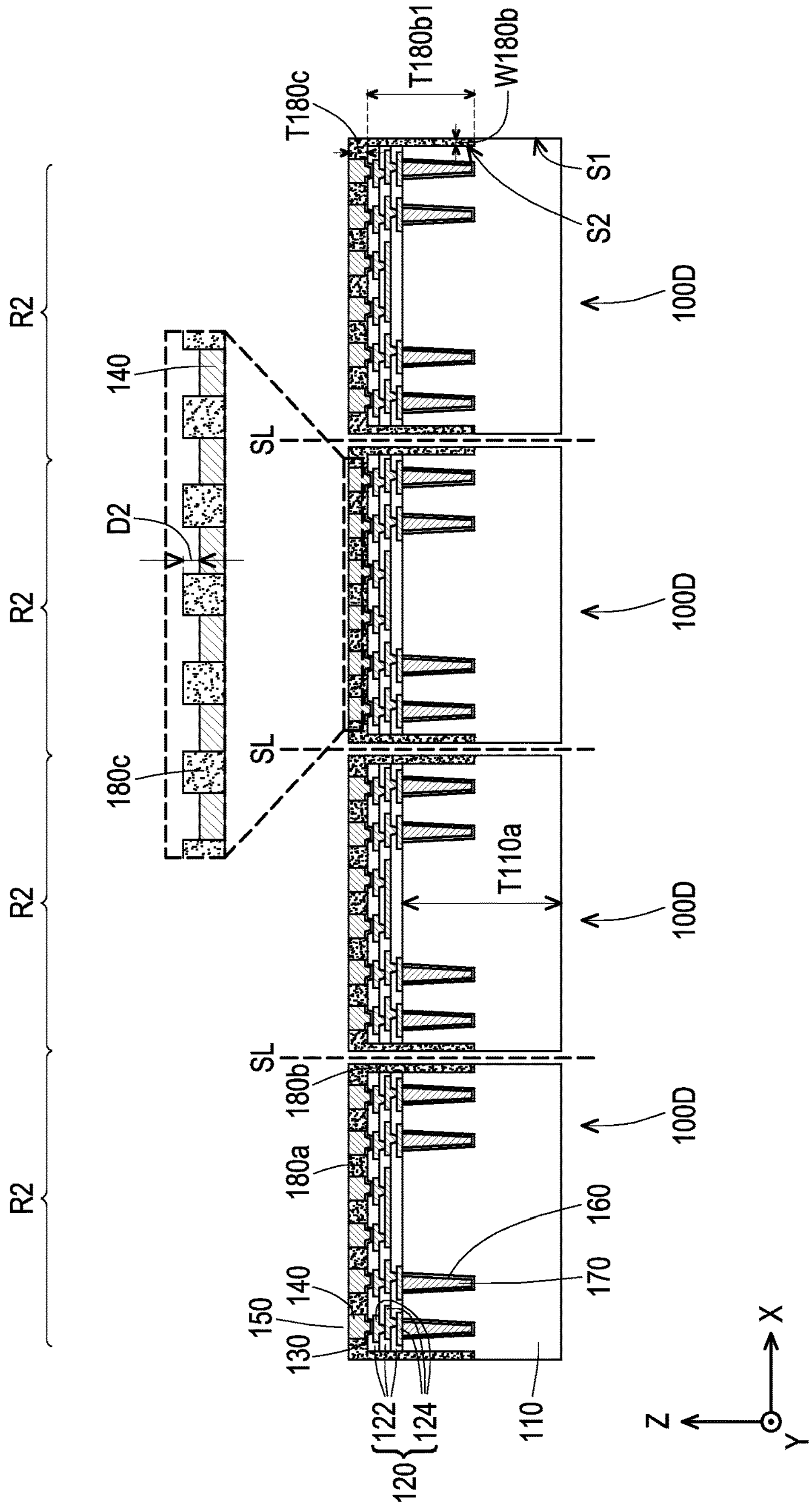
Figure 36:
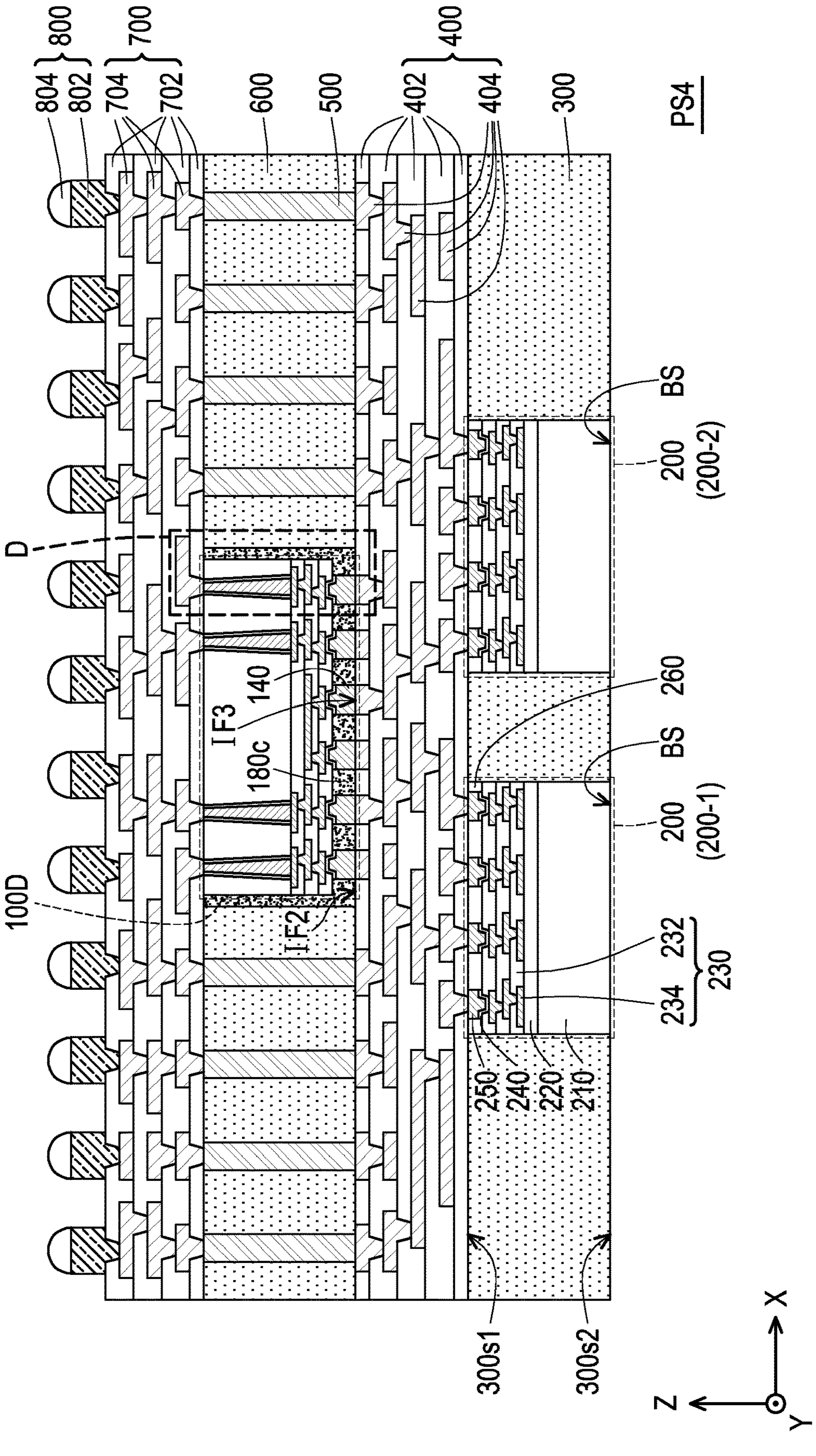
Figure 37:
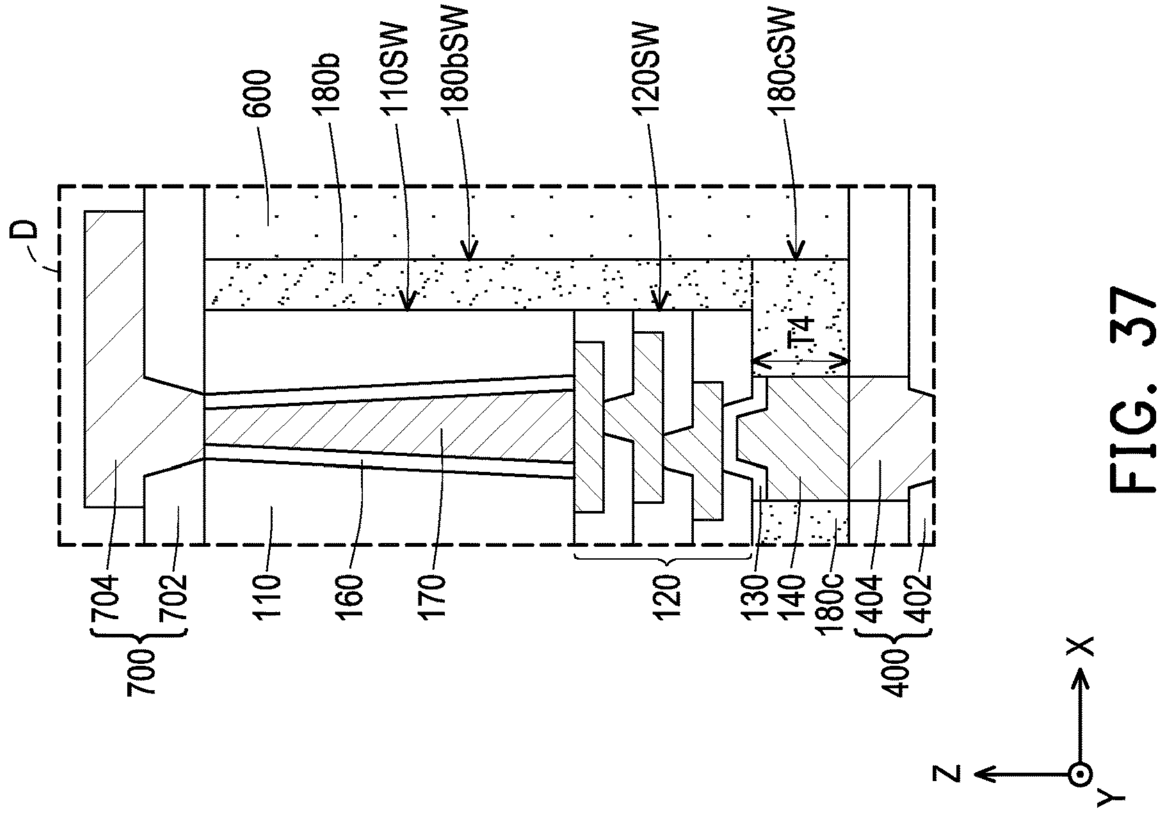
FIG. 37 is an enlarged and schematic cross-sectional view showing a configuration of bonding between a semiconductor device and a redistribution circuit structure included in the package structure depicted in FIG. 36.
Figure 38:
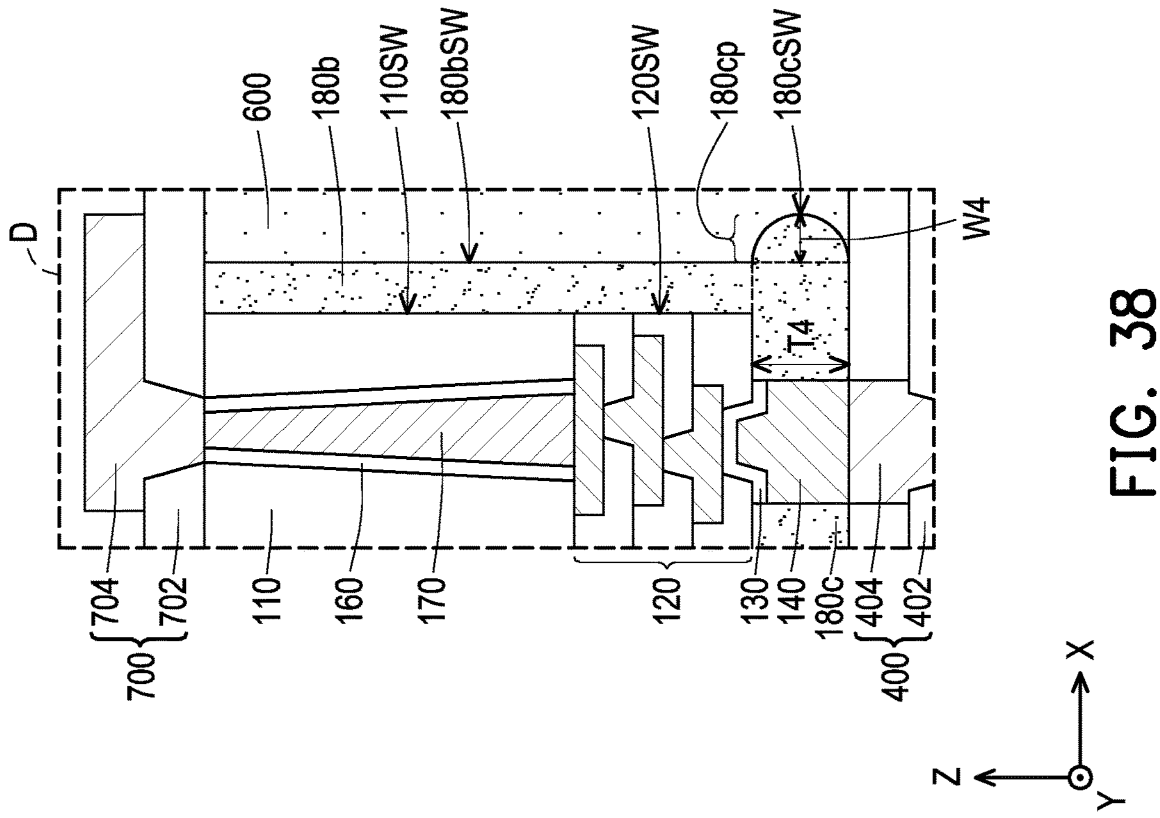
FIG. 38 through FIG. 40 are schematic cross-sectional views respectively showing various configurations of bonding between a semiconductor device and a redistribution circuit structure included in a package structure in accordance with alternative embodiments of the disclosure.
Figure 40:
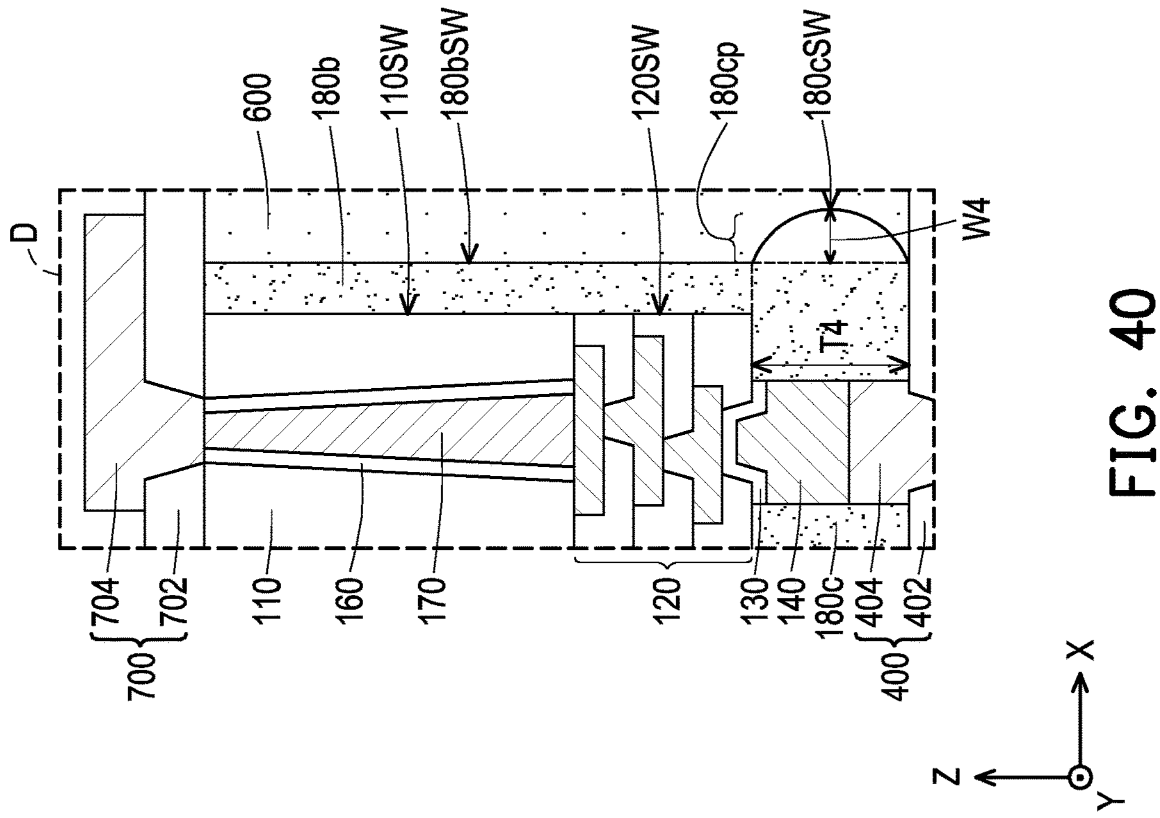
Figure 39:
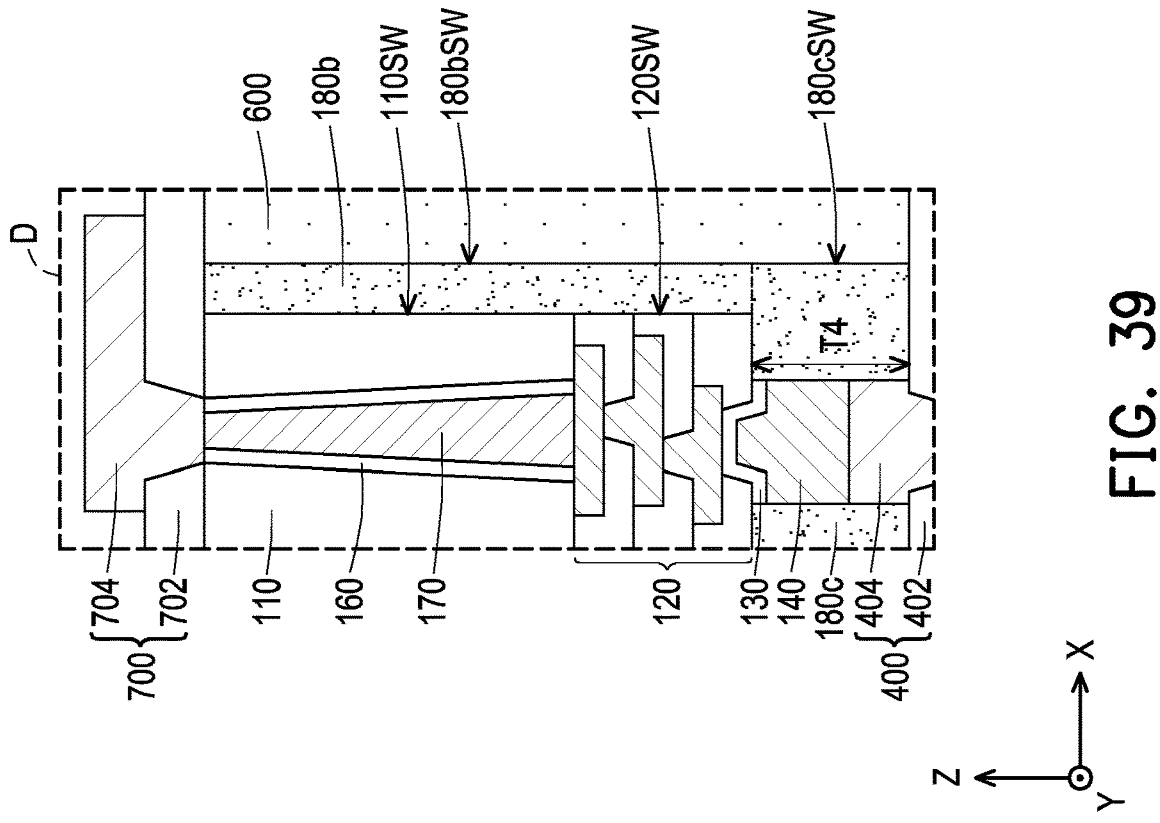

FIG. 32 to FIG. 36 are schematic views of various stages in a manufacturing method of a package structure PS4 in accordance with some embodiments of the disclosure. FIG. 37 is an enlarged and schematic cross-sectional view showing a configuration of bonding between a semiconductor device and a redistribution circuit structure included in the package structure PS4 depicted in FIG. 36. FIG. 38 through FIG. 40 are schematic cross-sectional views respectively showing various configurations of bonding between a semiconductor device and a redistribution circuit structure included in a package structure in accordance with alternative embodiments of the disclosure. In some embodiments, the enlarged and schematic cross-sectional views of FIG. 37 through FIG. 40 are outlined in a dashed box D as shown in FIG. 36. The elements similar to or substantially the same as the elements described above will use the same reference numbers, and certain details or descriptions of the same elements (e.g., the formations and materials) and the relationship thereof (e.g., the relative positioning configuration and electrical connection) will not be repeated herein.

Figure 32:
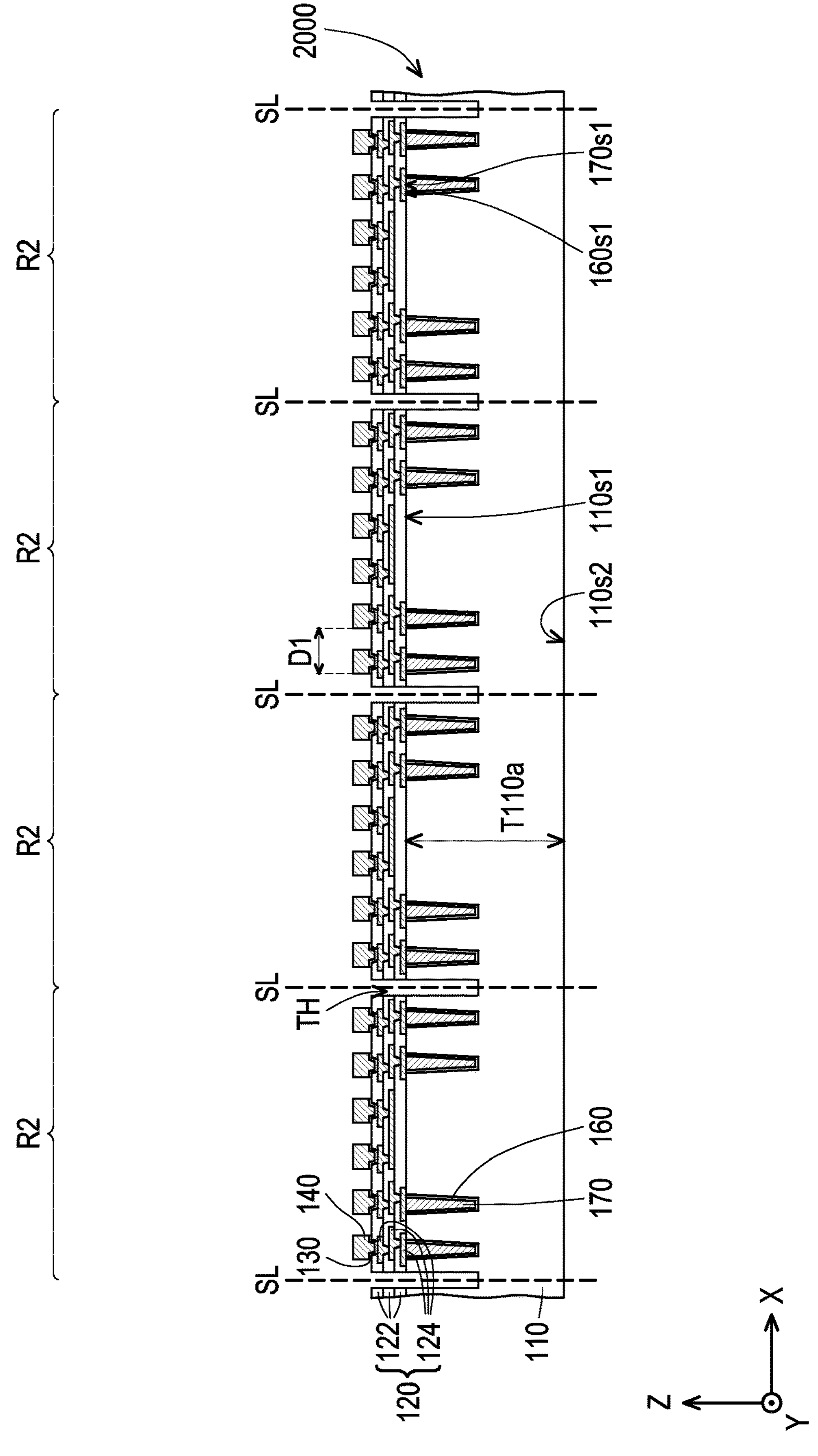
FIG. 32 to FIG. 36 are schematic views of various stages in a manufacturing method of a package structure in accordance with some embodiments of the disclosure.

Referring to FIG. 32, in some embodiments, a wafer 2000 is provided. The details of the wafer 2000 have been described in FIG. 23, and thus are not repeated herein. In some embodiments, a pre-cutting process (or step) is performed along the scribe lines SL of the wafer 2000, such that a plurality of trenches TH are formed on a front surface of the wafer 2000 and penetrate through the interconnect structure 120 and partially penetrate through the semiconductor substrate 110. In some embodiments, the pre-cutting process is performed by a mechanical cutting process with a blade. That is to say, the pre-cutting process is a contact cutting process. For example, as shown in FIG. 32, illustrated bottom surfaces of the trenches TH is below illustrated bottom ends of the liners 160 and conductive vias 170. Alternatively, the illustrated bottom surfaces of the trenches TH is substantially being coplanar to the illustrated bottom surface of the conductive vias 170. In some embodiments, each of the trenches TH has a planar sidewall. As shown in FIG. 32, the sidewalls of the trenches TH are substantially vertical, planar sidewalls. However, the disclosure is not limited thereto; alternatively, the sidewalls of the trenches TH may be substantially slant, planar sidewalls. In some embodiments, each of the trenches TH has a curved bottom surface. As shown in FIG. 32, the bottom surfaces of the trenches TH are convex surfaces in respect with a plane where the rear surface 110*s*2 located at. However, the disclosure is not limited thereto; alternatively, the bottom surfaces of the trenches TH may be substantially flat with a rounded corner connecting to the sidewalls thereof.

Before the pre-cutting process, the wafer 2000 is placed onto a holding device (not shown), in some embodiments. The rear surface 110*s*2 of the semiconductor substrate 110 of the wafer 2000 is attached to the holding device, so that the wafer 2000 is secured in place during the pre-cutting process. For example, the holding device may be an adhesive tape, a carrier film or a suction pad. The disclosure is not limited thereto.

Figure 33:
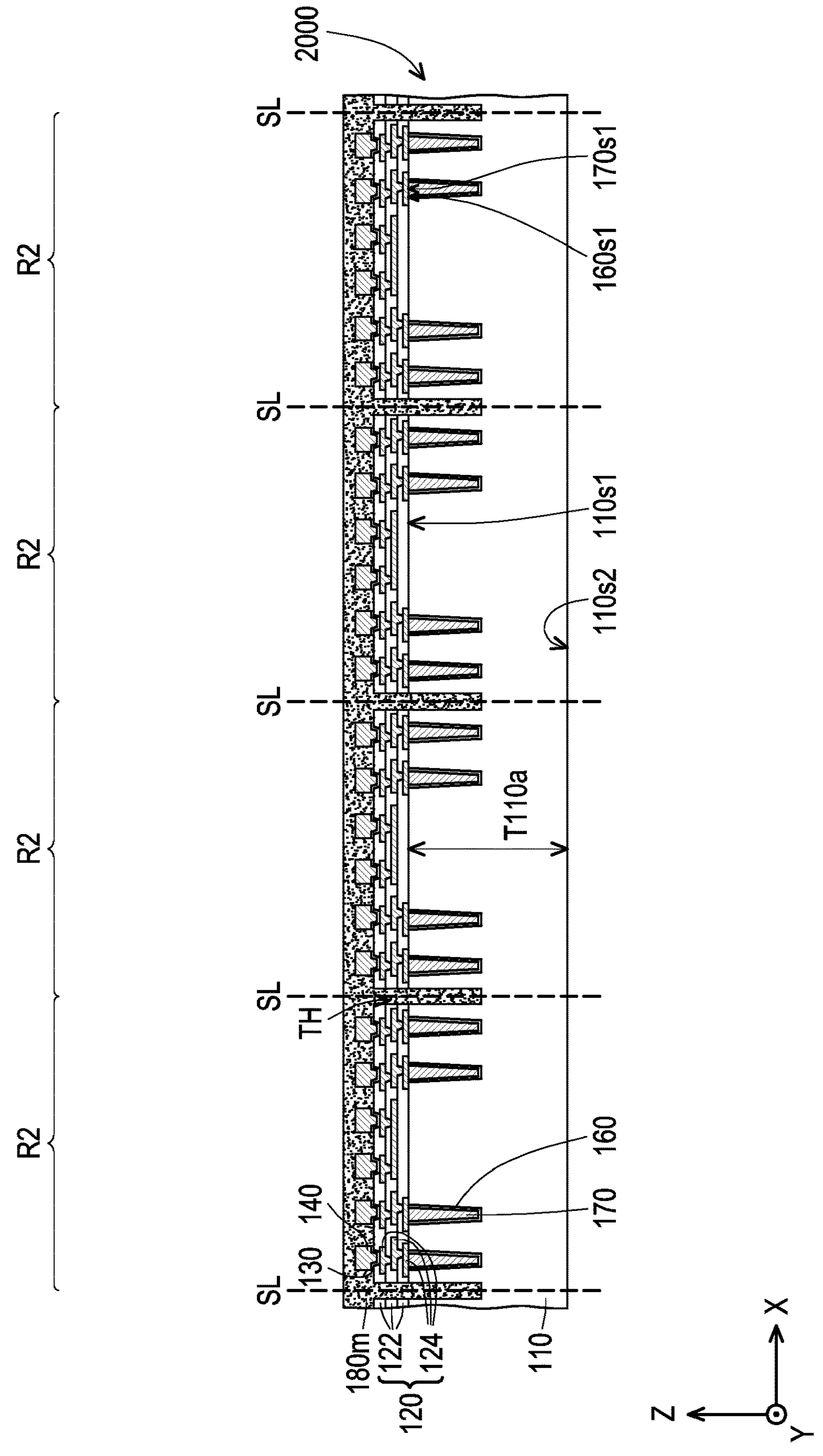

Referring to FIG. 33, in some embodiments, a dielectric material 180*m* is formed on the wafer 2000 to fill the trenches TH and cover the conductive vias 140. For example, the dielectric material 180*m* is disposed on (e.g., in physical contact with) the interconnect structure 120 (the sidewall exposed by the trenches and the illustrated top surface exposed by the conductive vias 140 and the solder regions 150) and embeds the conductive pads 130 and the conductive vias 140. In such case, the conductive pads 130 and the conductive vias 140 are not accessibly revealed by the dielectric material 180*m,* and the trenches TH are filled with the dielectric material 180*m,* as shown in FIG. 32. For example, the dielectric material 180*m* is formed on the wafer 2000 by compression molding process, over-molding process or like. However, the disclosure is not limited thereto. The details of the dielectric material 180*m* have been described in FIG. 2, and thus are not repeated herein for brevity.

Referring to FIG. 34, in some embodiments, a planarizing process is performed on the dielectric material 180*m* to form a dielectric material 180*m*' accessibly revealing the conductive vias 140. During the planarization process (such as a CMP process), an illustrated top surface of the dielectric material 180*m*' is above illustrated top surfaces of the conductive vias 140, where the conductive vias 140 are accessibly revealed by the dielectric material 180*m*' by over-dishing during the CMP process. With such configuration, a height difference D2 between the illustrated top surface of the dielectric material 180*m*' and the illustrated top surfaces of the conductive vias 140 is approximately ranging from 0 μm to 0.04 μm, although other suitable thickness may alternatively be utilized. For example, the height difference D2 may be in a range of 0.001 μm to 0.01 μm.

Referring to FIG. 34 and FIG. 35 together, in some embodiments, a dicing (or singulation) process is sequentially performed on the trenches TH along the scribe lines SL to cut through the dielectric material 180*m*', the interconnect structure 120 and the semiconductor substrate 110, thereby forming individual and separated semiconductor devices 100D corresponding to the device regions R2, where each of the semiconductor devices 100D includes the semiconductor substrate 110, the interconnect structure 120, the conductive pads 130, the conductive vias 140, the liners 160, the conductive vias 170, and dielectric layers 180*b,* 180*c*. In such case, the dielectric material 180*m*' is diced into a plurality of discrete segments each including one dielectric layer 180*c* (also referred to as a horizontal dielectric layer over an illustrated top surface of the interconnect structure 120) and two dielectric layer 180*b* (also referred to a vertical dielectric layer below the illustrated top surface of the interconnect structure 120) included in the individual and separated semiconductor devices 100D corresponding to the device regions R2, where the dielectric layers 180*b* are respectively connected to two opposite ends of a surface of the dielectric layer 180*c*. In other words, the dielectric layers 180*b* and 180*c* are integrally formed. The dielectric layers 180*b* and 180*c* may be referred to as an organic dielectric layer of the semiconductor devices 100D. The details of the dielectric layers 180*b* and 180*c* are similar to or substantially identical to the details of the dielectric material 180*m* previously described in FIG. 2, and thus are not repeated therein.

In some embodiments, a thickness T180*c* (along the direction Z) of the dielectric layer 180*c* is approximately from 1 μm to 20 μm, although other suitable thickness may alternatively be utilized. In some embodiments, a thickness T180*b*1 (along the direction Z) of the dielectric layer 180*b* is approximately from 30 μm to 50 μm, although other suitable thickness may alternatively be utilized. In some embodiments, a width W180*b* of the dielectric layer 180*b* is approximately from 15 μm to 30 μm, although other suitable thickness may alternatively be utilized. In one embodiment, the dicing (or singulation) process is a wafer dicing process including mechanical blade sawing or laser cutting. The disclosure is not limited thereto.

As shown in FIG. 35, for each semiconductor device 100D, the semiconductor substrate 110 has a sidewall of step-form which having an first sidewall S1 and a second sidewall S2 indented from the first sidewall S1, where the first sidewall S1 is substantially aligned with the sidewall of the dielectric layer 180*b* and the sidewall of the dielectric layer 180*c,* the second sidewall S2 is substantially aligned with the sidewall of the interconnect structure 120, and the dielectric layer 180*b* covers the second sidewall S2 and the interconnect structure 120, for example. In the disclose, for each semiconductor device 100D, the sidewall of the dielectric layer 180*c,* the sidewall of the dielectric layer 180*b* and the sidewall (e.g., S1) of the semiconductor substrate 110 together constitute a sidewall of the semiconductor device 100D. In such case, the sidewall of the semiconductor device 100D is a substantially vertical sidewall. In some embodiments, each of the semiconductor devices 100D is referred to as a bridge device, a bridge die, a bridge chip, or a bridge that providing electrical communication between two or more than two other semiconductor devices (or dies/chips) in the package structure PS4.

Referring to FIG. 36, in some embodiments, the processes of FIG. 4 through FIG. 10 are performed using the semiconductor device 100D to form the package structure PS4. In some embodiments, the package structure PS4 includes two or more than two semiconductor devices 200, an insulating encapsulation 300, a redistribution circuit structure 400, a semiconductor device 100D, a plurality of conductive pillars 500, an insulating encapsulation 600, a redistribution circuit structure 700, and a plurality of conductive terminals 800. The details of the semiconductor devices 200, the insulating encapsulation 300, the redistribution circuit structure 400, the plurality of conductive pillars 500, the insulating encapsulation 600, the redistribution circuit structure 700, and the plurality of conductive terminals 800 have been previously described in FIG. 4 through FIG. 10, and the details of the semiconductor device 100D have been previously described in FIG. 32 through FIG. 35, and thus are not repeated herein. For example, the semiconductor devices 200 are laterally encapsulated in the insulating encapsulation 300, where the bottom surfaces BS of the semiconductor devices 200 are accessibly revealed by the insulating encapsulation 300. In some embodiments, the redistribution circuit structure 400 is electrically connected to the semiconductor devices 200 through the metallization layers 404 embedded in the dielectric layers 402. In the case, the semiconductor device 100D is bonded to and electrically connected to the redistribution circuit structure 400 by directly connecting (e.g., physically contacting) the conductive vias 140 to the topmost layer of the metallization layers 404 of the redistribution circuit structure 400, where the semiconductor devices 200 are electrically communicated with each other through the semiconductor device 100D. In some embodiments, the conductive pillars 500 are standing on and electrically connected to the redistribution circuit structure 400, and are arranged next to the semiconductor device 100D. For example, some of the conductive pillars 500 are electrically coupled to the semiconductor device 200-1 through the redistribution circuit structure 400, and some of the conductive pillars 500 are electrically coupled to the semiconductor device 200-2 through the redistribution circuit structure 400. Additionally, some of conductive pillars 500 may be electrically coupled to the semiconductor device 100D through the redistribution circuit structure 400. In some embodiments, the conductive pillars 500 and the semiconductor device 100D are laterally encapsulated in the insulating encapsulation 600. In some embodiments, the redistribution circuit structure 700 is disposed over and electrically connected to the conductive pillars 500 and the semiconductor device 100D, and the conductive terminals 800 are disposed on and electrically connected to the redistribution circuit structure 700. For example, the redistribution circuit structure 700 is disposed between the conductive terminals 800 and the insulating encapsulation 600. In some embodiments, some of the conductive terminals 800 are electrically coupled to the semiconductor device 200-1 through the redistribution circuit structure 700, some of the conductive pillars 500, and the redistribution circuit structure 400. In some embodiments, some of the conductive terminals 800 are electrically coupled to the semiconductor device 200-2 through the redistribution circuit structure 700, some of the conductive pillars 500, and the redistribution circuit structure 400. In some embodiments, some of the conductive terminals 800 are electrically coupled to the semiconductor device 100D through the redistribution circuit structure 700 and some of the conductive pillars 500. In some embodiments, the materials of the dielectric layers 402, 702 are different from the material of the dielectric layer 180*c*. Due to the dielectric layer 180*c*, the CTE mismatch is greatly suppressed. In addition, owing to the dielectric layer 180*b*, the adhesion between the semiconductor device 100D and the insulating encapsulation 600 is further improved. Therefore, the reliability of the package structure PS4 is ensured.

As shown in FIG. 36 and FIG. 37, for example, the semiconductor device 100D includes a substantially vertical sidewall including a substantially vertical sidewall 180*c*SW of the dielectric layer 180*c* and a substantially vertical sidewall 180*b*SW of the dielectric layer 180*b*, where a portion of the semiconductor substrate 110 (correspondingly having the first sidewall S1) included in the semiconductor devices 100D has been removed during performing the process of FIG. 5, so to accessibly reveal the conductive vias 170 for further electrical connections (e.g., being electrically connected to the redistribution circuit structure 700). In some cases, a portion of the semiconductor substrate 110 (correspondingly having the first sidewall S2) included in the semiconductor devices 100D, the liners 160, and/or the conductive vias 170 have been partially removed as well.

In some alternative embodiments, the semiconductor device 100D may include a curved sidewall including a curved sidewall 180*c*SW of the dielectric layer 180*c* and a substantially vertical sidewall 180*b*SW of the dielectric layer 180*b*, as shown in FIG. 38. For example, after the semiconductor device 100D is mounted to and electrically connected to the redistribution circuit structure 400, the dielectric layer 180*c* further includes an extended portion 180*cp*, where the sidewall 180*c*SW of the dielectric layer 180*c* is protruding out of the sidewall 180*b*SW of the dielectric layer 180*b* with a lateral size W4, as shown in FIG. 38. In such case, a ratio of a thickness T4 of the dielectric layer 180*c* to the lateral size W4 of the extending portion 180*cp* is approximately ranging from 1:1 to 1:4.

However, the disclosure is not limited thereto; alternatively, when the topmost layer of the dielectric layers 402 of the redistribution circuit structure 400 is omitted and after the semiconductor device 100D is mounted to the redistribution circuit structure 400, the dielectric layer 180*c* of the semiconductor device 100D may further extend onto and laterally cover the sidewall of the topmost layer of the metallization layers 404 being exposed from the dielectric layers 402 of the redistribution circuit structure 400. In one non-limiting example, the sidewall 180*c*SW of the dielectric layer 180*c* may be substantially vertical, where the sidewall (including 180*c*SW and 180*b*SW) of the semiconductor device 100D is substantially vertical, for example, as shown in FIG. 39. In other non-limiting example, the sidewall 180*c*SW of the dielectric layer 180*c* may be substantially curved as being protruding away from the sidewall 180*b*SW of the dielectric layer 180*b* (e.g., by the lateral size W4), where the sidewall (including 180*c*SW and 180*b*SW) of the semiconductor device 100D is curved, for example, as shown in FIG. 40.

Figure 41:
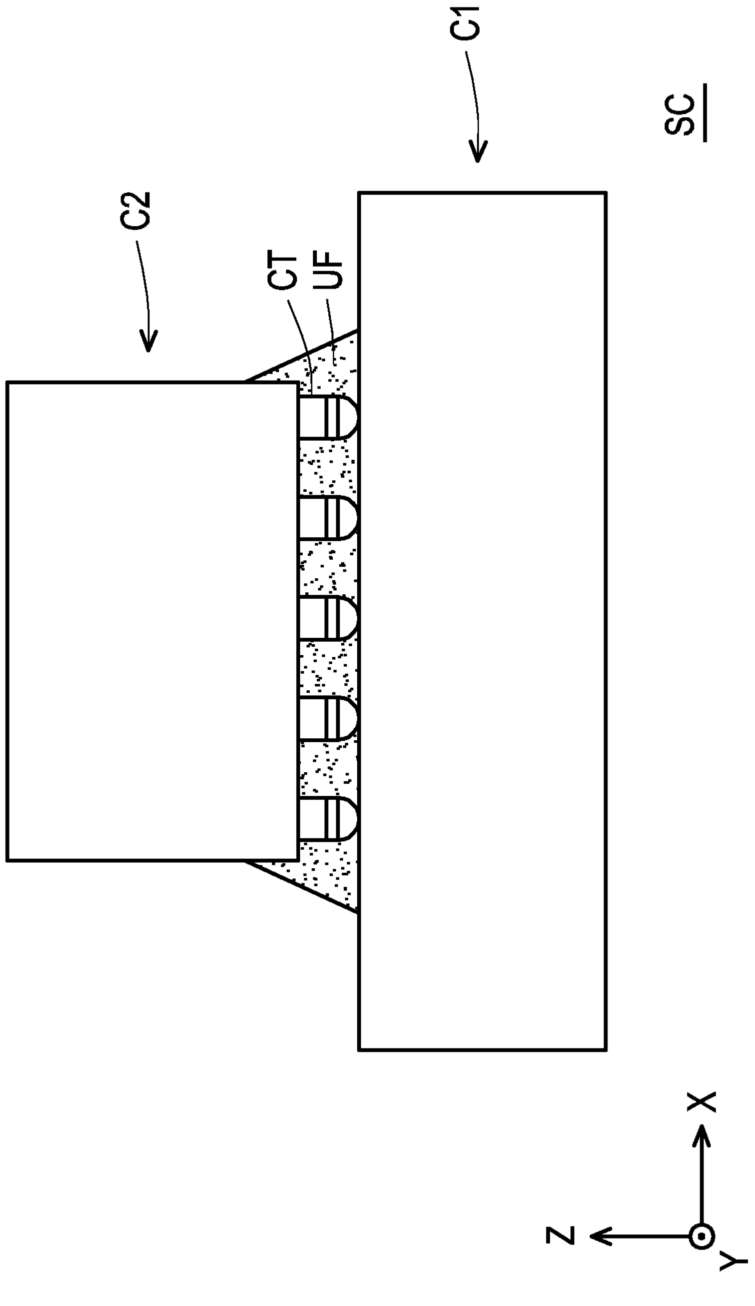
FIG. 41 is a schematic cross-sectional view showing an application of a package structure in accordance with some embodiments of the disclosure.

In some embodiments, the package structures PS1, PS2, PS3, PS4, and/or modifications thereof may be further mounted onto a package substrate, and the package substrate may be a printed circuit board or the like. FIG. 41 is a schematic cross-sectional view showing an application of a package structure (e.g., PS1, PS2, PS3, PS4 or their modifications) in accordance with some embodiments of the disclosure The elements similar to or substantially the same as the elements described previously will use the same reference numbers, and certain details or descriptions (e.g., the materials, formation processes, positioning configurations, electrical connections, etc.) of the same elements would not be repeated herein.

Referring to FIG. 41, in some embodiments, a component assembly SC including a first component C1 and a second component C2 disposed over the first component C1 is provided. The first component C1 may be or may include a circuit structure, such as a mother board, a package substrate, another printed circuit board (PCB), a printed wiring board, and/or other carrier that is capable of carrying integrated circuits. In some embodiments, the second component C2 mounted on the first component C1 is similar to one of the semiconductor packages PS1, PS2, PS3, PS4, and/or modifications thereof. For example, one or more second components C2 (e.g., PS1, PS2, PS3, PS4, and/or modifications thereof) may be electrically coupled to the first component C1 through a plurality of terminals CT. The terminals CT may be the conductive terminals 80. In some embodiments, an underfill UF is formed between the gap of the first component C1 and the second component C2 to at least laterally cover the terminals CT. Alternatively, the underfill UF is omitted. The underfill UF may be any acceptable material, such as a polymer, epoxy resin, molding underfill, or the like, for example. In one embodiment, the underfill UF may be formed by underfill dispensing, a capillary flow process, or any other suitable method. Owing to the underfill UF, a bonding strength between the first component C1 and the second component C2 is enhanced.

In some embodiments, the semiconductor packages PS1, PS2, PS3, PS4, and/or modifications thereof may be or may be part of an integrated Fan-Out (InFO) package, an InFO package having a Package-on-Package (PoP) structure, a chip-on-wafer-on-substrate (CoWoS) package, a flip chip package of an InFO package, or the like. The disclosure is not limited thereto. In addition, the semiconductor devices 200 (e.g., 200-1, 200-2) and the semiconductor devices 100A, 100B, 100C, 100D and their modifications may be referred to as semiconductor dies or semiconductor chips. The conductive terminals 800 may be referred to as connectors or terminals of the semiconductor packages PS1, PS2, PS3, and PS4.

In accordance with some embodiments, a package structure includes a first redistribution circuit structure, a first semiconductor die, and a second semiconductor die. The first redistribution circuit structure has a first side and a second side opposite to the first side. The first semiconductor die is disposed over the firs side of the first redistribution circuit structure. The second semiconductor die is disposed over the second side of the first redistribution circuit structure and is electrically connected thereto, where the second semiconductor die includes a substrate, an interconnect structure disposed on the substrate, a plurality of conductive terminals disposed on and electrically connected to the interconnect structure, and a dielectric layer disposed on the interconnect structure and laterally covering the plurality of conductive terminals. A material of the dielectric layer included in the second semiconductor die is different from a material of a dielectric layer included in the first redistribution circuit structure.

In accordance with some embodiments, a package structure includes a first redistribution circuit structure, a semiconductor device, a semiconductor bridge die, and a first insulating encapsulation. The first redistribution circuit structure has a first side and a second side opposite to the first side. The semiconductor device is disposed over the firs side of the first redistribution circuit structure. The semiconductor bridge die is disposed over the second side of the first redistribution circuit structure and is electrically connected thereto, wherein the semiconductor bridge die includes a semiconductor substrate, an interconnect structure disposed on the semiconductor substrate, a plurality of conductive terminals disposed on and electrically connected to the interconnect structure, and an organic dielectric layer disposed on the interconnect structure and laterally covering the plurality of conductive terminals. The first insulating encapsulation encapsulates the semiconductor bridge die, where the plurality of conductive terminals are separated from the first insulating encapsulation by the organic dielectric layer.

In accordance with some embodiments, a method of manufacturing a package structure includes the following steps: providing a first semiconductor die; laterally encapsulating the first semiconductor die in a first insulating encapsulation; forming a first redistribution circuit structure over the first insulating encapsulation, wherein the first redistribution circuit structure has a first side and a second side opposite to the first side, the first semiconductor die is disposed over the firs side of the first redistribution circuit structure and electrically connected to the first redistribution circuit structure; disposing a second semiconductor die over the second side of the first redistribution circuit structure, wherein the second semiconductor die is electrically connected the first redistribution circuit structure and comprises a substrate, an interconnect structure being disposed on the substrate, a plurality of conductive terminals being disposed on and electrically connected to the interconnect structure, and a dielectric layer being disposed on the interconnect structure and laterally covering the plurality of conductive terminals, wherein a material of the dielectric layer included in the second semiconductor die is different from a material of a dielectric layer included in the first redistribution circuit structure; laterally encapsulating the second semiconductor die in a second insulating encapsulation; forming a second redistribution circuit structure over the second insulating encapsulation, wherein the second insulating encapsulation is disposed between the first redistribution circuit structure and the second redistribution circuit structure, and the second semiconductor die is electrically connected to the second redistribution circuit structure; and disposing a plurality of terminals over the second redistribution circuit structure, wherein the plurality of terminals are electrically connected to the second redistribution circuit structure.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:

a first redistribution circuit structure, having a first side and a second side opposite to the first side;

a first semiconductor die, disposed over the firs side of the first redistribution circuit structure; and a second semiconductor die, disposed over the second side of the first redistribution circuit structure and being electrically connected thereto, wherein the second semiconductor die comprises:

a substrate;

an interconnect structure, disposed on the substrate;

a plurality of conductive terminals, disposed on and electrically connected to the interconnect structure; and a dielectric layer, disposed on the interconnect structure and laterally covering the plurality of conductive terminals, wherein a material of the dielectric layer included in the second semiconductor die is different from a material of a dielectric layer included in the first redistribution circuit structure, wherein the material of the dielectric layer included in the second semiconductor die comprises an inorganic filler.

2. The package structure of claim 1, wherein a material of the dielectric layer included in the second semiconductor die further comprises an organic dielectric.

3. The package structure of claim 1, wherein a ratio of a coefficient of thermal expansion of the substrate to a coefficient of thermal expansion of the dielectric layer included in the second semiconductor die is approximately ranging from 25:70 to 8:15, wherein the substrate included in the second semiconductor die comprises a plurality of through-substrate vias, and the interconnect structure is electrically connected to the plurality of through-substrate vias.

4. The package structure of claim 1, further comprising:

a first insulating encapsulation, laterally encapsulating the first semiconductor die;

a second insulating encapsulation, laterally encapsulating the second semiconductor die;

a second redistribution circuit structure, disposed over the second insulating encapsulation and electrically connected to the second semiconductor die, wherein the second insulating encapsulation is disposed between the first redistribution circuit structure and the second redistribution circuit structure; and a plurality of terminals, disposed on and electrically connected to the second redistribution circuit structure, wherein the second redistribution circuit structure is disposed between the second insulating encapsulation and the plurality of terminals.

5. The package structure of claim 4, wherein the first semiconductor die comprises a plurality of first semiconductor dies, wherein at least two of the plurality of first semiconductor dies are electrically communicated with one another through the second semiconductor die.

6. The package structure of claim 4, further comprising:

a plurality of conductive pillars, next to the second semiconductor die and electrically connected to the first redistribution circuit structure and the second redistribution circuit structure, wherein the plurality of conductive pillars penetrate through the second insulating encapsulation.

7. The package structure of claim 1, wherein the second semiconductor die is connected to a metal feature of the first redistribution circuit structure by a solder region.

8. A package structure, comprising:

a first redistribution circuit structure, having a first side and a second side opposite to the first side;

a semiconductor device, disposed over the firs side of the first redistribution circuit structure;

a semiconductor bridge die, disposed over the second side of the first redistribution circuit structure and being electrically connected thereto, wherein the semiconductor bridge die comprises:

a semiconductor substrate;

an interconnect structure, disposed on the semiconductor substrate;

a plurality of conductive terminals, disposed on and electrically connected to the interconnect structure; and an organic dielectric layer, disposed on the interconnect structure and laterally covering the plurality of conductive terminals, wherein a material of the organic dielectric layer comprises an inorganic filler; and a first insulating encapsulation, encapsulating the semiconductor bridge die, wherein the plurality of conductive terminals are separated from the first insulating encapsulation by the organic dielectric layer.

9. The package structure of claim 8, wherein in a cross-section of the package structure, a sidewall of the semiconductor substrate, a sidewall of the interconnect structure and a sidewall of the organic dielectric layer are substantially aligned to each other.

10. The package structure of claim 8, wherein in a cross-section of the package structure, a sidewall of the semiconductor substrate and a sidewall of the interconnect structure are substantially aligned to each other and covered by the organic dielectric layer, wherein the semiconductor substrate and the interconnect structure are separated from the first insulating encapsulation by the organic dielectric layer.

11. The package structure of claim 10, wherein in the cross-section of the package structure, a sidewall of the organic dielectric layer is non-planar.

12. The package structure of claim 8, wherein in a cross-section of the package structure, a sidewall of the semiconductor substrate and a sidewall of the interconnect structure are substantially aligned to each other, wherein the organic dielectric layer comprises an extend portion protruding away from the sidewall of the semiconductor substrate and the sidewall of the interconnect structure.

13. The package structure of claim 8, wherein a bonding interface between the semiconductor bridge die and a metal feature of the first redistribution circuit structure comprises a copper-to-copper interface and an organic-dielectric to inorganic-dielectric interface.

14. The package structure of claim 8, wherein a bonding interface between the semiconductor bridge die and a metal feature of the first redistribution circuit structure comprises a solder-to-copper interface and an organic-dielectric to inorganic-dielectric interface.

15. The package structure of claim 8, further comprising:

a second insulating encapsulation, laterally encapsulating the semiconductor device;

a plurality of conductive pillars, next to the semiconductor bridge die, wherein the plurality of conductive pillars penetrate through the first insulating encapsulation;

a second redistribution circuit structure, disposed over the first insulating encapsulation and electrically connected to the semiconductor bridge die, wherein the first insulating encapsulation is disposed between the first redistribution circuit structure and the second redistribution circuit structure, wherein the plurality of conductive pillars electrically connected to the first redistribution circuit structure and the second redistribution circuit structure; and a plurality of terminals, disposed on and electrically connected to the second redistribution circuit structure, wherein the second redistribution circuit structure is disposed between the first insulating encapsulation and the plurality of terminals.

16. The package structure of claim 15, further comprising:

a circuit board, connected to the plurality of terminals, wherein the plurality of terminals is disposed between and electrically connected to the circuit board and the second redistribution circuit structure.

17. A method of manufacturing a package structure, comprising:

providing a first semiconductor die;

laterally encapsulating the first semiconductor die in a first insulating encapsulation;

forming a first redistribution circuit structure over the first insulating encapsulation, wherein the first redistribution circuit structure has a first side and a second side opposite to the first side, the first semiconductor die is disposed over the firs side of the first redistribution circuit structure and electrically connected to the first redistribution circuit structure;

disposing a second semiconductor die over the second side of the first redistribution circuit structure, wherein the second semiconductor die is electrically connected the first redistribution circuit structure and comprises a substrate, an interconnect structure being disposed on the substrate, a plurality of conductive terminals being disposed on and electrically connected to the interconnect structure, and a dielectric layer being disposed on the interconnect structure and laterally covering the plurality of conductive terminals, wherein a material of the dielectric layer included in the second semiconductor die is different from a material of a dielectric layer included in the first redistribution circuit structure, wherein the material of the dielectric layer included in the second semiconductor die comprises an inorganic filler;

laterally encapsulating the second semiconductor die in a second insulating encapsulation;

forming a second redistribution circuit structure over the second insulating encapsulation, wherein the second insulating encapsulation is disposed between the first redistribution circuit structure and the second redistribution circuit structure, and the second semiconductor die is electrically connected to the second redistribution circuit structure; and disposing a plurality of terminals over the second redistribution circuit structure, wherein the plurality of terminals are electrically connected to the second redistribution circuit structure.

18. The method of claim 17, further comprising:

disposing a plurality of conductive pillars next to the second semiconductor die and over the first redistribution circuit structure, wherein laterally encapsulating the second semiconductor die in the second insulating encapsulation further comprises laterally encapsulating the plurality of conductive pillars in the second insulating encapsulation, and the plurality of conductive pillars electrically connects the first redistribution circuit structure and the second redistribution circuit structure, wherein the material of the dielectric layer included in the second semiconductor die is different from a material of the second insulating encapsulation.

19. The method of claim 17, wherein disposing the second semiconductor die over the second side of the first redistribution circuit structure comprises:

bonding the second semiconductor die onto the first redistribution circuit structure by pressing and heating, wherein:

a bonding interface between the second semiconductor die and first redistribution circuit structure comprises a solder-to-copper interface and an organic-dielectric to inorganic-dielectric interface, or a bonding interface between the second semiconductor die and first redistribution circuit structure comprises a copper-to-copper interface and an organic-dielectric to inorganic-dielectric interface.

20. The method of claim 17, prior to laterally encapsulating the first semiconductor die in the first insulating encapsulation, further comprising:

providing a third semiconductor die laterally next to the first semiconductor die, wherein laterally encapsulating the first semiconductor die in the first insulating encapsulation further comprises laterally encapsulating the third semiconductor die in the first insulating encapsulation, and wherein the first semiconductor die and the third semiconductor die are disposed over the firs side of the first redistribution circuit structure and electrically connected to the first redistribution circuit structure.

* * * * *